United States Patent
Yamazaki

(10) Patent No.: US 8,536,571 B2
(45) Date of Patent: Sep. 17, 2013

(54) MANUFACTURING METHOD OF SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/346,072

(22) Filed: Jan. 9, 2012

(65) Prior Publication Data

US 2012/0175610 A1   Jul. 12, 2012

(30) Foreign Application Priority Data

Jan. 12, 2011   (JP) .................. 2011-004420

(51) Int. Cl.
*H01L 29/786* (2006.01)
(52) U.S. Cl.
USPC .............. 257/43; 257/E29.296; 257/E21.46
(58) Field of Classification Search
USPC .............. 257/43, E29.296, E21.46; 438/104
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,493,048 B1 | 12/2002 | Baek et al. | |
| 6,563,174 B2 | 5/2003 | Kawasaki et al. | |
| 6,727,522 B1 | 4/2004 | Kawasaki et al. | |
| 6,740,927 B1 | 5/2004 | Jeng | |
| 7,005,717 B2 | 2/2006 | Eisenbeiser et al. | |
| 7,049,190 B2 | 5/2006 | Takeda et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Zandra Smith
*Assistant Examiner* — Paul Patton
(74) *Attorney, Agent, or Firm* — Eric J. Robinson; Robinson Intellectual Property Law Office, P.C.

(57) ABSTRACT

A manufacturing method of a semiconductor device includes the steps of: forming a gate electrode over a substrate; forming a gate insulating film over the gate electrode; forming an oxide semiconductor film; performing heat treatment to form a second oxide semiconductor film after the step of forming the first oxide semiconductor film; forming a first conductive film; forming a first resist mask including regions whose thicknesses are different; etching the second oxide semiconductor film and the first conductive film using the first resist mask to form a third oxide semiconductor film and a second conductive film; reducing the size of the first resist mask to form a second resist mask; selectively etching the second conductive film using the second resist mask to remove a part of the second conductive film so that a source electrode and a drain electrode are formed.

24 Claims, 26 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,198,968 B2 | 4/2007 | Chae et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,341,899 B2 | 3/2008 | Huang |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,615,488 B2 | 11/2009 | Maekawa et al. |
| 7,674,650 B2 | 3/2010 | Akimoto et al. |
| 7,732,819 B2 | 6/2010 | Akimoto et al. |
| 7,749,820 B2 | 7/2010 | Miyairi |
| 7,821,002 B2 | 10/2010 | Yamazaki et al. |
| 7,910,490 B2 | 3/2011 | Akimoto et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,174,021 B2 | 5/2012 | Oikawa et al. |
| 8,183,099 B2 | 5/2012 | Sakata |
| 8,188,480 B2 | 5/2012 | Itai |
| 8,202,365 B2 | 6/2012 | Umeda et al. |
| 8,203,143 B2 | 6/2012 | Imai |
| 8,253,905 B2 | 8/2012 | Lu et al. |
| 8,274,077 B2 | 9/2012 | Akimoto et al. |
| 8,274,078 B2 | 9/2012 | Itagaki et al. |
| 8,338,226 B2 | 12/2012 | Asano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0035379 A1* | 2/2010 | Miyairi et al. ............ 438/104 |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0159639 A1 | 6/2010 | Sakata |
| 2010/0200851 A1 | 8/2010 | Oikawa et al. |
| 2010/0224872 A1 | 9/2010 | Kimura |
| 2010/0230683 A1 | 9/2010 | Miyairi |
| 2010/0320458 A1 | 12/2010 | Umeda et al. |
| 2010/0320459 A1 | 12/2010 | Umeda et al. |
| 2011/0012106 A1 | 1/2011 | Yamazaki et al. |
| 2011/0012118 A1 | 1/2011 | Yamazaki et al. |
| 2011/0017995 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0031493 A1 | 2/2011 | Yamazaki et al. |
| 2011/0031499 A1 | 2/2011 | Kimura et al. |
| 2011/0037068 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0133180 A1 | 6/2011 | Yamazaki |
| 2011/0147737 A1 | 6/2011 | Yamazaki et al. |
| 2011/0163311 A1 | 7/2011 | Akimoto et al. |
| 2011/0193083 A1 | 8/2011 | Kim et al. |
| 2011/0215328 A1 | 9/2011 | Morosawa et al. |
| 2011/0312111 A1 | 12/2011 | Yamazaki et al. |
| 2012/0119205 A1 | 5/2012 | Taniguchi et al. |
| 2012/0175608 A1 | 7/2012 | Yamazaki |
| 2012/0175609 A1 | 7/2012 | Yamazaki |
| 2012/0175625 A1 | 7/2012 | Yamazaki |
| 2012/0178224 A1 | 7/2012 | Yamazaki |
| 2012/0178249 A1 | 7/2012 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 63-210024 A | 8/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-224479 A | 10/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2008-133345 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) ,Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and Its Bending Properties,", SID Digest '09 : SID International Symposium Digest of Technical Papers, May 31, 2009, pp. 983-985.

Sakata.J et al., "Development of 4.0-In. Amoled Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size Amoled,", AM-FPD '08 Digest of Technical Papers, Jul. 2, 2008, pp. 275-578.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTS With a Novel Passivation Layer,", SID Digest '09 : SID International Symposium Digest of Technical Paper, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabalized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,Or Zn] at Temperatures Over 1000 ° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN, J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 044501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K at al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel,", Extended Abstracts (the 57th Spring Meeting 2010), The Japan Society of Applied Physics and Related Societies, Mar. 17, 2010, pp. 21-008.

* cited by examiner

200

200

200

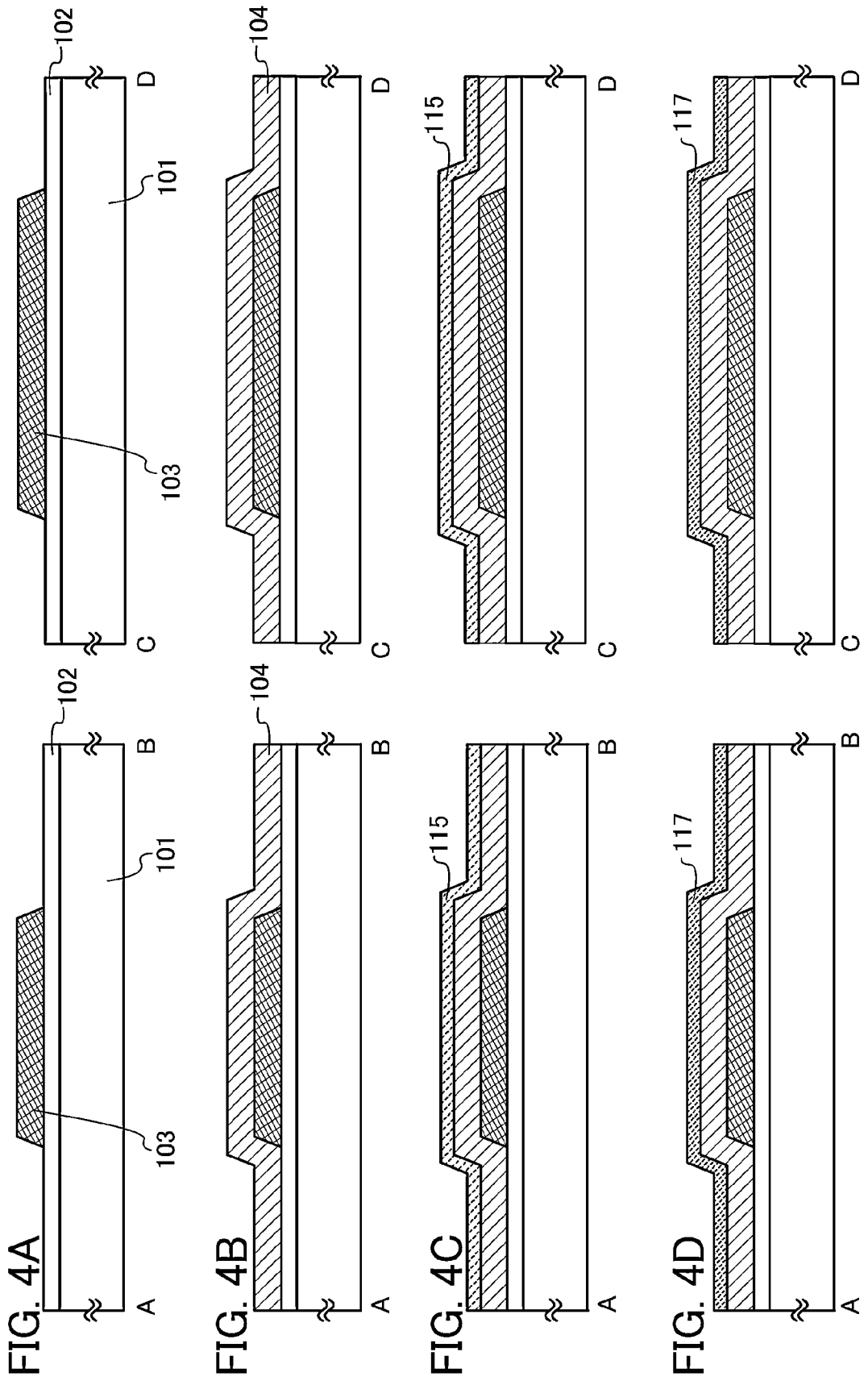

FIG. 5A
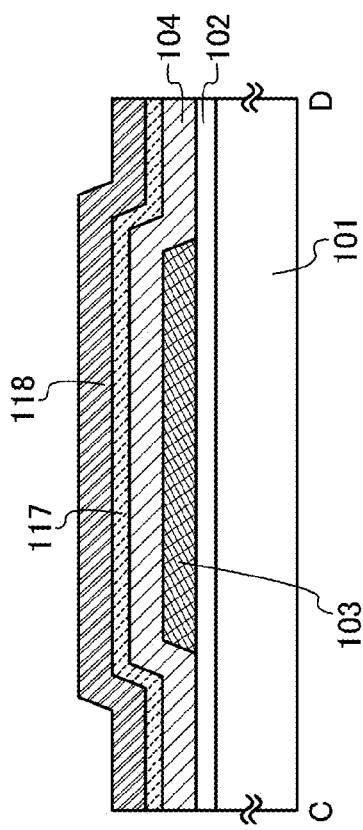
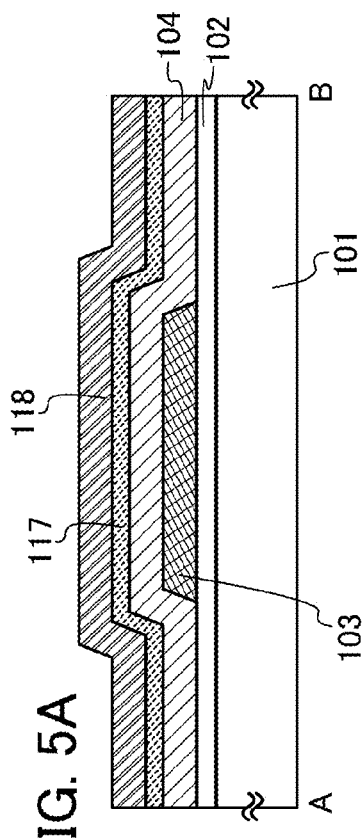
FIG. 5B
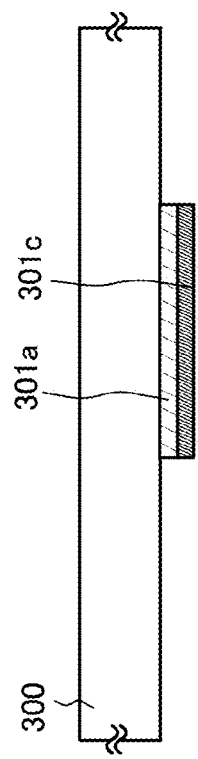
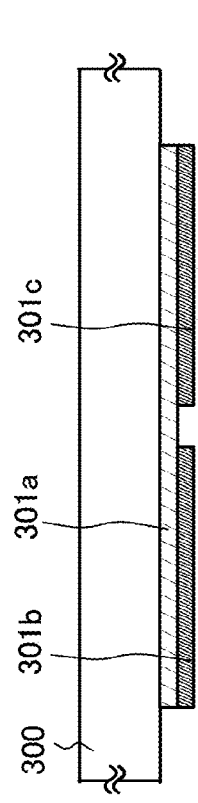
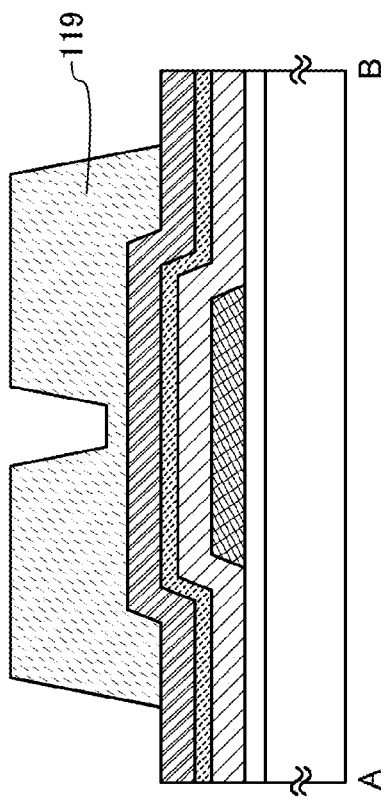

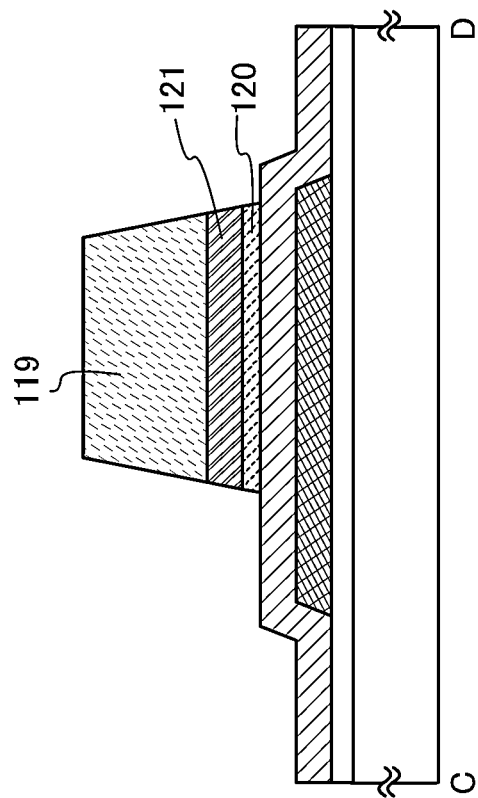
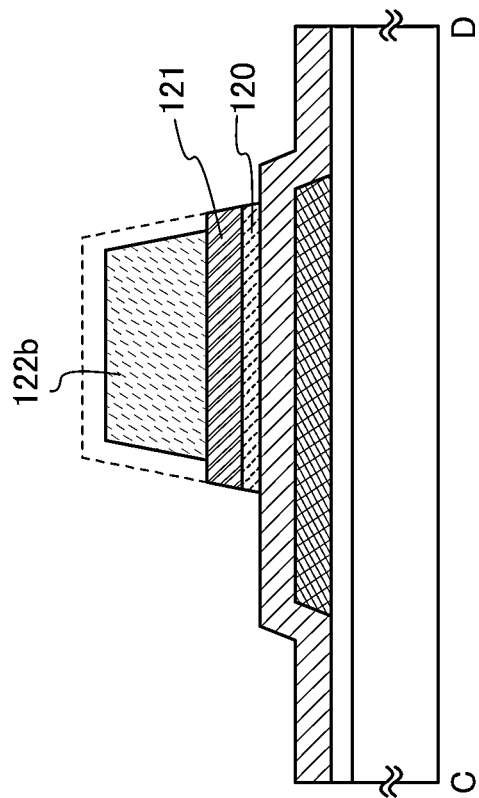
FIG. 6A
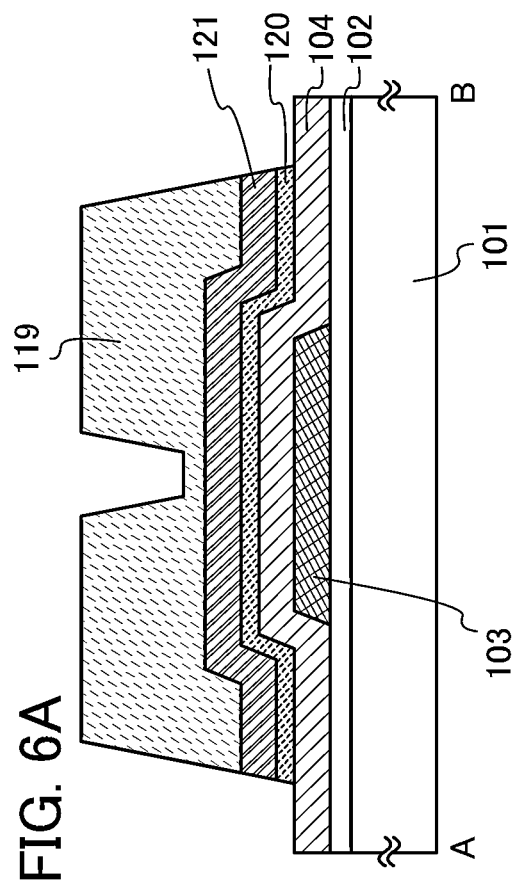
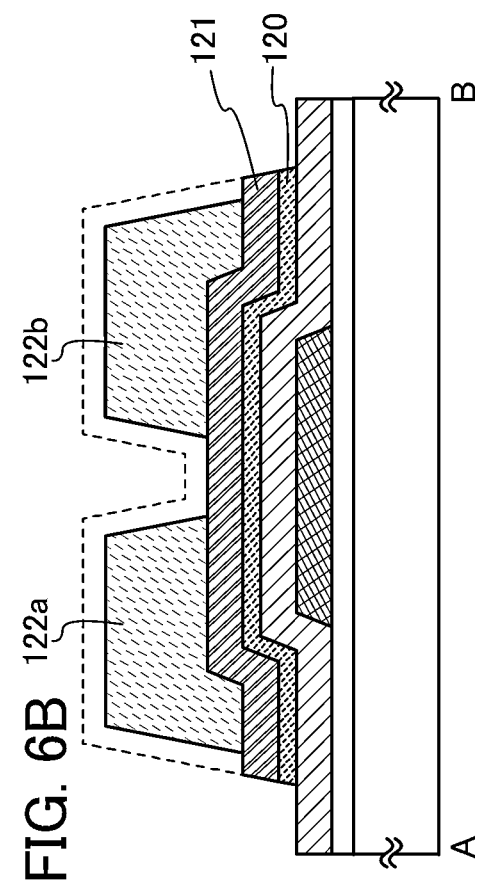
FIG. 6B

FIG. 8A1
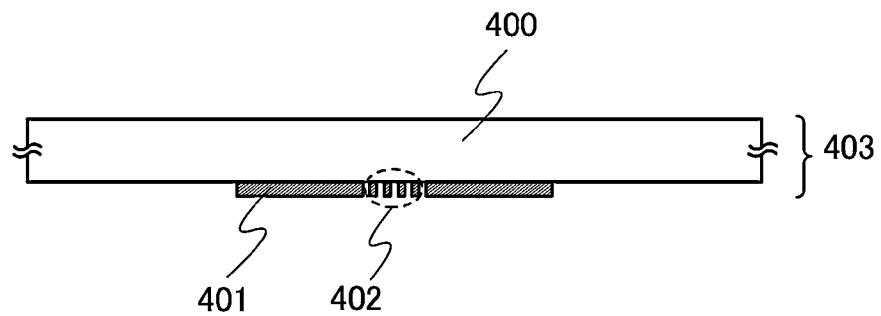
FIG. 8A2
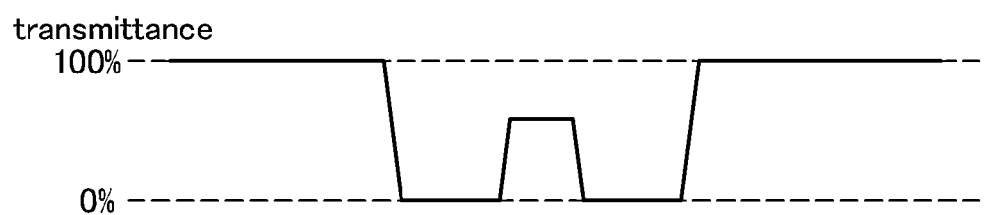
FIG. 8B1
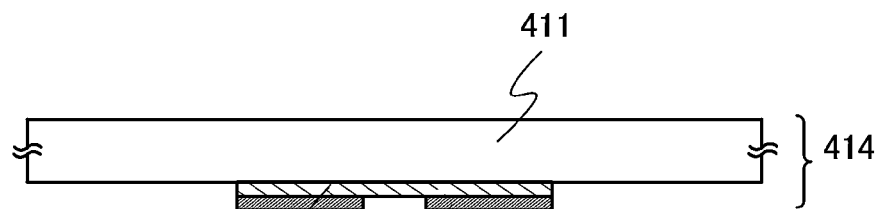
FIG. 8B2
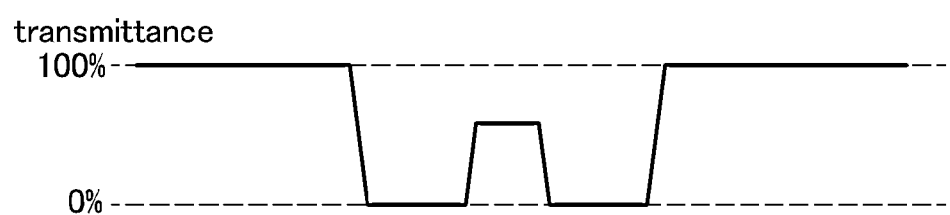

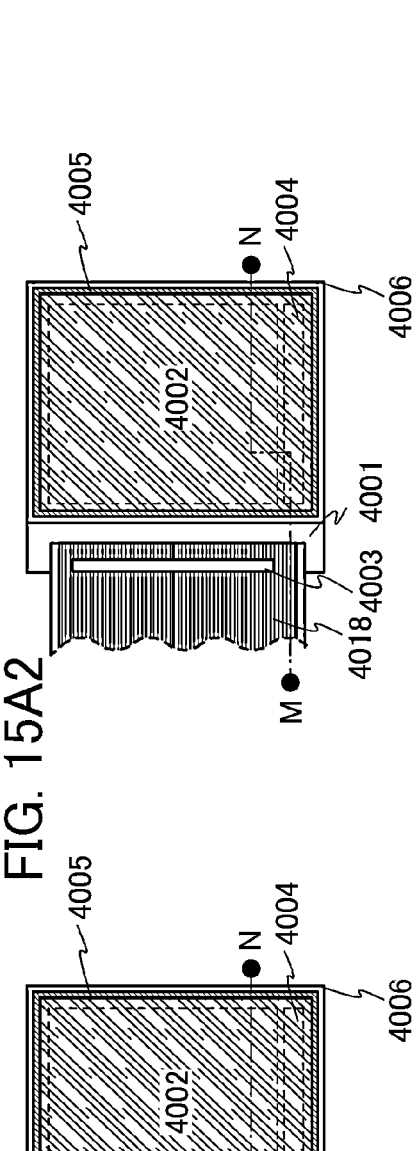
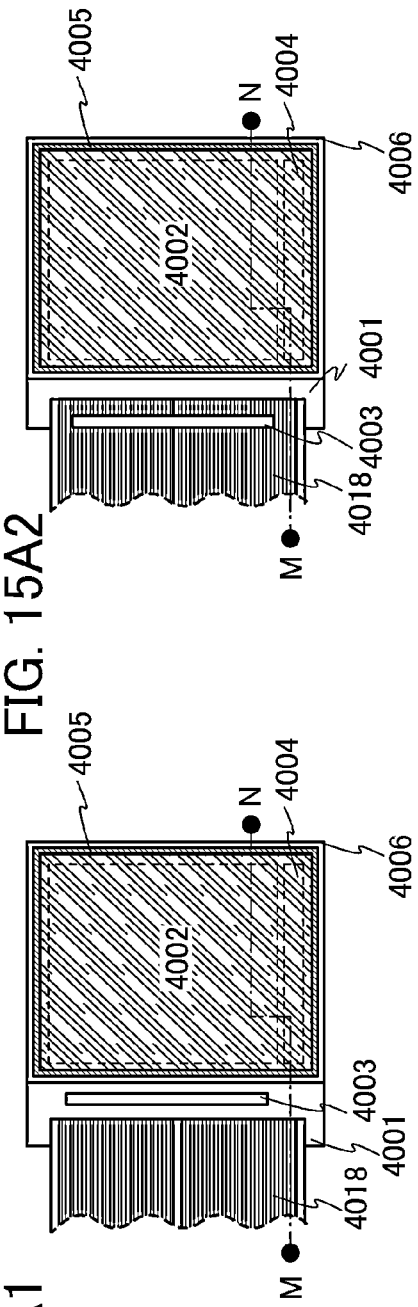
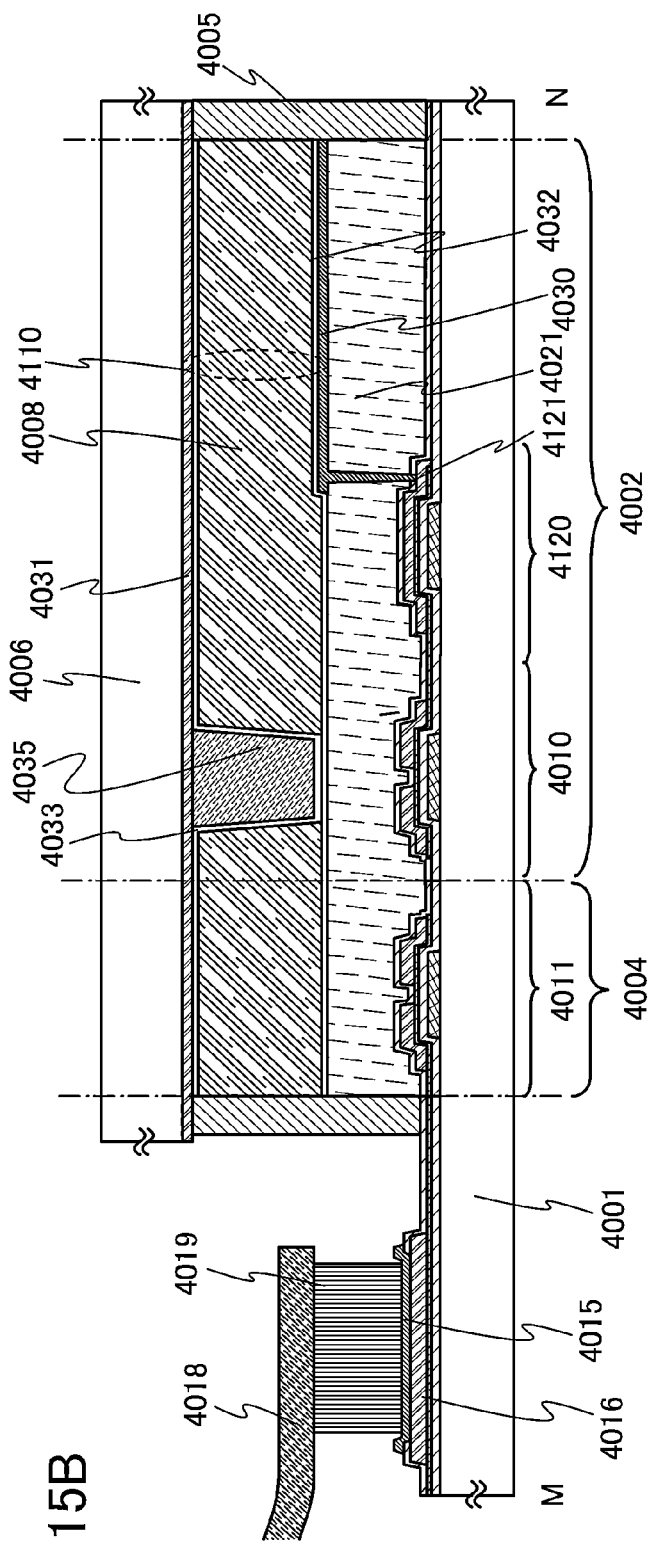

FIG. 16A1
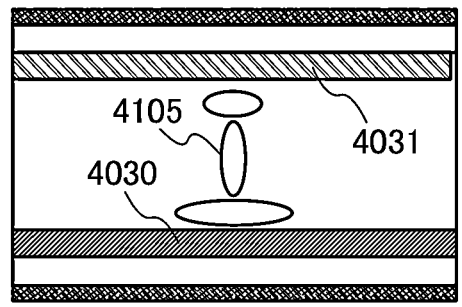
FIG. 16A2
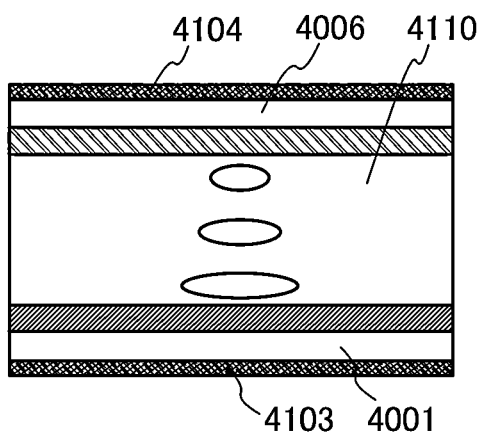
FIG. 16B1
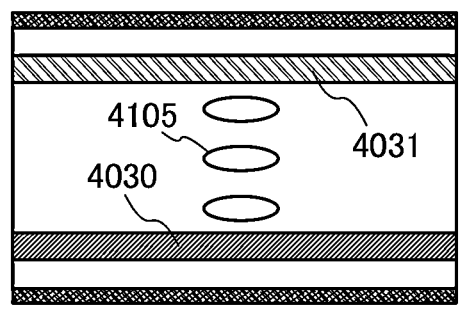
FIG. 16B2
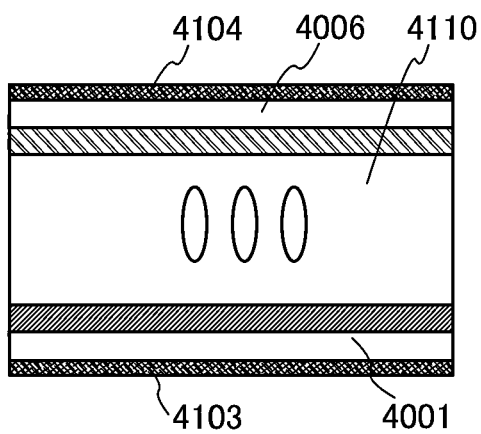
FIG. 16C1
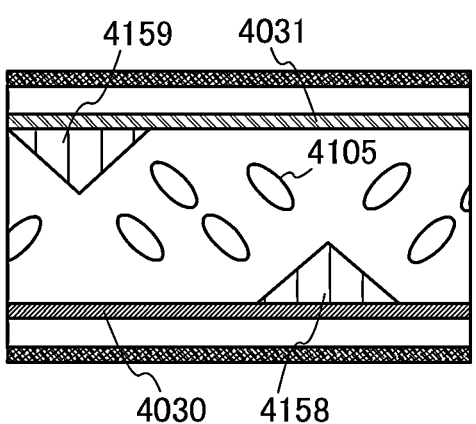
FIG. 16C2
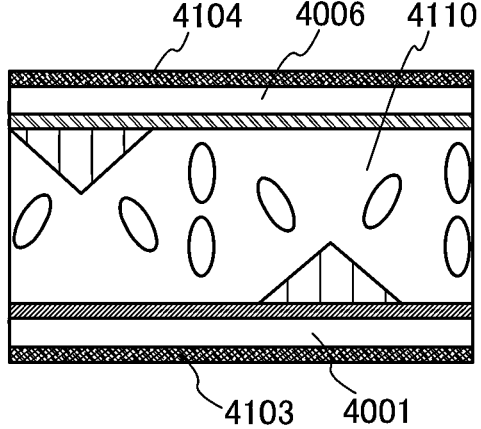

FIG. 17A1
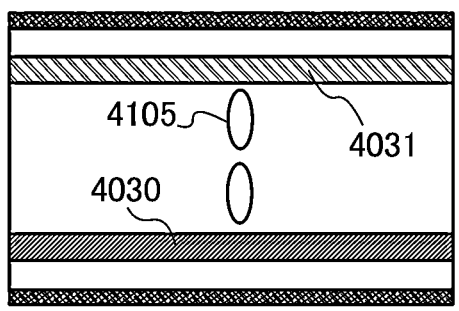
FIG. 17A2
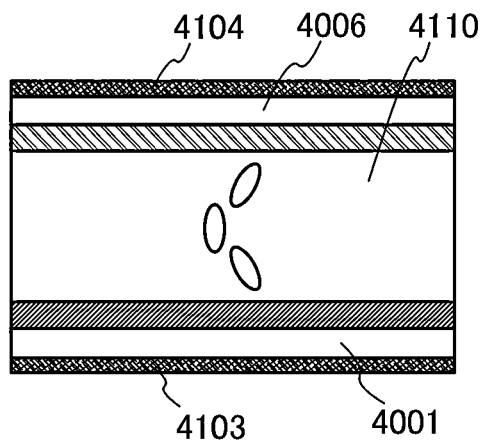
FIG. 17B1
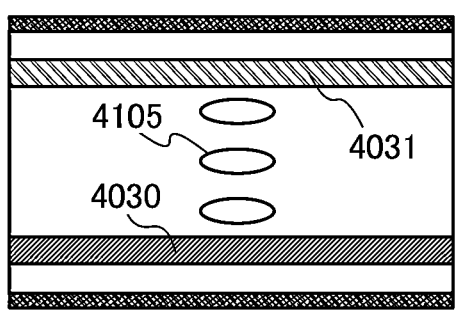
FIG. 17B2
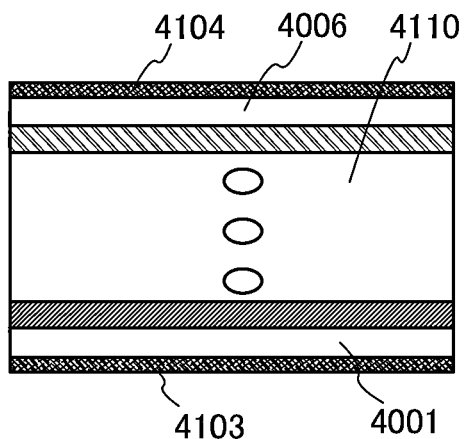

FIG. 18A1
FIG. 18A2
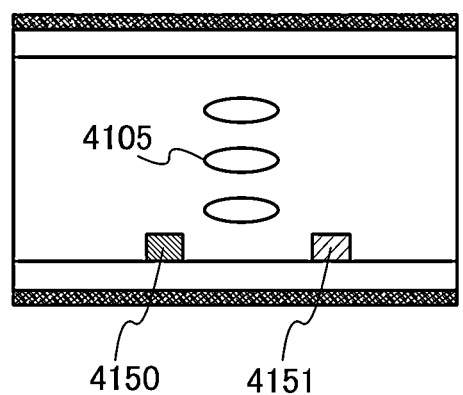
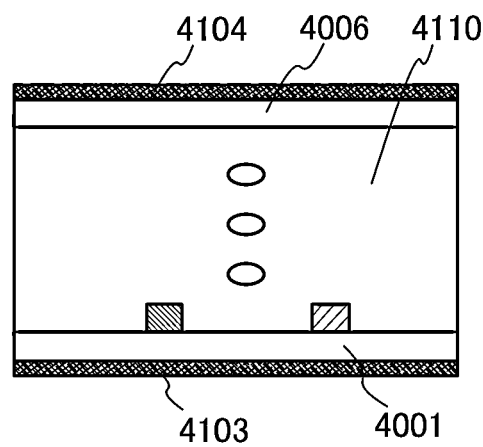
FIG. 18B1
FIG. 18B2
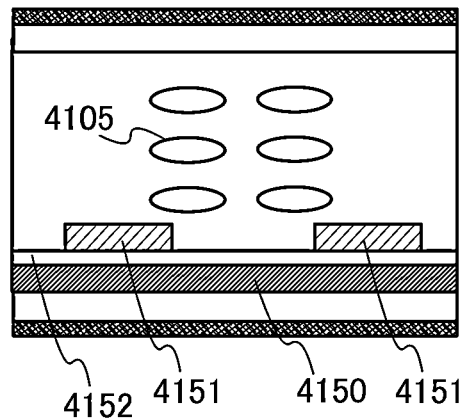
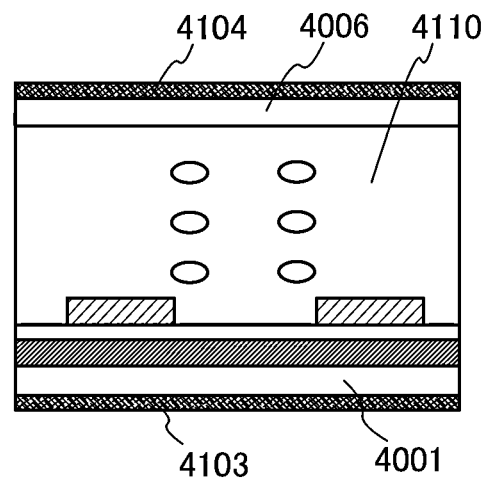

FIG. 26A (100)
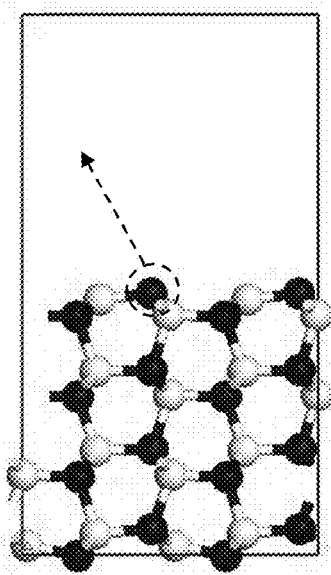
FIG. 26B (110)
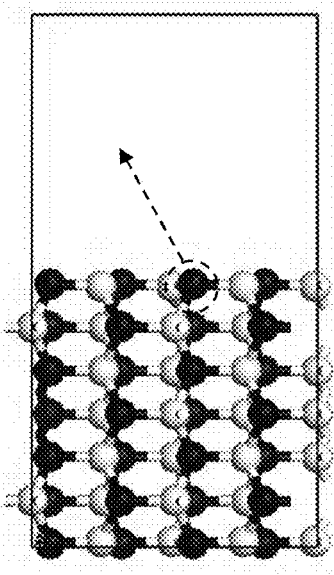
FIG. 26C (001)
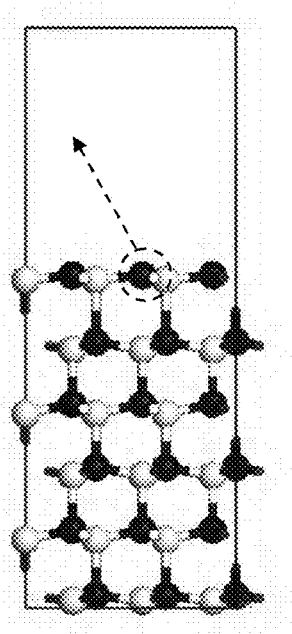

MANUFACTURING METHOD OF SEMICONDUCTOR DEVICE

BACKGROUND OF THE INVENTION

1. Field of the Invention

The present invention relates to a semiconductor device including an oxide semiconductor and a manufacturing method thereof.

In this specification, the semiconductor device refers to all the devices that can function by utilizing semiconductor characteristics. A transistor described in this specification is a semiconductor device, and an electrooptic device, a semiconductor circuit, and an electronic device which include the transistor are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

Attention has been directed to a technique in which, instead of the above silicon semiconductors, metal oxides exhibiting semiconductor characteristics are used for transistors. Note that in this specification, a metal oxide exhibiting semiconductor characteristics is referred to as an oxide semiconductor.

For example, a technique in which a transistor is manufactured by using zinc oxide or In—Ga—Zn-based metal oxide as an oxide semiconductor, and the transistor is used as a switching element or the like of a pixel of a display device is disclosed (see Patent Documents 1 and 2).

[Reference]
[Patent Document]
[Patent Document 1] Japanese Published Patent Application No. 2007-123861
[Patent Document 2] Japanese Published Patent Application No. 2007-096055

SUMMARY OF THE INVENTION

When oxygen deficiency is caused in an oxide semiconductor, part of the oxygen deficiency becomes a donor to generate an electron as a carrier. Therefore, in a transistor including an oxide semiconductor, oxygen deficiency in the oxide semiconductor including a channel formation region causes a negative shift of the threshold voltage of the transistor.

In view of the above, one embodiment of the present invention is to provide a semiconductor device whose electric characteristics are favorable and less likely to change, and a manufacturing method of the semiconductor device.

In order to solve the above problem, a semiconductor device is manufactured in a process in which oxygen deficiency in an oxide semiconductor including a channel formation region is reduced.

One embodiment of the present invention is a manufacturing method of a semiconductor device, including the steps of: forming a gate electrode over a substrate; forming a gate insulating film over the gate electrode; forming a first oxide semiconductor film over the gate insulating film; performing heat treatment after the step of forming the first oxide semiconductor film, whereby a second oxide semiconductor film is formed; forming a first conductive film over the second oxide semiconductor film; forming a first resist mask including regions whose thicknesses are different over the first conductive film; selective removing a part of the second oxide semiconductor film and a part of the first conductive film using the first resist mask, whereby a third oxide semiconductor film and a second conductive film are formed; reducing a size of the first resist mask to expose at least a region of the second conductive film overlapping with a channel formation region of the third oxide semiconductor film, whereby a second resist mask is formed; and selective removing a part of the second conductive film using the second resist mask, whereby a source electrode and a drain electrode are formed.

In the manufacturing method of a semiconductor device described above, the first resist mask including regions whose thicknesses are different is formed using a multi-tone mask. With use of the multi-tone mask, the second oxide semiconductor film can be processed into the third oxide semiconductor film and the first conductive film can be processed into the source electrode and the drain electrode using one photomask.

The heat treatment may be performed after the first oxide semiconductor film is formed over the gate insulating film, or after the first conductive film is formed over the first oxide semiconductor film which is formed over the gate insulating film.

After the formation of the source electrode and the drain electrode, a protective insulating film may be formed over the gate insulating film, the third oxide semiconductor film, the source electrode, and the drain electrode. After the formation of the protective insulating film, heat treatment may be further performed.

At least one of the gate insulating film and the protective insulating film can be an oxide insulating film. In the case where an oxide insulating film is used as the gate insulating film, oxygen released from the oxide insulating film serving as the gate insulating film can be diffused into the first oxide semiconductor film formed over the gate insulating film.

Alternatively, the gate insulating film and the protective insulating film can be an insulating film from which oxygen is released at an amount greater than or equal to $1.0 \times 10^{18}$ atoms/cm$^3$ when the amount is converted into oxygen atoms in thermal desorption spectroscopy analysis, other than the oxide insulating film.

An oxide insulating film used for at least one of the gate insulating film and the protective insulating film is preferably an oxide insulating film including more oxygen than that in the stoichiometric proportion. In the oxide insulating film including more oxygen than that in the stoichiometric proportion, much oxygen is released by heating; therefore, much oxygen can be diffused into the first oxide semiconductor film or the third oxide semiconductor film formed over the gate insulating film.

In the above manufacturing method of a semiconductor device, the heat treatment is preferably performed at a temperature at which hydrogen is eliminated from the first oxide semiconductor film, and at which oxygen contained in the gate insulating film is diffused into the first oxide semiconductor film.

The hydrogen concentration of the second oxide semiconductor film and the hydrogen concentration of the third oxide semiconductor film are each lower than $1 \times 10^{20}$ atoms/cm$^3$.

The oxide semiconductor film formed according to the above manufacturing method of a semiconductor device includes two or more elements selected from In, Ga, Sn, and Zn. Further, the oxide semiconductor film formed over the gate insulating film is non-single-crystal and includes a c-axis-aligned crystalline region.

According to one embodiment of the present invention, a semiconductor device whose electric characteristics are favorable and less likely to change, and a manufacturing method of the semiconductor device can be provided.

BRIEF DESCRIPTION OF THE DRAWINGS

In the accompanying drawings:

FIGS. 4A to 4D are cross-sectional views illustrating an example of a manufacturing method of a semiconductor device that is one embodiment of the present invention;

FIGS. 5A and 5B are cross-sectional views illustrating an example of a manufacturing method of a semiconductor device that is one embodiment of the present invention;

FIGS. 6A and 6B are cross-sectional views illustrating an example of a manufacturing method of a semiconductor device that is one embodiment of the present invention;

FIGS. 8A1, 8A2, 8B1, and 8B2 are diagrams illustrating multi-tone masks;

FIGS. 15A1 and 15A2 are top views and FIG. 15B is a cross-sectional view each illustrating an example of a display device that is one embodiment of the present invention;

FIGS. 16A1, 16A2, 16B1, 16B2, 16C1, and 16C2 are cross-sectional views illustrating examples of operation modes of a liquid crystal display device that is one embodiment of the present invention;

FIGS. 17A1, 17A2, 17B1, and 17B2 are cross-sectional views illustrating examples of operation modes of a liquid crystal display device that is one embodiment of the present invention;

FIGS. 18A1, 18A2, 18B1, and 18B2 are cross-sectional views illustrating examples of operation modes of a liquid crystal display device that is one embodiment of the present invention;

FIGS. 26A to 26C are diagrams illustrating crystal structures used for calculation of an oxide semiconductor film included in a semiconductor device that is one embodiment of the present invention.

DETAILED DESCRIPTION OF THE INVENTION

Figure 1A:
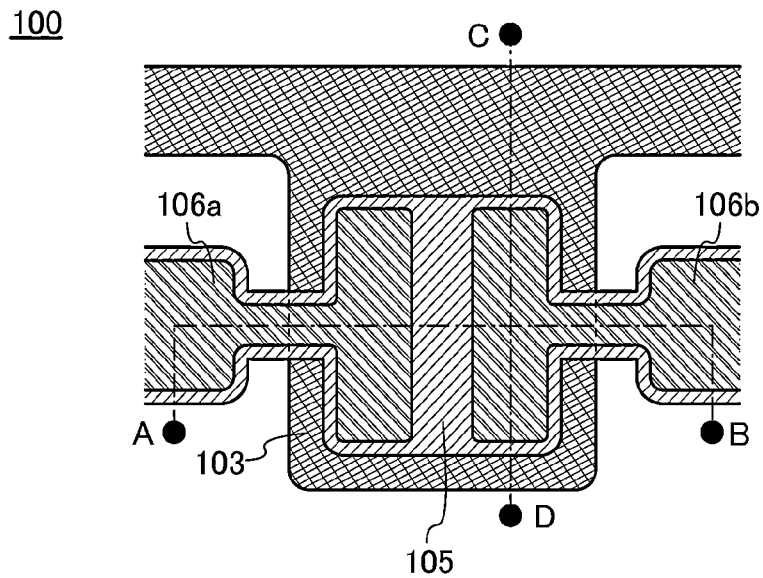
FIGS. 1A to 1C are a top view and cross-sectional views illustrating an example of a semiconductor device that is one embodiment of the present invention.

Embodiments of the present invention will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and description thereof is not repeated.

Note that in each drawing described in this specification, the size, the film thickness, or the region of each component is exaggerated for clarity in some cases. Therefore, embodiments of the present invention are not limited to such scales.

In this specification, the term "film" is used also for description of an object that has been subjected to treatment in a manufacturing process of a semiconductor device in some cases.

Note that terms such as "first", "second", and "third" in this specification are used in order to avoid confusion among components, and the terms do not limit the components numerically. Therefore, for example, the term "first" can be replaced with the term "second", "third", or the like as appropriate.

Note that in this specification, "on-state current" is current which flows between a source and a drain when a transistor is in a conduction state. For example, in the case of an n-channel thin film transistor, the on-state current is current which flows between a source and a drain when the gate voltage of the transistor is higher than the threshold voltage thereof. In addition, "off-state current" is current which flows between a source and a drain when a transistor is in a non-conduction state. For example, in the case of an n-channel thin film transistor, the off-state current is current which flows between a source and a drain when the gate voltage of the transistor is lower than the threshold voltage thereof. Note that here, the term "gate voltage" refers to a potential difference between a source and a gate when the potential of the source is used as a reference potential.

Functions of a "source" and a "drain" may be replaced with each other when the direction of current flow is changed in circuit operation, for example. Therefore, the terms "source"

and "drain" can be used to denote the drain and the source, respectively, in this specification.

(Embodiment Mode 1)

In this embodiment mode, a transistor and a manufacturing method thereof, each of which is one embodiment of the present invention, are described with reference to FIGS. 1A to 1C, FIGS. 2A to 2C, FIGS. 3A to 3C, FIGS. 4A to 4D, FIGS. 5A and 5B, FIGS. 6A and 6B, and FIGS. 7A and 7B.

Figure 1B:
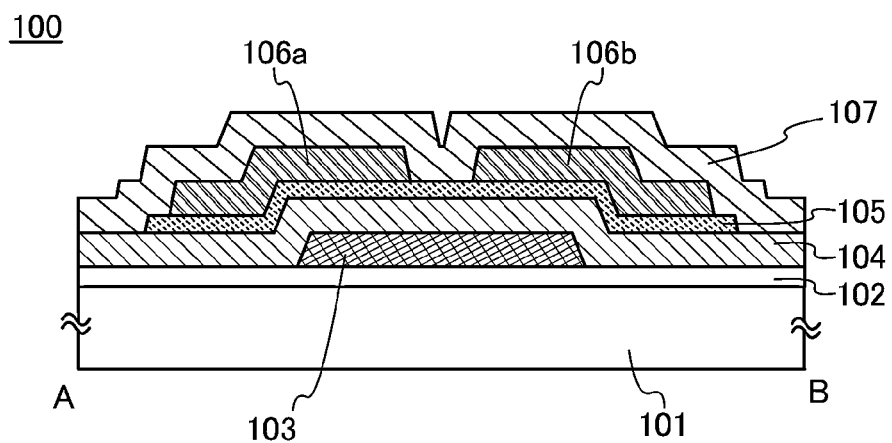
Figure 1C:
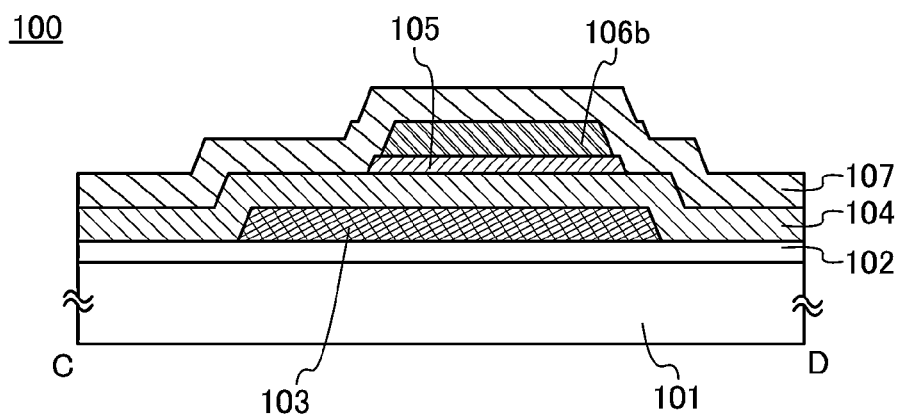

FIG. 1A is a top view illustrating a structure of a transistor 100 which is one embodiment of the present invention. FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a base insulating film 102, a gate insulating film 104, and a protective insulating film 107 are not shown for simplicity.

In FIGS. 1B and 1C, the transistor 100 includes a substrate 101, the base insulating film 102 provided over the substrate 101, a gate electrode 103 provided over the base insulating film 102, the gate insulating film 104 provided over the gate electrode 103, an oxide semiconductor film 105 provided over the gate insulating film 104, a source electrode 106a and a drain electrode 106b provided over the oxide semiconductor film 105, and a protective insulating film 107 provided over the gate electrode 103, the oxide semiconductor film 105, the source electrode 106a, and the drain electrode 106b.

In the transistor 100, ends of the source electrode 106a and the drain electrode 106b are positioned inside an end of the oxide semiconductor film 105. In other words, the source electrode 106a and the drain electrode 106b do not cover a step formed by the gate insulating film 104 and the oxide semiconductor film 105, and are in contact with the oxide semiconductor film 105 only on a top surface of the oxide semiconductor film 105.

Figure 2A:
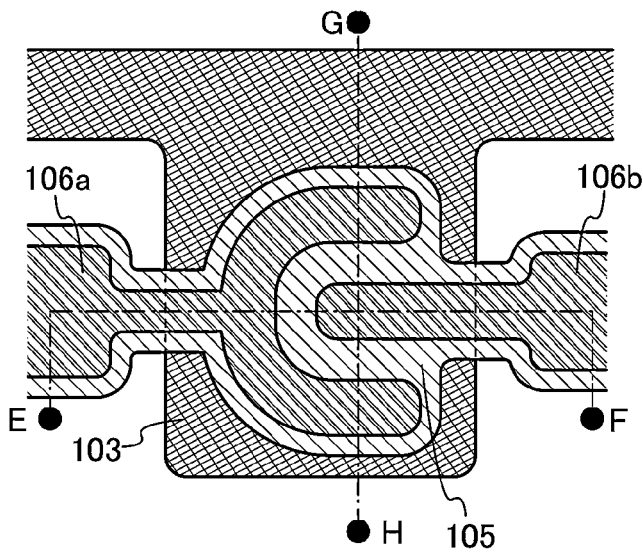
FIGS. 2A to 2C are a top view and cross-sectional views illustrating an example of a semiconductor device that is one embodiment of the present invention.
Figure 2B:
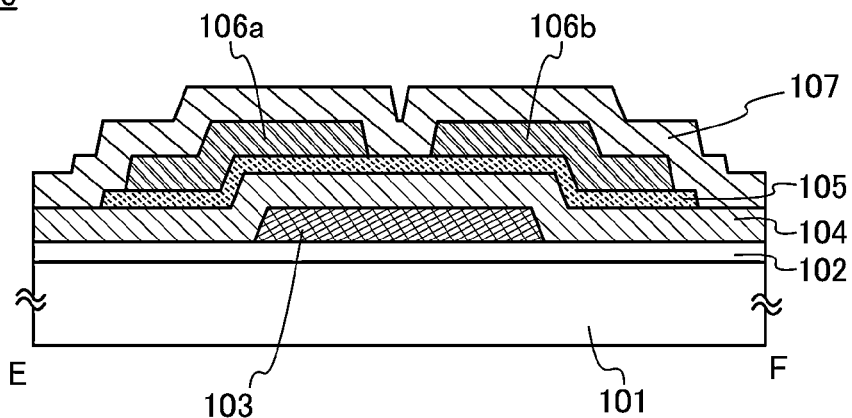
Figure 2C:
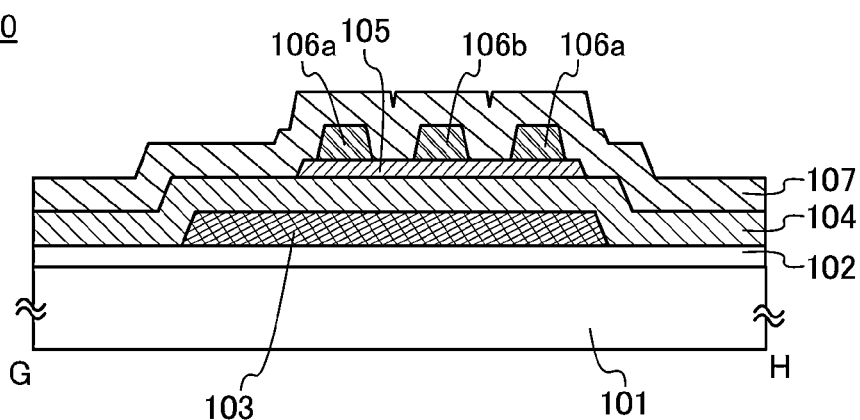

FIG. 2A is a top view illustrating a structure of a transistor 200 which is one embodiment of the present invention. FIG. 2B is a cross-sectional view taken along dashed-dotted line E-F in FIG. 2A, and FIG. 2C is a cross-sectional view taken along dashed-dotted line G-H in FIG. 2A. Note that in FIG. 2A, the base insulating film 102, the gate insulating film 104, and the protective insulating film 107 are not shown for simplicity.

The transistor 200 has a stacked structure similar to that of the transistor 100, and the shapes of the source electrode 106a and the drain electrode 106b included in the transistor 200 are different from those in the transistor 100. Also in the transistor 200, the ends of the source electrode 106a and the drain electrode 106b are positioned inside the end of the oxide semiconductor film 105, and the source electrode 106a and the drain electrode 106b are in contact with the oxide semiconductor film 105 only on the top surface of the oxide semiconductor film 105. In the transistor 200, the source electrode 106a is U-shaped (or C-shaped, square-bracket-like shaped, or horseshoe-shaped) so as to surround the drain electrode 106b. With such a shape, an enough channel width can be ensured even when the area occupied by the transistor is small, and accordingly, the amount of on-state current of the transistor can be increased.

In general, the larger the channel width is, the larger parasitic capacitance between the gate electrode 103 and the source electrode 106a and between the gate electrode 103 and the drain electrode 106b becomes. However, with the structure in which the drain electrode 106b is surrounded by the U-shaped source electrode 106a, increase in parasitic capacitance, particularly parasitic capacitance between the gate electrode 103 and the drain electrode 106b can be suppressed.

For example, in a pixel transistor of an active matrix liquid crystal display device, when parasitic capacitance generated between a gate electrode and a drain electrode which is electrically connected to the pixel electrode is large, the liquid crystal display device is easily influenced by feedthrough, and potential (video data) supplied to a pixel cannot be kept accurately, which may debase the display quality. With use of the transistor 200 which is one embodiment of the present invention as a pixel transistor of an active matrix liquid crystal display device, an enough channel width can be ensured and parasitic capacitance generated between the drain electrode 106b and the gate electrode 103 can be reduced; accordingly, the display quality of the display device can be improved.

Figure 3A:
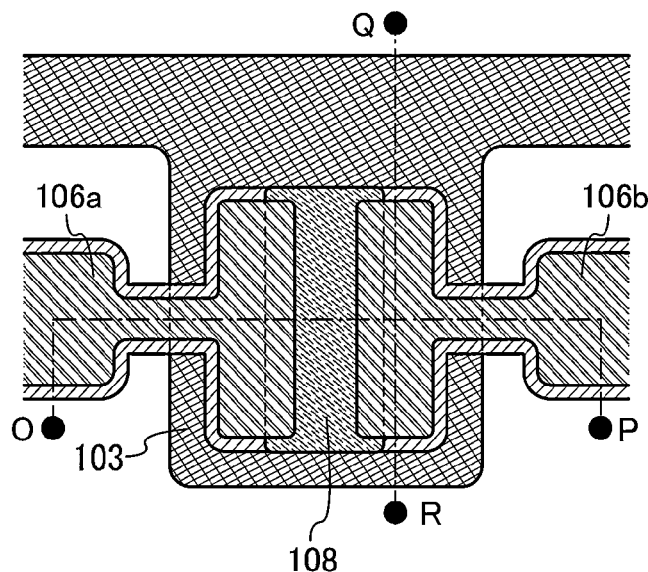
FIGS. 3A to 3C are a top view and cross-sectional views illustrating an example of a semiconductor device that is one embodiment of the present invention.
Figure 3B:
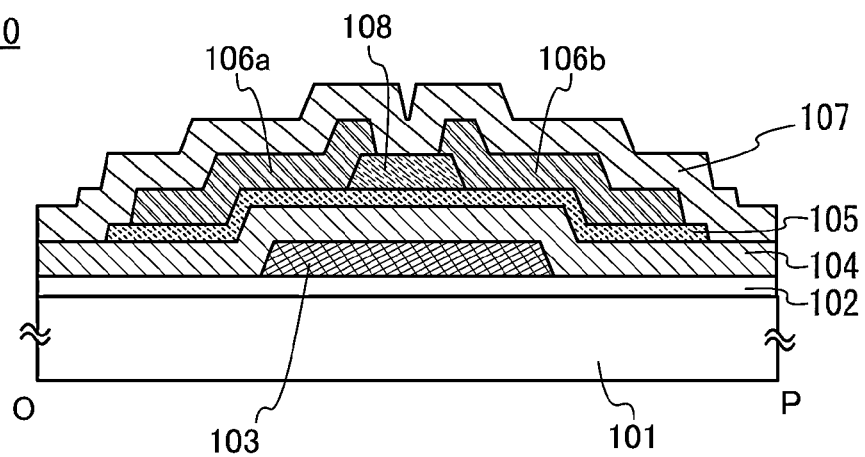
Figure 3C:
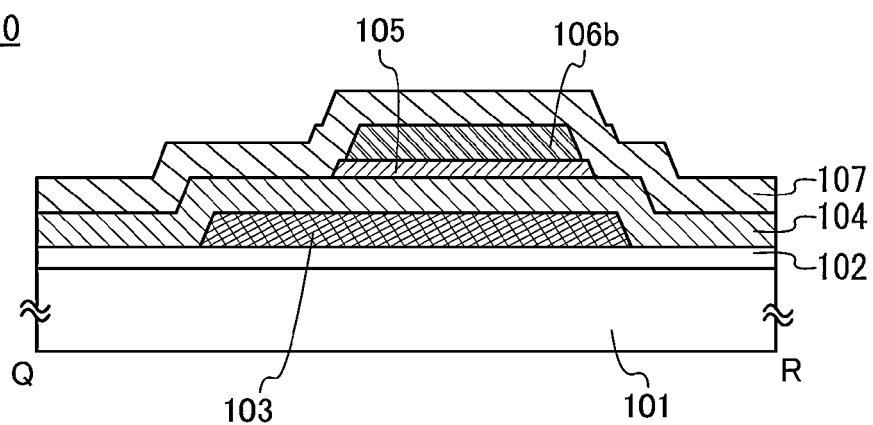

FIG. 3A is a top view illustrating a structure of a transistor 310 which is one embodiment of the present invention. FIG. 3B is a cross-sectional view taken along dashed-dotted line O-P in FIG. 3A, and FIG. 3C is a cross-sectional view taken along dashed-dotted line Q-R in FIG. 3A. Note that in FIG. 3A, the base insulating film 102, the gate insulating film 104, and the protective insulating film 107 are not shown for simplicity.

The transistor 310 has a structure in which a channel protective film 108 is additionally provided in the transistor 100 described using FIGS. 1A to 1C. The channel protective film 108 is provided over the oxide semiconductor film 105. Also in the transistor 310, the ends of the source electrode 106a and the drain electrode 106b are positioned inside the end of the oxide semiconductor film 105, and the source electrode 106a and the drain electrode 106b are in contact with the oxide semiconductor film 105 only on the top surface of the oxide semiconductor film 105.

Although the provision of the channel protective film 108 results in more number of manufacturing steps than those of the transistor 100, increase in oxygen deficiency generated on the back channel side can be suppressed in a manufacturing steps after the formation of the channel protective film 108. Thus, in manufacturing steps after the formation of the channel protective film 108, the range of treatment conditions can be widened, leading to a semiconductor device with high productivity and high reliability. Note that the term "back channel" in this specification refers to the vicinity of an interface between an oxide semiconductor film and another film, which is opposite to an interface between the oxide semiconductor film and a gate insulating film.

The transistor 100, the transistor 200, and the transistor 310 are each one mode of bottom gate transistors, and an inverted staggered transistor. The transistor 100 and the transistor 200 are also called channel-etched transistors, and the transistor 310 is also called a channel-protective (channel-stop) transistor.

Next, a manufacturing method of the transistor 100 illustrated in FIGS. 1A to 1C is described with reference to FIGS. 4A to 4D, FIGS. 5A and 5B, FIGS. 6A and 6B, FIGS. 7A and 7B, and FIGS. 8A1, 8A2, 8B1 and 8B2. Note that FIGS. 4A to 4D, FIGS. 5A and 5B, FIGS. 6A and 6B, and FIGS. 7A and 7B are cross-sectional views illustrating the manufacturing method of the transistor 100 and correspond to cross sections taken along the dashed-dotted line A-B and the dashed-dotted line C-D in FIG. 1A. Note that the transistor 200 is different from the transistor 100 only in that shapes of the source electrode 106 and the drain electrode 106b (including a source wiring and a drain wiring); therefore, the manufacturing method of the transistor 100 will be described as the method that can be applied to the transistor 200.

As illustrated in FIG. 4A, the base insulating film 102 is formed over the substrate 101, and the gate electrode 103 is formed over the base insulating film 102. Note that the base insulating film 102 is not necessarily formed in some cases.

There is no particular limitation on the property of a material and the like of the substrate 101 as long as the material has heat resistance enough high to withstand at least heat treatment to be performed later. For example, a glass substrate, a ceramic substrate, a quartz substrate, or a sapphire substrate may be used as the substrate 101.

Alternatively, a single-crystal semiconductor substrate such as a silicon substrate or a silicon carbide substrate, a polycrystalline semiconductor substrate, a compound semiconductor substrate such as a silicon germanium substrate, a conductive substrate such as a metal substrate or a stainless steel substrate, a substrate obtained by covering a surface of any of these semiconductor substrates and conductive substrates with an insulating material, or the like can be used. Still alternatively, any of these substrates over which a semiconductor element is provided may be used as the substrate 101.

Further alternatively, a flexible glass substrate or a flexible plastic substrate can be used as the substrate 101. As a plastic substrate, a substrate having low refractive index anisotropy is preferably used, and a polyether sulfone (PES) film, a polyimide, a polyethylene naphthalate (PEN) film, a polyvinyl fluoride (PVF) film, a polyester film, a polycarbonate (PC) film, an acrylic resin film, a prepreg which includes a fibrous body in a partially-cured organic resin, or the like can be typically used.

The base insulating film 102 prevents diffusion of an impurity (e.g., an alkali metal such as Li or Na) from the substrate 101 and also prevents the substrate 101 from being etched by an etching step in a manufacturing process of the transistor 100. Although not particularly limited, the thickness of the base insulating film 102 is preferably greater than or equal to 50 nm.

The base insulating film 102 may be formed in a manner similar to that of the gate insulating film 104 to be described later using a material selected from materials that can be used for the gate insulating film 104. In order to prevent entry of an alkali metal, a nitride insulating film to be described later is preferably used as the base insulating film 102. With use of an insulating film having high thermal conductivity as the base insulating film 102, the heat-releasing property of the transistor 100 can be improved. Examples of the insulating film having high thermal conductivity include an aluminum nitride film, an aluminum nitride oxide film, and a silicon nitride film. Note that the base insulating film 102 may have a single layer structure or a stacked structure.

Next, a conductive film to be the gate electrode 103 is formed over the base insulating film 102. Note that the gate electrode 103 also serves as a gate wiring.

A conductive material that can be used for the conductive film is an elemental metal such as aluminum, titanium, chromium, nickel, copper, yttrium, zirconium, molybdenum, silver, tantalum, or tungsten; an alloy including any of these metal elements as its main component; or a nitride of any of these metal elements.

The conductive film to be the gate electrode 103 can have a single layer structure or a stacked structure including any of the above-described conductive materials. For example, a single-layer structure of an aluminum film containing silicon, a two-layer structure in which a titanium film is formed over an aluminum film, a two-layer structure in which a titanium film is formed over a tungsten film, a two-layer structure in which a copper film is formed over a copper-magnesium-aluminum alloy film, and a three-layer structure in which a titanium film, an aluminum film, and a titanium film are stacked in that order are given. Further, a transparent conductive material including indium oxide, tin oxide, or zinc oxide may be used.

The conductive film to be the gate electrode 103 is formed over the base insulating film 102 using any of the above-mentioned conductive materials by a sputtering method, a vacuum evaporation method, or a plating method. Alternatively, the conductive film to be the gate electrode 103 can be formed by discharging a conductive nanopaste of silver, gold, copper, or the like over the substrate by an ink-jet method and baking the conductive nanopaste. A mask is formed over the conductive film by a photolithography method, an ink-jet method, a printing method, or the like, and then part of the conductive film is selectively removed (etched) using the mask, so that the gate electrode 103 can be formed. Here, a titanium film is formed by a DC sputtering method using a titanium target, and the titanium film is subjected to etching using a resist mask formed by a photolithography method, whereby the gate electrode 103 is formed. The etching for forming the gate electrode 103 may be wet etching or dry etching.

The thickness of the gate electrode 103 is not particularly limited and can be determined as appropriate depending on the electric resistance of the above conductive material and a period of time for the manufacturing step. For example, the thickness of the gate electrode 103 may be greater than or equal to 10 nm and less than or equal to 500 nm.

In order to improve the coverage with the gate insulating film 104 to be formed later, a side surface of the gate electrode 103 preferably has a tapered shape. In order that the side surface of the gate electrode 103 has a tapered shape, etching may be performed while the resist mask is reduced in size.

In order to improve adhesion between the gate electrode 103 and the substrate 101, a nitride film of any of the above-mentioned elemental metals may be provided between the substrate 101 and the gate electrode 103.

Further, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, a metal nitride (e.g., InN or ZnN) film is preferably provided between the gate electrode 103 and the gate insulating film 104 to be described later. These films each can have a work function of 5 eV or higher, preferably 5.5 eV or higher; thus, the threshold voltage as an electric characteristic of the transistor 100 can be positive, so that the transistor 100 can be a so-called normally-off transistor. For example, in the case of using an In—Ga—Zn—O film containing nitrogen, an In—Ga—Zn—O film having a higher nitrogen concentration than at least the first oxide semiconductor film 115, specifically, an In—Ga—Zn—O film having a nitrogen concentration of 7 at. % or higher is used.

Next, as illustrated in FIG. 4B, the gate insulating film 104 is formed over the gate electrode 103. The thickness of the gate insulating film 104 is greater than or equal to 1 nm and less than or equal to 300 nm, and preferably greater than or equal to 5 nm and less than or equal to 50 nm.

For the gate insulating film 104, a single layer structure or a stacked structure of an insulating film(s) selected from an oxide insulating film such as a silicon oxide film, a gallium oxide film, or an aluminum oxide film; a nitride insulating film such as a silicon nitride film or an aluminum nitride film; a silicon oxynitride film; an aluminum oxynitride film; and a silicon nitride oxide film is employed. Note that the gate insulating film 104 preferably includes oxygen in a portion which is in contact with the first oxide semiconductor film 115 to be described later.

Alternatively, for the gate insulating film 104, a single layer structure of a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate ($HfAl_xO_y$ (x>0, y>0)), or a stacked structure of the high-k material and the above-described insulating film can be employed.

Since the high-k material has a high dielectric constant, for example, the gate insulating film can have a larger physical thickness while maintaining the capacitance to be the same as that in the case where a silicon oxide film is used as the gate insulating film; therefore, gate leakage current can be reduced.

In this specification, silicon oxynitride refers to a substance that contains more oxygen than nitrogen Further, silicon nitride oxide refers to a substance that contains more nitrogen than oxygen.

Since the gate insulating film 104 preferably includes oxygen in the portion which is in contact with the first oxide semiconductor film 115 to be described later, an insulating film from which oxygen is released by heating may be used as the gate insulating film 104. Note that the expression "oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$, in thermal desorption spectroscopy (TDS) analysis.

A method for quantifying the amount of released oxygen which is converted into oxygen atoms, with the use of TDS analysis is described below.

The amount of released gas in TDS analysis is proportional to the integral value of a spectrum. Therefore, the amount of released gas can be calculated from the ratio between the integral value of spectrum of the insulating film and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be obtained according to Equation 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a compound having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha \quad \text{[FORMULA 1]}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient which influences spectrum intensity in TDS analysis. Refer to Japanese Published Patent Application No. H6-275697 for details of formula 1. Note that the amount of released oxygen is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. For the oxide insulating film, the amount of released oxygen when converted into oxygen atoms is twice the number of the released oxygen molecules.

As an example of the insulating film from which oxygen is released by heating, an oxide insulating film including more oxygen than that in the stoichiometric proportion, specifically a film of oxygen-excess silicon oxide ($SiO_X$ (X>2)) is given. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

With use of the insulating film from which oxygen is released by heating as the gate insulating film 104, oxygen is supplied to the first oxide semiconductor film 115 to be described later, whereby the interface state between the gate insulating film 104 and the first oxide semiconductor film 115 to be described later can be reduced. As a result, electric charges or the like generated due to operation of the transistor 100 can be prevented from being trapped at the interface state; therefore, the transistor 100 can be a transistor with less deterioration in electric characteristics.

The gate insulating film 104 is formed by a sputtering method, a CVD method, or the like. In this embodiment, the case where a sputtering method is employed for the formation of the gate insulating film 104 is described. In the case where the gate insulating film 104 is formed by a CVD method, a thermal CVD method, a plasma CVD method, a high-density plasma CVD method using microwaves (e.g., a frequency of 2.45 GHz), or the like can be employed.

In the case where the gate insulating film 104 is formed by a sputtering method, the gate insulating film 104 may be formed using a silicon target, a quartz target, an aluminum target, an aluminum oxide target, or the like in an atmosphere gas containing oxygen. The proportion of oxygen in the whole atmosphere gas is 6 vol. % or higher, preferably 50 vol. % or higher. By increasing the proportion of the oxygen gas in the atmosphere gas, the insulating film from which oxygen is released by heating can be formed.

Hydrogen in the target is preferably removed as much as possible. Specifically, an oxide target including an OH group at 100 ppm or lower, preferably 10 ppm or lower, further preferably 1 ppm or lower is used, whereby the hydrogen concentration of the gate insulating film 104 can be reduced and thus the electric characteristics and reliability of the transistor 100 can be improved. For example, fused quartz is preferable because it is easily formed so as to include an OH group at 10 ppm or lower and is inexpensive. Needless to say, a target of synthetic quartz having a low OH group concentration may be used.

Further, since an alkali metal such as Li or Na is an impurity in the manufacturing process of the transistor 100, the amount thereof is preferably small. In the case of using a glass substrate containing an impurity such as an alkali metal as the substrate 101, in order to prevent entry of the alkali metal, it is preferable to form the above-mentioned nitride insulating film as the gate insulating film 104, and it is preferable to further form the above-described oxide insulating film over the nitride insulating film.

Next, as illustrated in FIG. 4C, the first oxide semiconductor film 115 is formed over the gate insulating film 104. The first oxide semiconductor film 115 can be formed over the gate insulating film 104 by a sputtering method, a molecular beam epitaxy method, an atomic layer deposition method, or a pulsed laser deposition method. Here, the first oxide semiconductor film 115 is formed by a sputtering method. The thickness of the first oxide semiconductor film 115 may be greater than or equal to 1 nm and less than or equal to 50 nm.

For the first oxide semiconductor film 115, a metal oxide containing two or more elements selected from In, Ga, Sn, and Zn can be used. Note that the band gap of the metal oxide is 2 eV or higher, preferably 2.5 eV or higher, further preferably 3 eV or higher. The use of a metal oxide having a wide band gap can reduce off-state current of the transistor 100.

For example, for the first oxide semiconductor film 115, a four-component metal oxide such as In—Sn—Ga—Zn-based metal oxide; a three-component metal oxide such as In—Ga—Zn-based metal oxide, In—Sn—Zn-based metal oxide, In—Al—Zn-based metal oxide, Sn—Ga—Zn-based metal oxide, Al—Ga—Zn-based metal oxide, or Sn—Al—Zn-based metal oxide; or a two-component metal oxide such as In—Zn-based metal oxide, Sn—Zn-based metal oxide, Al—Zn-based metal oxide, Zn—Mg-based metal oxide, Sn—Mg-based metal oxide, In—Mg-based metal oxide, or In—Ga-based metal oxide can be used. Alternatively, In-based metal oxide, Sn-based metal oxide, Zn-based metal oxide, or the like may be used. Note that an n-component metal oxide includes n kinds of metal oxides. Here, for example, an In—Ga—Zn-based metal oxide means an oxide containing indium (In), gallium (Ga), and zinc (Zn), and there is no particular limitation on the composition ratio thereof. Further, the In—Ga—Zn-based metal oxide may contain an element other than In, Ga, and Zn.

Note that it is preferable that oxygen (O) be excessively contained in the metal oxide as compared to oxygen in the stoichiometric proportion. When oxygen (O) is excessively contained, generation of carriers due to oxygen deficiency in the first oxide semiconductor film 115 to be formed can be prevented.

Note that for example, in the case where the first oxide semiconductor film 115 is formed using an In—Zn-based metal oxide, a target has a composition ratio where In/Zn is 0.5 to 50, preferably 1 to 20, more preferably 1.5 to 15 in an atomic ratio. When the atomic ratio of Zn is in the above preferred range, the field-effect mobility of a transistor can be improved. Here, when the atomic ratio of the compound is In:Zn:O=X:Y:Z, it is preferable to satisfy the relation of Z>1.5X+Y so that oxygen (O) is excessively contained.

The first oxide semiconductor film 115 may be either an amorphous oxide semiconductor film or an oxide semiconductor film including a crystalline region.

Here, a sputtering apparatus used for formation of the first oxide semiconductor film 115 is described in detail below.

The leakage rate of a treatment chamber in which the first oxide semiconductor film 115 is formed is preferably lower than or equal to $1\times10^{-10}$ Pa·m$^3$/s; thus, entry of an impurity into the film can be suppressed in the formation by a sputtering method.

In order to lower the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m$^3$/s.

In order to reduce external leakage, an open/close portion of the treatment chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member for an inner wall of the treatment chamber, aluminum, chromium, titanium, zirconium, nickel, or vanadium, from which a gas containing hydrogen is less likely to be released, or an alloy material which contains at least one of iron, chromium, nickel, and the like and is covered with any of these elements may be used. The alloy material which contains at least one of iron, chromium, nickel, and the like is rigid, resistant to heat, and suitable for processing. Here, when surface unevenness of the member is reduced by polishing or the like to reduce the surface area of the inner wall of the treatment chamber, the released gas can be reduced. Alternatively, the member may be covered with iron fluoride, aluminum oxide, chromium oxide, or the like which is in the passive state.

Furthermore, it is preferable to provide a purifier for an atmosphere gas just in front of the treatment chamber. At this time, the length of a pipe between the purifier and the treatment chamber is less than or equal to 5 m, preferably less than or equal to 1 m. When the length of the pipe is less than or equal to 5 m or less than or equal to 1 m, an influence of the released gas from the pipe can be reduced accordingly Evacuation of the treatment chamber is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or water. Hence, combination of a cryopump having a high capability in evacuating water and a sputter ion pump having a high capability in evacuating hydrogen is effective.

An adsorbate present in the treatment chamber does not affect the pressure in the treatment chamber because it is adsorbed on the inner wall, but the adsorbate leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate. By the baking, the rate of desorption of the adsorbate can be increased about tenfold. The baking may be performed at a temperature higher than or equal to 100° C. and lower than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as appropriate as a power supply device for generating plasma.

When the first oxide semiconductor film 115 is formed by a sputtering method, a metal oxide target containing two or more elements selected from indium, gallium, tin, and zinc can be used as a target.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used.

As the atmosphere gas, a rare gas (typically argon) atmosphere, an oxygen atmosphere, or a mixed gas of a rare gas and oxygen is used as appropriate. It is preferable that a high-purity gas from which impurities such as hydrogen, water, compounds having a hydroxyl group, and hydride are removed be used as the atmosphere gas.

With the above sputtering apparatus, the first oxide semiconductor film 115 in which less hydrogen is mixed can be formed. Note that even when the sputtering apparatus is used, the first oxide semiconductor film 115 includes nitrogen. For example, the nitrogen concentration of the first oxide semiconductor film 115 measured by secondary ion mass spectroscopy (SIMS) is less than $5\times10^{18}$ atoms/cm$^3$.

The gate insulating film 104 and the first oxide semiconductor film 115 may be successively formed in vacuum. For example, the following may be performed: impurities including hydrogen attached to a surface of the base insulating film 102 and a surface of the gate electrode 103 over the substrate 101 are removed by heat treatment or plasma treatment, and then the gate insulating film 104 and the first oxide semiconductor film 115 are successively formed in this order without exposure to the atmosphere. Thus, impurities including hydrogen attached to the surface of the base insulating film 102 and the surface of the gate electrode 103 can be reduced, and atmospheric components can be prevented from attaching to an interface between the base insulating film 102 and the gate insulating film 104, an interface between the gate electrode 103 and the gate insulating film 104, and an interface between the gate insulating film 104 and the first oxide semiconductor film 115. Accordingly, it is possible to form a highly reliable transistor 100 having favorable electric characteristics.

Further, during or after the formation of the first oxide semiconductor film 115, electric charge is generated owing to an oxygen deficiency in the first oxide semiconductor film 115 in some cases. In general, when oxygen deficiency is caused in an oxide semiconductor, part of the oxygen deficiency becomes a donor to generate an electron as a carrier. That is, also in the transistor 100, part of oxygen deficiency in the first oxide semiconductor film 115 becomes a donor to generate an electron as a carrier and thus the threshold voltage of the transistor 100 is negatively shifted. In addition, the generation of an electron in the first oxide semiconductor film 115 often occurs in oxygen deficiency caused in the vicinity of the interface between the first oxide semiconductor film 115 and the gate insulating film 104.

Therefore, after the formation of the first oxide semiconductor film 115, first heat treatment is performed to form the second oxide semiconductor film 117 (see FIG. 4D).

By the first heat treatment, hydrogen (including water, a hydroxyl group, and hydride) is released from the first oxide semiconductor film 115, part of oxygen contained in the gate insulating film 104 is released, and oxygen is diffused into the first oxide semiconductor film 115 and into the vicinity of an interface between the gate insulating film 104 and the first oxide semiconductor film 115.

The first heat treatment is performed at a temperature at which the above phenomena can occur, specifically, higher than or equal to 150° C. and lower than the strain point of the substrate, preferably higher than or equal to 250° C. and lower than or equal to 450° C., further preferably higher than or equal to 300° C. and lower than or equal to 450° C., in an oxidation atmosphere or an inert atmosphere. Here, the oxidation atmosphere refers to an atmosphere including an oxidation gas such as oxygen, ozone, or nitrogen oxide at 10 ppm or higher. The inert atmosphere refers to an atmosphere including the oxidation gas at lower than 10 ppm and is filled with nitrogen or a rare gas. The treatment time is for 3 minutes to 24 hours. Heat treatment for longer than 24 hours is not preferable because the productivity is reduced.

There is no particular limitation on a heat treatment apparatus used for the first heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The first heat treatment causes part of oxygen contained in the gate insulating film 104 to release and diffuse into the first oxide semiconductor film 115, so that oxygen deficiency in the first oxide semiconductor film 115 is compensated. In other words, sufficient oxygen is released from the gate insulating film 104 into the first oxide semiconductor film 115, whereby the oxygen deficiency in the first oxide semiconductor film 115, which causes a negative shift of the threshold voltage, can be compensated.

Further, hydrogen in the first oxide semiconductor film 115 serves as a donor to generate an electron that is a carrier. By the first heat treatment, the hydrogen concentration of the first oxide semiconductor film 115 is reduced, thereby becoming the second oxide semiconductor film 117 which is highly purified. The hydrogen concentration of the second oxide semiconductor film 117 is less than $5\times10^{18}$ atoms/cm$^3$, preferably $1\times10^{18}$ atoms/cm$^3$ or less, further preferably $5\times10^{17}$ atoms/cm$^3$ or less, still further preferably $1\times10^{16}$ atoms/cm$^3$. Note that the hydrogen concentration of the second oxide semiconductor film 117 is measured by secondary ion mass spectroscopy (SIMS).

The second oxide semiconductor film 117 purified by a sufficient reduction in hydrogen concentration by the first heat treatment, in which defect levels in the energy gap due to oxygen deficiency are reduced as a result of sufficient supply of oxygen, has a carrier density, which depends on donors such as hydrogen, of $1\times10^{13}$/cm$^3$ or lower. The off-state current (per unit channel width (1 μm) here) at room temperature (25° C.) is 100 zA (1 zA (zeptoampere) is $1\times10^{-21}$ A) or lower, preferably 10 zA or lower. Therefore, the transistor 100 with excellent off-state current characteristics can be obtained with the use of the second oxide semiconductor film 117. Since alkali metal such as Li or Na is an impurity, the content of alkali metal is preferably reduced. The content of the alkali metal in the second oxide semiconductor film 117 is preferably $2\times10^{16}$ cm$^{-3}$ or lower, preferably $1\times10^{15}$ cm$^{-3}$ or lower. Further, the content of alkaline earth metal is preferably reduced because alkaline earth metal is also an impurity.

Accordingly, the transistor 100 manufactured through the first heat treatment is a transistor having favorable electric characteristics.

Next, a conductive film 118 to be the source electrode 106a and the drain electrode 106b is formed over the second oxide semiconductor film 117 (see FIG. 5A).

The conductive film 118 can be formed in a manner similar to that of the conductive film to be the gate electrode 103. The conductive film 118 is formed using a conductive material selected from the conductive materials that can be used for the gate electrode 103 as appropriate to have a single layer structure or a stacked structure. Here, a tungsten film is used.

In this embodiment, the first heat treatment is performed before the formation of the conductive film 118 to be the source electrode 106a and the drain electrode 106b; however, the first heat treatment may be performed after the first oxide semiconductor film 115 is formed and thereover the conductive film 118 is formed. In other words, the first heat treatment may be performed on (1) an object including the substrate 101, the base insulating film 102, the gate electrode 103, and the first oxide semiconductor film 115 or (2) an object including the substrate 101, the base insulating film 102, the gate electrode 103, the first oxide semiconductor film 115, and the conductive film 118. In the case (1), the first oxide semiconductor film 115 is changed into the second oxide semiconductor film 117 by the first heat treatment, and when the conductive film 118 is formed over the second oxide semiconductor film 117, a defect may be formed in the second oxide semiconductor film 117. In the case (2), the second oxide semiconductor film 117 is formed after the formation of the conductive film 118; therefore, the possibility that a defect is formed in the second oxide semiconductor film 117 can be lowered.

Next, a photolithography method is performed so that a resist mask 119 including regions whose thicknesses are different is formed over the conductive film 118 (see FIG. 5B).

The resist mask 119 including regions whose thicknesses are different is formed so that the thickness of a resist that covers the regions to be the source electrode 106a and the drain electrode 106b and the thickness of a resist that covers a channel formation region of the transistor 100 are different from each other. Specifically, the thickness of the resist that covers the channel formation region of the transistor 100 is smaller than the thickness of the resist that covers the regions to be the source electrode 106a and the drain electrode 106b.

The resist mask 119 including regions whose thicknesses are different can be formed using a multi-tone mask. The use of the multi-tone mask can reduce the number of photomasks used and the number of steps in the manufacturing of the transistor 100, which is preferable. In the case where the multi-tone mask is not used, the manufacturing of the transistor 100 needs two photomasks and two photolithography processes in a step of processing the second oxide semiconductor film 117 to have an island shape and a step of processing the conductive film 118 to be the source electrode 106a and the drain electrode 106b; whereas in the case where the multi-tone mask is used, the transistor 100 can be manufactured using one photomask through one photolithography step.

A multi-tone mask is a mask capable of light exposure with multi-level light intensity; typically, light exposure is performed with three levels of light intensity to provide an exposed region, a half-exposed region, and an unexposed region. With the use of a multi-tone mask, a resist mask with a plurality of thicknesses (typically, two kinds of thicknesses) can be formed by one-time exposure and development process. Therefore, by the use of a multi-tone mask, the number of photomasks can be reduced.

A multi-tone mask is described with reference to FIGS. 8A1, 8A2, 8B1, and 8B2. FIGS. 8A1 and 8B1 are cross-sectional views of typical multi-tone photomasks. FIG. 8A1 illustrates a gray-tone mask 403, and FIG. 8B1 illustrates a half-tone mask 414.

The gray-tone mask 403 illustrated in FIG. 8A1 includes, on a light-transmitting substrate 400, a light-blocking portion 401 formed using a light-blocking layer and a diffraction grating portion 402 formed by the pattern of the light-blocking layer.

The diffraction grating portion 402 has slits, dots, mesh, or the like that is provided at intervals which are less than or equal to the resolution limit of light used for the exposure, whereby the light transmittance is controlled. Note that the slits, dots, or mesh provided at the diffraction grating portion 402 may be provided periodically or non-periodically.

For the light-transmitting substrate 400, quartz or the like can be used. The light-blocking layer included in the light-blocking portion 401 and the diffraction grating portion 402 may be formed using a metal film, and is preferably formed using chromium, chromium oxide, or the like.

In the case where the gray-tone mask 403 is irradiated with light for exposure, as illustrated in FIG. 8A2, light transmittance in a region overlapping with the light-blocking portion 401 is 0%, and light transmittance in a region where neither the light-blocking portion 401 nor the diffraction grating portion 402 is provided is 100%. Further, light transmittance at the diffraction grating portion 402 is approximately in the range of 10% to 70%, which can be adjusted by the interval of slits, dots, or mesh of the diffraction grating.

The half-tone mask 414 illustrated in FIG. 8B1 includes, on a light-transmitting substrate 411, a semi-light-transmitting portion 412 and a light-blocking portion 413 which are formed using a semi-light-transmitting layer and a light-blocking layer, respectively.

The semi-light-transmitting portion 412 can be formed using a layer of MoSiN, MoSi, MoSiO, MoSiON, CrSi, or the like. The light-blocking portion 413 may be formed using a metal film which is similar to that of the light-blocking layer of the gray-tone mask, and is preferably formed using chromium, chromium oxide, or the like.

In the case where the half-tone mask 414 is irradiated with light for exposure, as illustrated in FIG. 8B2, light transmittance in a region overlapping with the light-blocking portion 413 is 0%, and light transmittance in a region where neither the light-blocking portion 413 nor the semi-light-transmitting portion 412 is provided is 100%. Further, light transmittance at the semi-light-transmitting portion 412 is approximately in the range of 10% to 70%, which can be adjusted by the kind, thickness, or the like of a material to be used.

Since a multi-tone photomask can achieve three levels of exposure to obtain an exposed portion, a half-exposed portion, and an unexposed portion, a resist mask with regions of a plurality of thicknesses (typically, two kinds of thicknesses) can be formed by one-time exposure and development process. Thus, the number of photomasks used in the manufacturing process of the transistor 100 can be reduced by using the multi-tone mask.

A half-tone mask illustrated in FIG. 5B includes a semi-light-transmitting layer 301a and light-blocking layers 301b and 301c over a light-transmitting substrate 300. Thus, the resist mask is formed over the conductive film 118 so that the thickness of the resist mask that covers regions to be the source electrode 106a and the drain electrode 106b is large, and the thickness of the resist mask that covers a region to be the channel formation region is small (see FIG. 5B). The thickness of the resist mask that covers the region to be the channel formation region is determined in consideration of the channel length of the transistor 100.

Then, selective removal (etching) is performed on the second oxide semiconductor film 117 and the conductive film 118 using the resist mask 119. By the etching, an island-shaped third oxide semiconductor film 120 and a conductive film 121 processed to have a size smaller than the size of the conductive film 118 are formed. Note that the third oxide semiconductor film 120 corresponds to the oxide semiconductor film 105 illustrated in FIGS. 1A to 1C. Although the third oxide semiconductor film 120 differs in shape from the second oxide semiconductor film 117, the third oxide semiconductor film 120 is an oxide semiconductor film as well as the second oxide semiconductor film 117, in which the hydrogen concentration is sufficiently reduced and highly purified, and defect level in the energy gap due to oxygen deficiency is reduced by supply of sufficient oxygen. The third oxide semiconductor film 120 includes the channel formation region of the transistor 100 (see FIG. 6A).

Next, the resist mask 119 is reduced in size to form resist masks 122a and 122b which are separated at a portion over the channel formation region in the third oxide semiconductor film 120. The size of the resist mask 119 is reduced at least by the thickness of the resist mask over the channel formation region in the third oxide semiconductor film 120. In other words, the size of the resist mask 119 is reduced so that a region of the conductive film 121 with which the channel formation region in the third oxide semiconductor film 120 is overlapped is exposed. In order to reduce the size of the resist mask 119, ashing by oxygen plasma may be employed. The resist mask 119 is subjected to ashing to be separated over the gate electrode 103 of the transistor 100, thereby forming the resist masks 122a and 122b (see FIG. 6B).

Figure 7A:
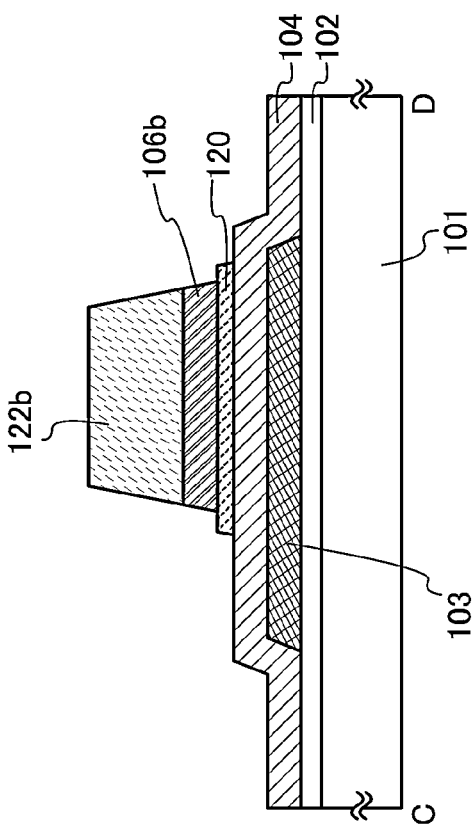
FIGS. 7A and 7B are cross-sectional views illustrating an example of a manufacturing method of a semiconductor device that is one embodiment of the present invention.

Next, the conductive film 121 is etched using the resist masks 122a and 122b to form the source electrode 106a and the drain electrode 106b (see FIG. 7A). After the etching, the resist masks 122a and 122b are removed. At this time, the third oxide semiconductor film 120 may be partly etched and have a depressed portion. Note that the source electrode 106a and the drain electrode 106b also serve as a source wiring and a drain wiring.

Since the resist masks 122a and 122b, which are obtained by reducing the size of the resist mask 119 so as to be separated at a portion over the channel formation region in the third oxide semiconductor film 120, are used for forming the source electrode 106a and the drain electrode 106b, the ends of the source electrode 106a and the drain electrode 106b are positioned inside the end of the third oxide semiconductor film 120 (see FIGS. 1A to 1C). The size of the resist masks 122a and 122b are small as compared with the resist mask 119 at least by the thickness of the resist mask over the channel formation region in the third oxide semiconductor film 120. Therefore, the ends of the source electrode 106a and the drain electrode 106b are positioned inside the end of the third oxide semiconductor film 120 to have at least a distance that corresponds to the thickness of the resist mask over the channel formation region in the third oxide semiconductor film 120 from the ends of the third oxide semiconductor film 120. Accordingly, the source electrode 106a and the drain electrode 106b are formed not to cover a step formed by the gate insulating film 104 and the third oxide semiconductor film 120, and to be in contact with the third oxide semiconductor film 120 only on a top surface of the third oxide semiconductor film 120.

Although described later, electrons that are carriers are easily generated at the ends of the third oxide semiconductor film 120 (the ends of the third oxide semiconductor film 120 easily has an n-type conductivity). Therefore, the thickness of the resist mask 119 and the amount of reduction in the resist mask 119 are preferably determined so that the end of the third oxide semiconductor film 120 are positioned outside the ends of the source electrode 106a and the drain electrode 106b to have a distance greater than or equal to 1 µm and less than or equal to 10 µm from the ends of the source electrode 106a and the drain electrode 106b. Thus, leakage current generated between the source electrode 106a and the drain electrode 106b through the side surfaces (or sidewalls) of the third oxide semiconductor film 120 can be reduced. It is necessary to consider that when the reduced amount of the resist mask 119 is large, the channel length of the transistor 100 is long, which can decrease on-state current and field effect mobility of the transistor 100.

Here, oxygen deficiency occurs in the third oxide semiconductor film 120 is described.

A side surface (or a sidewall) of the oxide semiconductor film processed into a desired shape, such as the island-shaped third oxide semiconductor film 120, is active. Note that "active" means an unstable bonding state with a dangling bond. This state is caused by the following phenomenon.

In processing an oxide semiconductor film into a desired shape, for example, in performing dry etching on the oxide semiconductor film under the conditions described later, when a side surface of the oxide semiconductor film is exposed to plasma including a chlorine radical, a fluorine radical, or the like, a metal atom exposed on the side surface of the oxide semiconductor film is bonded with the chlorine radical, the fluorine radical, or the like. At this time, the metal atom is bonded with a chlorine atom or a fluorine atom to be desorbed, so that an oxygen atom that has been bonded with the metal atom in the oxide semiconductor film is activated. The activated oxygen atom easily reacts to be desorbed. Therefore, oxygen deficiency easily occurs in the side surface of the oxide semiconductor film.

When the side surface of the oxide semiconductor film processed into a desired shape is active, oxygen is extracted in a reduced-pressure atmosphere or a reducing atmosphere, and oxygen deficiency occurs in the side surface of the oxide semiconductor film. The reduced-pressure atmosphere or the reducing atmosphere is a treatment atmosphere often used in manufacturing steps of a transistor, such as film formation, heat treatment, or dry etching. In particular, in an atmosphere subjected to heat treatment, oxygen deficiency easily occurs in the side surface of the oxide semiconductor film. Further, part of the oxygen deficiency becomes a donor and generates an electron which is a carrier, so that the side surface of the oxide semiconductor film has an n-type conductivity type.

The source electrode and the drain electrode of the transistor are in contact with the side surface of the oxide semiconductor film including the side surface having the n-type conductivity, so that leakage current is generated between the source electrode and the drain electrode through the side surface of the oxide semiconductor film. The leakage current increases the off-state current of the transistor. Further, by current flowing through the side surface of the oxide semiconductor film, there is a possibility that a transistor in which the side surface of the oxide semiconductor film is used as a channel region.

In the transistor 100, although the side surface of the island-shaped third oxide semiconductor film 120 is also active, the source electrode 106a and the drain electrode 106b are not in contact with the side surface of the third oxide semiconductor film 120 and are in contact with the third oxide semiconductor film 120 only on the top surface of the third oxide semiconductor film 120; therefore, the leakage current generated between the source electrode 106a and the drain electrode 106b through the side surface of the third oxide semiconductor film 120 can be reduced.

The etching of the second oxide semiconductor film 117, the conductive film 118, and the conductive film 121 may be performed by dry etching or wet etching, or a combination of dry etching and wet etching.

As an etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate reactive ion etching (RIE) method or an inductively coupled plasma (ICP) etching method can be used. In order to process the film into a desired shape, the etching conditions (e.g., the amount of electric power applied to a coil-shaped electrode, the amount of electric power applied to an electrode on the substrate side, and the temperature of the electrode on the substrate side) are adjusted as appropriate.

For example, conditions in the case where a tungsten film formed as the conductive film 118 is subjected to dry etching are as follows: 25 sccm of carbon tetrafluoride, 25 sccm of chlorine, and 10 sccm of oxygen are used for an etching gas; the pressure in a treatment chamber of a dry etching apparatus is 1.0 Pa; the electrode temperature is 70° C.; ICP power is 500 W; and bias power is 150 W.

Further, for example, conditions in the case where the second oxide semiconductor film 117 is subjected to dry etching are as follows: 60 sccm of boron chloride and 20 sccm of chlorine are used for an etching gas; the pressure in the treatment chamber of the dry etching apparatus is 1.9 Pa; the electrode temperature is 70° C.; ICP power is 450 W; and bias power is 100 W. Note that as for the dry etching of the second oxide semiconductor film 117, introduction of oxygen may be performed in addition to the above conditions. The oxygen deficiency generated in the dry etching can be reduced by the introduction of oxygen during the dry etching process.

Further, oxygen plasma ashing is performed to reduce the size of the resist mask 119 after the etching of the conductive film 118 and the second oxide semiconductor film 117, whereby fine processing of the conductive film 121 is possible; however, even when dry etching is performed on the conductive film 118, the resist mask 119 can be reduced in size. Accordingly, as for the etching of the second oxide semiconductor film 117 and the conductive film 118, the source electrode 106a and the drain electrode 106b may be formed in such a manner that, without oxygen plasma ashing, dry etching is performed on the conductive film 118 so that the size of the resist mask 119 is reduced and the conductive film 118 is etched.

When dry etching is performed on the second oxide semiconductor film 117, there is a possibility that part of the second oxide semiconductor film 117 which is removed during the dry etching adheres to the resist mask 119, and accordingly the second oxide semiconductor film 117 cannot be processed into a desired shape. In view of the above, as for the etching of the second oxide semiconductor film 117 and the conductive film 118, dry etching may be performed on the conductive film 118 to form the conductive film 121 and wet etching may be performed on the second oxide semiconductor film 117 to form the third oxide semiconductor film 120. By the wet etching of the second oxide semiconductor film 117 in this manner, the part of the second oxide semiconductor film 117 which is removed by the etching can be prevented from being attached to the resist mask 119, whereby the second oxide semiconductor film 117 can be processed into a desired shape.

As an etchant used for wet etching, a mixed solution of phosphoric acid, acetic acid, and nitric acid, an ammonia hydrogen peroxide mixture (31 wt % hydrogen peroxide water: 28 wt % ammonia water: water=5:2:2 (volume ratio)), or the like can be used. Alternatively, ITO07N (produced by KANTO CHEMICAL CO., INC.) may be used.

After the third oxide semiconductor film 120, the source electrode 106a, and the drain electrode 106b are formed, the resist masks 122a and 122b are removed. At this time, although a chemical solution (a resist stripper) may be used, the resist masks 122a and 122b may be removed by oxygen plasma ashing. The removal of the resist masks 122a and 122b is performed by oxygen plasma ashing, whereby contamination on the surface of the third oxide semiconductor film 120 due to the chemical solution can be prevented, and oxygen can be supplied to the third oxide semiconductor film 120 by the oxygen plasma.

Figure 22A:
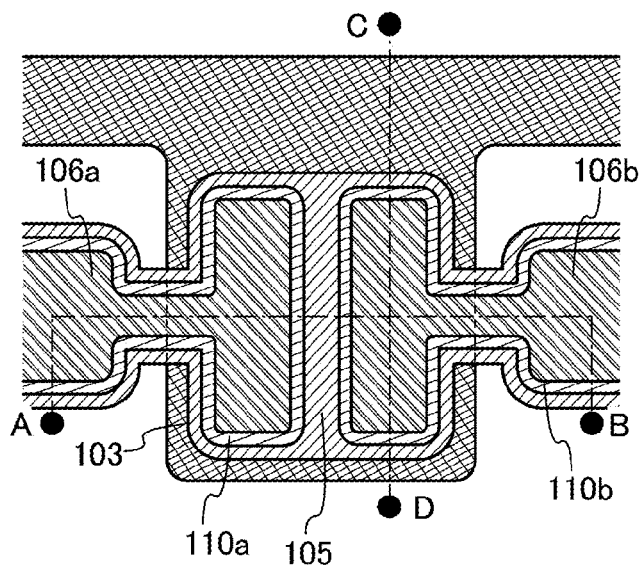
FIG. 22A is a top view and FIGS. 22B and 22C are cross-sectional views illustrating an example of a semiconductor device that is one embodiment of the present invention.
Figure 22B:
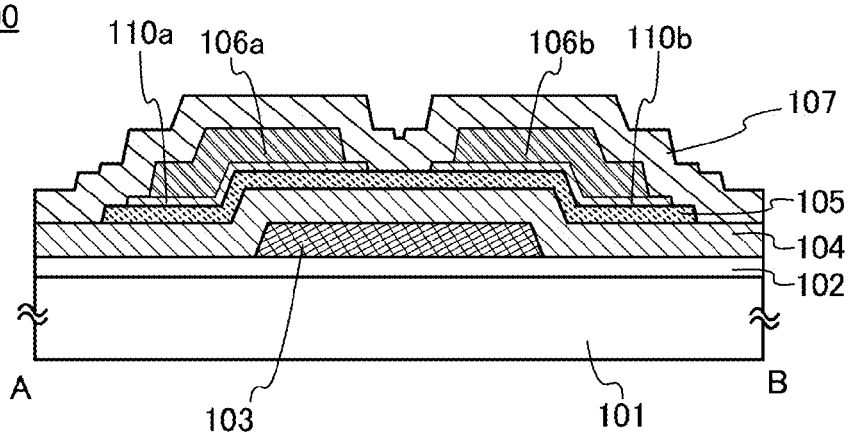
Figure 22C:
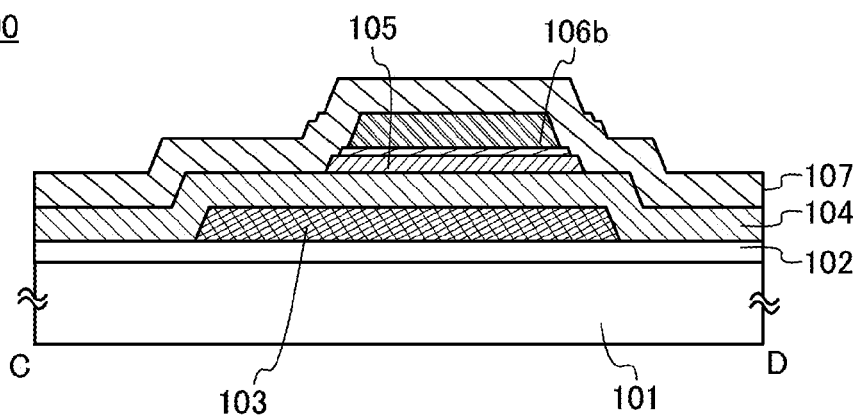

Further, conductive films 110a and 110b having resistivity higher than the source electrode 106a and the drain electrode 106b and lower than the oxide semiconductor film 105 may be provided between the oxide semiconductor film 105 (the third oxide semiconductor film 120 in FIGS. 6A and 6B and FIGS. 7A and 7B) and the source electrode 106a and the drain electrode 106b (see FIGS. 22A to 22C). Note that in this specification, the conductive films 110a and 110b are called low-resistance films 110a and 110b. For the low-resistance films 110a and 110b, a conductive metal oxide film such as indium oxide ($In_2O_3$), tin oxide ($SnO_2$), zinc oxide (ZnO), indium tin oxide ($In_2O_3$—$SnO_2$, abbreviated to ITO), or indium zinc oxide ($In_2O_3$—ZnO) can be used. Alternatively, for the low-resistance films 110a and 110b, indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or metal nitride (e.g., InN or ZnN) may be used. Further alternatively, for the low-resistance films 110a and 110b, a material including one to ten graphene sheets may be used. The low-resistance films 110a and 110b are provided between the source electrode 106a and the drain electrode 106b and the oxide semiconductor film 105 in this manner, the contact resistance between the source electrode 106a and the drain electrode 106b and the oxide semiconductor film 105 can be reduced.

In order to provide the low-resistance films 110a and 110b between the source electrode 106a and the drain electrode 106b and the oxide semiconductor film 105, the second oxide semiconductor film 117 is formed, and the above-described conductive metal oxide film or a film of the material including one to ten graphene sheets is formed, and then the conductive film 118 to be the source electrode 106a and the drain electrode 106b is formed thereover. Next, the resist mask 119 including regions whose thicknesses are different is formed. At this time, the resist mask 119 is formed to satisfy the following three conditions.

(1) The resist mask 119 has the largest thickness in portions that cover the regions of the conductive film 118 to be the source electrode 106a and the drain electrode 106b.
(2) The resist mask 119 has the smallest thickness in a portion that covers the channel formation region of the transistor.
(3) The resist mask 119 has a thickness smaller than the thickness of (1) and larger than the thickness of (2) in a portion that covers a region to be the low-resistance film.

After that, the etching and the treatment for reducing the size of the resist mask 119 including regions whose thicknesses are different, which are described above, are repeated, whereby the low-resistance films 110a and 110b can be formed between the source electrode 106a and the drain electrode 106b and the oxide semiconductor film 105. Note that the low-resistance films 110a and 110b are formed so that the ends of the low-resistance films 110a and 110b are positioned inside the end of the oxide semiconductor film 105 and the source electrode 106a and the drain electrode 106b are formed so that the ends of the source electrode 106a and the drain electrode 106b are positioned inside the ends of the low-resistance films 110a and 110b, respectively.

The thickness of the resist mask 119 and the amount of reduction in the resist mask 119 are preferably determined so that the end of the oxide semiconductor film 105 are positioned outside the ends of the low-resistance films 110a and 110b and the ends of the source electrode 106a and the drain electrode 106b to have a distance greater than or equal to 1 μm and less than or equal to 10 μm from the ends of the low-resistance films 110a and 110b the ends of the source electrode 106a and the drain electrode 106b.

Figure 7B:
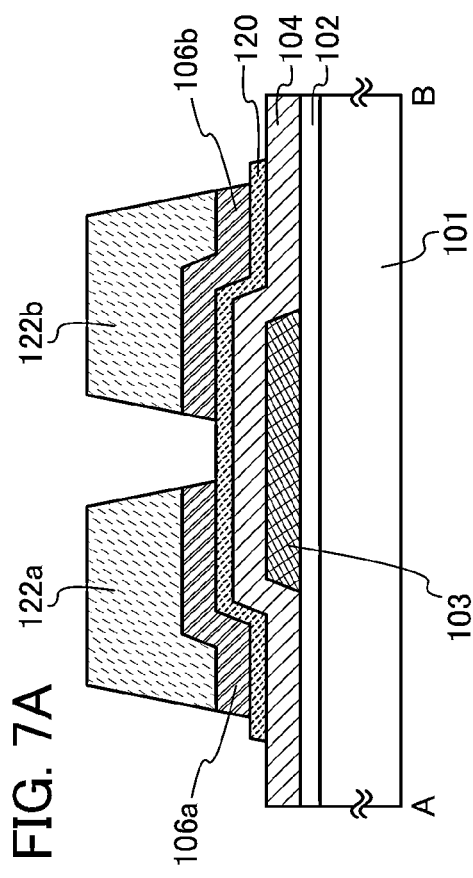

Just after the formation of the source electrode 106a and the drain electrode 106b, the protective insulating film 107 is formed over the gate insulating film 104, the third oxide semiconductor film 120, and the source electrode 106a and the drain electrode 106b (see FIG. 7B).

The protective insulating film 107 can be formed in a manner similar to that of the gate insulating film 104. The protective insulating film 107 is formed using a material selected from the materials that can be used for the gate insulating film 104 as appropriate to have a single layer structure or a stacked structure. Preferably, a region in the protective insulating film 107 which is in contact with the third oxide semiconductor film 120 is an insulating film containing oxygen or an insulating film from which oxygen is released by heating. Like the gate insulating film 104, the thickness of the protective insulating film 107 may be greater than or equal to 1 nm and less than or equal to 300 nm, preferably greater than or equal to 5 nm and less than or equal to 50 nm.

By second heat treatment performed after the formation of the protective insulating film 107, part of oxygen contained in the protective insulating film 107 is released, so that oxygen is diffused into the third oxide semiconductor film 120 and in the vicinity of an interface between the protective insulating film 107 and the third oxide semiconductor film 120. In particular, oxygen deficiency generated in the side surface of the third oxide semiconductor film 120 can be compensated, which leads to favorable electric characteristics of the transistor 100.

Note that a heating method and a heating apparatus may be decided as appropriate with reference to the description of the first heat treatment, as long as the second heat treatment can cause part of oxygen contained in the protective insulating film 107 to be released. The second heat treatment may be performed at a temperature higher than or equal to 150° C. and lower than or equal to 450° C., preferably higher than or equal to 250° C. and lower than or equal to 325° C. Alternatively, the second heat treatment may be performed while the temperature is increased gradually from 250° C. to 325° C.

If necessary, part of the gate insulating film 104 and part of the protective insulating film 107 are removed to expose part of the gate wiring, part of the source wiring, and part of the drain wiring.

Through the above steps, the transistor 100 can be manufactured. Noth that, in the transistor 100, the transistor 100 may function as a dual-gate type transistor by providing an electrode over a region in the protective insulating film 107 overlapping with the channel formation region in the oxide semiconductor layer 105.

Here, different points of a manufacturing method of the transistor 310 from the manufacturing method of the transistor 100 are described.

First, the components up to and including the first oxide semiconductor film 115 are formed as in the manufacturing method of the transistor 100. Next, an insulating film to be the channel protective film 108 is formed over the first oxide semiconductor film 115 to a thickness greater than or equal to 10 nm and less than or equal to 500 nm, preferably greater than or equal to 20 nm and less than or equal to 300 nm The insulating film to be the channel protective film 108 can be formed using a film selected from films given in the explanation of the gate insulating film 104 as appropriate by the above-mentioned method. Note that the channel protective film is finally in contact with the oxide semiconductor film 105; therefore, an insulating film containing oxygen or an insulating film from which oxygen is released by heating is preferably used as the channel protective film. Here, a 200-nm-thick silicon oxide film is formed by a sputtering method.

Then, the first heat treatment is performed so that the second oxide semiconductor film 117 is formed. When the first heat treatment is performed in a state where the first oxide semiconductor film 115 is sandwiched between the gate insulating film 104 and the insulating film to be the channel protective film 108, oxygen is supplied to the first oxide semiconductor film 115 from the gate insulating film 104 and the insulating film to be the channel protective film 108, so that an effect of compensating oxygen deficiency generated in the first oxide semiconductor film 115 can be enhanced.

It is preferable that the gate insulating film 104, the first oxide semiconductor film 115, and the insulating film to be the channel protective film 108 are formed successively without exposure to the atmosphere. The successive formation without exposure to the atmosphere makes it possible that impurities including hydrogen and an atmospheric component are prevented from being attached to the interface between the gate insulating film 104 and the first oxide semiconductor film 115, and the interface between the insulating film to be the channel protective film 108 and the first oxide semiconductor film 115; thus, reliability of the transistor manufactured can be improved.

Next, a resist mask is formed over the insulating film to be the channel protective film 108 by a printing method, a photolithography method, an inkjet method, or the like and the insulating film is selectively removed (etched) to form the channel protective film 108.

Then, the resist mask is removed and the conductive film 118 to be the source electrode 106a and the drain electrode 106b is formed over the second oxide semiconductor film 117. The following steps can be performed in a manner similar to those in the manufacturing process of the transistor 100.

Through the above steps, the transistor 310 can be manufactured. Noth that, in the transistor 310, the transistor 310 may function as a dual-gate type transistor by providing an electrode over a region in the protective insulating film 107 overlapping with the channel formation region in the oxide semiconductor layer 105.

As described above, according to the manufacturing method of a transistor which is one embodiment of the present invention, a semiconductor device whose electric characteristics are favorable and less likely to change can be manufactured.

Note that this embodiment mode can be implemented in combination with any of the structures described in the other embodiment modes, as appropriate.

(Embodiment Mode 2)

In this embodiment mode, a mode in which the oxide semiconductor film 105 in each of the transistor 100, the transistor 200, and the transistor 310 in Embodiment Mode 1 is an oxide semiconductor film including a crystalline region is described. The mode can be obtained by a manufacturing process partly different from the manufacturing process described in Embodiment Mode 1. Note that the same reference numerals are used for the same parts as those in Embodiment Mode 1, and specific description of the parts with the same reference numerals is omitted here.

The oxide semiconductor film including a crystalline region described in this embodiment is non-single-crystal. Specifically, oxide semiconductor film includes a crystalline region having a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction. Note that in this specification, the crystalline region is called c-axis-aligned crystal, and an oxide semiconductor including the c-axis-aligned crystal is called a c-axis aligned crystalline oxide semiconductor (CAAC oxide semiconductor, CAAC-OS). The CAAC oxide semiconductor film is used as the oxide semiconductor film 105 including the channel formation region, whereby shift of threshold voltage between before and after irradiation of light, e.g., visible light or ultraviolet light or between before and after a BT (gate bias-temperature) stress test, can be suppressed, which leads to improvement in reliability of the transistor.

The CAAC oxide semiconductor is not single crystal, but this does not mean that the CAAC oxide semiconductor is composed of only an amorphous component. Although the CAAC oxide semiconductor includes a crystallized portion (a crystalline portion), a boundary between one crystalline portion and another crystalline portion is not clear in some cases. Further, nitrogen may be substituted for part of oxygen included in the CAAC oxide semiconductor. The c-axes of individual crystalline portions included in the CAAC oxide semiconductor may be aligned in one direction (e.g., a direction perpendicular to a surface of a substrate over which the CAAC oxide semiconductor is formed, a surface of the CAAC oxide semiconductor, or the like). Alternatively, the normals of the a-b planes of the individual crystalline portions included in the CAAC oxide semiconductor may be aligned in one direction (e.g., a direction perpendicular to a surface of a substrate over which the CAAC oxide semiconductor is formed, a surface of the CAAC oxide semiconductor, or the like). Note that the CAAC oxide semiconductor can be a conductor, or an insulator, depending on the composition or the like. Further, the CAAC oxide semiconductor transmits or does not transmit visible light, depending on the composition or the like. As an example of the CAAC oxide semiconductor, a material is given in which triangular or hexagonal atomic arrangement can be observed from the direction perpendicular to a surface of the deposited material, a surface of a substrate over which the material is deposited, or an interface of the material and in which layered arrangement of metal atoms or layered arrangement of metal atoms and oxygen atoms (or nitrogen atoms) can be observed in a cross section of the deposited material. Note that, in the amorphous oxide semiconductor, the number oxygen atoms coordinated to a metal atom may vary according to the kind of an adjacent metal. In contrast, in the CAAC oxide semiconductor, the number of oxygen atoms coordinated to metal atom is substantially same.

There are two manufacturing methods of the CAAC oxide semiconductor film.

One of the methods is that formation of an oxide semiconductor film is performed once while the substrate is heated. The other of the methods is that the formation of the oxide semiconductor film is divided into twice, and heat treatment is performed after each formation of the oxide semiconductor film.

A manufacturing method of the transistor 100 in which the CAAC oxide semiconductor film is formed by forming an oxide semiconductor film while the substrate is heated is described first.

First, the base insulating film 102 is formed over the substrate 101, and then the gate electrode 103 is formed over the base insulating film 102, as in Embodiment Mode 1.

Next, the gate insulating film 104 is formed over the gate electrode 103. The gate insulating film 104 may be formed as in Embodiment Mode 1.

Then, the metal oxide described in Embodiment Mode 1 is deposited to serve as the first oxide semiconductor film 115 over the gate insulating film 104 while the substrate 101 provided with the base insulating film 102, the gate electrode 103, and the gate insulating film 104 is heated. Here, sputtering is employed as in Embodiment Mode 1. The heating temperature of the substrate 101 is higher than or equal to 150° C. and lower than or equal to 450° C., and preferably the substrate temperature is higher than or equal to 200° C. and lower than or equal to 350° C. Note that the heating temperature of the substrate during the formation of the first oxide semiconductor film 115 is set high, so that the first oxide semiconductor film 115 in which the ratio of a crystalline region to an amorphous region is high can be provided. The thickness of the first oxide semiconductor film 115 may be greater than or equal to 1 nm and less than or equal to 50 nm.

Next, the first oxide semiconductor film 115 formed by the above method is subjected to the first heat treatment described in Embodiment Mode 1. By the first heat treatment, hydrogen (including water, a hydroxyl group, and hydride) can be released from the first oxide semiconductor film 115, and part of oxygen contained in the gate insulating film 104 can be released, so that oxygen can be diffused into the first oxide semiconductor film 115 and in the vicinity of an interface between the gate insulating film 104 and the first oxide semiconductor film 115.

The subsequent steps may be performed in a manner similar to the manufacturing steps described in Embodiment Mode 1.

Next, a manufacturing method of the transistor 100 in which formation of the oxide semiconductor film is divided into twice, and heat treatment is performed after each formation of the oxide semiconductor film so that the CAAC oxide semiconductor film is formed is described.

While the temperature of the substrate 101 is kept at a temperature 200° C. or higher and 400° C. or lower, an oxide semiconductor film as a first layer is formed over the gate insulating film 104, and then heat treatment is performed at a temperature 200° C. or higher and 450° C. or lower under an atmosphere of nitrogen, oxygen, a rare gas, or dry air. By the heat treatment, a crystalline region is formed in a region including a top surface of the oxide semiconductor film as the first layer. Next, an oxide semiconductor film as a second layer is formed thicker than the oxide semiconductor film as the first layer. After that, heat treatment is performed again at a temperature 200° C. or higher and 450° C. or lower, whereby the crystal growth proceeds upward using the oxide semiconductor film as the first layer including the crystalline region in the region including the top surface as a seed of crystal growth; thus, the entire oxide semiconductor film as the second layer is crystallized. Note that for the oxide semiconductor film as the first layer and the oxide semiconductor film as the second layer, the metal oxide described in Embodiment Mode 1 can be used. The thickness of the oxide semiconductor film as the first layer is preferably greater than or equal to 1 nm and less than or equal to 10 nm For example, the oxide semiconductor film as the first layer is formed under the following conditions: a metal oxide target (In—Ga—Zn-based metal oxide target ($In_2O_3$: $Ga_2O_3$:ZnO=1:1:2 [molar ratio])) is used; the distance between the substrate and the target is 170 mm; the substrate temperature is 250° C.; the pressure is 0.4 Pa; the direct current (DC) power supply is 0.5 kW; a sputtering gas is oxygen only, argon only, or argon and oxygen; and the thickness is 5 nm, and the oxide semiconductor film as the second layer is formed under the following conditions: a metal oxide target (In—Ga—Zn-based metal oxide target ($In_2O_3$: $Ga_2O_3$: ZnO=1:1:2 [molar ratio])) is used; the distance between the substrate and the target is 170 mm; the substrate temperature is 400° C.; the pressure is 0.4 Pa; the direct current (DC) power supply is 0.5 kW; a sputtering gas is oxygen only, argon only, or argon and oxygen; and the thickness is 25 nm. A heat treatment device used for the heat treatment in this method may be any of the heat treatment devices used for the first heat treatment described in Embodiment Mode 1.

As described in Embodiment Mode 1, the gate insulating film 104 and the first oxide semiconductor film 115 may be successively formed in vacuum.

By the heat treatment performed after the formation of the oxide semiconductor film as the second layer, hydrogen (including water, a hydroxyl group, or hydride) is released from the oxide semiconductor film as the first layer including the crystalline region in the region including the top surface and the oxide semiconductor film as the second layer, and oxygen is supplied from the gate insulating film 104 so that oxygen deficiency in the oxide semiconductor film as the first layer including the crystalline region in the region including the top surface and the oxide semiconductor film as the second layer can be reduced.

Accordingly, in the method in which the formation of the oxide semiconductor film is divided into twice, and heat treatment is performed after each formation of the oxide semiconductor film so that the CAAC oxide semiconductor film is formed, the first heat treatment described in Embodiment Mode 1 may be omitted, or after the formation of the CAAC oxide semiconductor film, the first heat treatment may be performed in a manner similar to that in Embodiment Mode 1 so that oxygen is supplied from the gate insulating film 104.

The subsequent steps may be performed in a manner similar to the manufacturing steps described in Embodiment Mode 1.

Note that this embodiment mode can be implemented in combination with any of the structures described in the other embodiment modes, as appropriate.

(Embodiment Mode 3)

Figure 25:
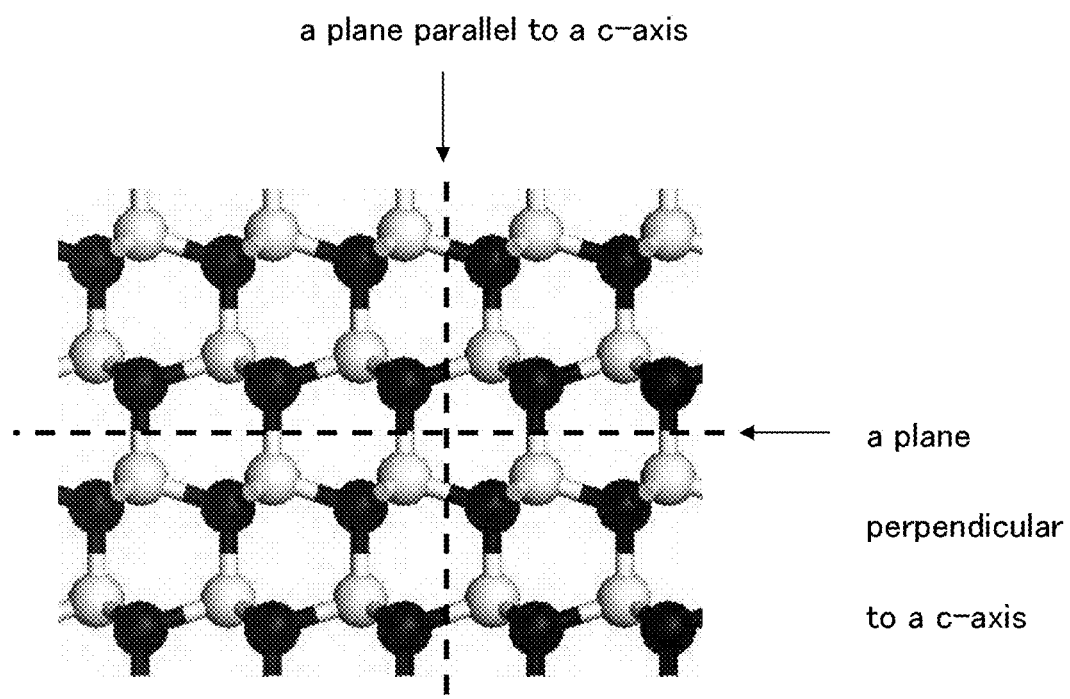
FIG. 25 is a diagram illustrating a crystal structure used for calculation of an oxide semiconductor film included in a semiconductor device that is one embodiment of the present invention.

In this embodiment mode, verification results on how easily oxygen deficiency is produced at a top surface and a side surface of an oxide semiconductor film included in a transistor manufactured according to any of the manufacturing methods described in Embodiment Modes 1 and 2, obtained through calculation using the following models, are described. Note that the CAAC oxide semiconductor described in Embodiment Mode 2 is complicated to be used as a model of calculation due to having a plurality of crystal planes on one side surface. Therefore, calculation is conducted here using a ZnO single crystal that has a wurtzite structure having c-axis alignment. As crystal models, the (001) plane, the (100) plane, and the (110) plane obtained by cutting the crystal structure along planes parallel to the c-axis and a plane perpendicular to the c-axis as shown in FIG. 25 are used.

The calculation results in this embodiment mode are obtained in the following manner: after making the surface structures, calculation of the cases in which oxygen is released from the (100) plane, the (110) plane, and the (001) plane as shown in FIGS. 26A to 26C is conducted, and the easiness of release is compared between the surface structures.

First, a model is made by cutting the crystal structure to have the (001) plane on the surface. Since the calculation is conducted using a three-dimensional periodic structure, the model is a slab model having two (001) planes and having a vacuum region of 1 nm Similarly, a slab model having the (100) plane on the surface and a slab model having the (110) plane on the surface are made as examples of the side surface because the side surface is assumed to be perpendicular to the (001) plane. By calculating these two planes, a tendency to release oxygen from planes perpendicular to the (001) plane can be analyzed. In this case also, the vacuum region is 1 nm The number of atoms in the (100) plane model, the (110) plane model, and the (001) plane model are set to be 64, 108, and 108, respectively. Further, structures which are obtained by removing one oxygen atom from the respective surfaces of the above three structures are made.

For the calculation, CASTEP, which is a program using the density functional theory, is used. A plane wave basis pseudopotential method was used as a method for the density functional theory, and GGA-PBE is used for a functional. First, in a four-atom unit cell of a wurtzite structure, the structure including a lattice constant is optimized. Next, based on the optimized structure, the surface structure is made. Then, the surface structure with oxygen deficiency and the surface structure without oxygen deficiency are subjected to structure optimization with a lattice constant fixed. Energy after the structure optimization is used.

The cut-off energy is assumed to be 380 eV in unit cell calculation and 300 eV in surface structure calculation. The k-points were 9×9×6 in the unit cell calculation, 3×2×1 in the (100) plane model calculation, 1×2×2 in the (110) plane model calculation, and 2×2×1 in the (001) plane model calculation.

The following calculation was performed on the above surface structures to obtain an energy difference (here, referred to as a bound energy): the energy of the structure with oxygen deficiency and half the energy of an oxygen molecule are added, and the energy of the structure without oxygen deficiency is subtracted therefrom. From the result, oxygen is more likely to be released on the surface having a lower bound energy.

(Bound energy)=(Energy of the structure with oxygen deficiency)+(Half the energy of an oxygen molecule)−(Energy of the structure without oxygen deficiency) [FORMULA 2]

Bound energies of the respective surfaces obtained according to Formula 2 are shown in Table 1.

TABLE 1

| | Bound energy |
|---|---|
| (100) plane model | 2.89 |
| (110) plane model | 2.64 |
| (001) plane model | 3.38 |

From the results in Table 1, it can be said that bound energies of the (100) plane and the (110) plane are lower than that of the (001) plane and oxygen is more likely to be released from the (100) plane and the (110) plane than from the (001) plane. In other words, it can be found that oxygen is more likely to be released from the side surface than the top surface of the ZnO film having c-axis alignment in a direction perpendicular to the top surface. Although ZnO which is an example of CAAC oxide semiconductors has mixed various crystal planes, it has the same kind of planes as a ZnO single crystal on its side surface. Therefore, it can be said that a tendency to release oxygen of the ZnO that is a CAAC oxide semiconductor is similar to that of the ZnO single crystal.

Note that this embodiment mode can be implemented in combination with any of the structures described in the other embodiment modes, as appropriate.

(Embodiment Mode 4)

Figure 9A:
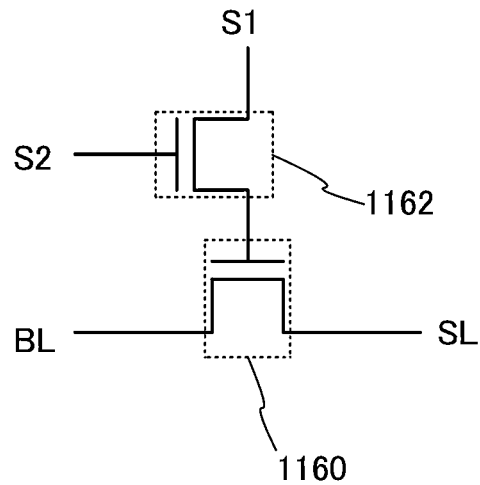
FIGS. 9A and 9B are circuit diagrams illustrating an example of one embodiment of the present invention.

An example of a circuit diagram of a memory element (hereinafter also referred to as a memory cell) included in a semiconductor device is illustrated in FIG. 9A. The memory cell includes a transistor 1160 in which a channel formation region is formed using a material other than an oxide semiconductor (e.g., silicon, germanium, silicon carbide, gallium arsenide, gallium nitride, or an organic compound) and a transistor 1162 in which a channel formation region is formed using an oxide semiconductor.

The transistor 1162 in which the channel formation region is formed using an oxide semiconductor can be manufactured in accordance with Embodiment Modes 1 and 2.

As illustrated in FIG. 9A, a gate electrode of the transistor 1160 is electrically connected to one of a source electrode and a drain electrode of the transistor 1162. A first wiring SL (a 1st Line, also referred to as a source line) is electrically connected to a source electrode of the transistor 1160. A second wiring BL (a 2nd Line, also referred to as a bit line) is electrically connected to a drain electrode of the transistor 1160. A third wiring S1 (a 3rd Line, also referred to as a first signal line) is electrically connected to the other of the source electrode and the drain electrode of the transistor 1162. A fourth wiring S2 (a 4th Line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its extremely small off-state current. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data is described. First, a potential of the fourth wiring S2 is set to a potential at which the transistor 1162 is turned on, so that the transistor 1162 is turned on. Thus, a potential of the third wiring S1 is supplied to the gate electrode of the transistor 1160 (writing). After that, the potential of the fourth wiring S2 is set to a potential at which the transistor 1162 is turned off, so that the transistor 1162 is turned off, and thus, the potential of the gate electrode of the transistor 1160 is held (holding).

Since the off-state current of the transistor 1162 is extremely small, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Then, reading of data is described. When a predetermined potential (a low potential) is supplied to the first wiring SL in a state where the on state or the off state of the transistor 1160 is held as described above, a potential of the second wiring BL varies depending on the on state or the off state of the transistor 1160. For example, when the transistor 1160 is in the on state, the potential of the second wiring BL becomes closer to the potential of the first wiring SL. On the other hand, when the transistor 1160 is in the off state, the potential of the second wiring BL is not changed.

In such a manner, the potential of the second wiring BL and the predetermined potential are compared with each other in a state where data is held, whereby the data can be read out.

Then, rewriting of data is described. Rewriting of data is performed in a manner similar to that of the writing and holding of data. That is, a potential of the fourth wiring S2 is set to a potential at which the transistor 1162 is turned on, so that the transistor 1162 is turned on. Thus, a potential of the third wiring S1 (a potential for new data) is supplied to the gate electrode of the transistor 1160. After that, the potential of the fourth wiring S2 is set to a potential at which the transistor 1162 is turned off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that decrease in operation speed because of erasing operation can be suppressed. In other words, high-speed operation of the semiconductor device including the memory cell can be realized.

Figure 9B:
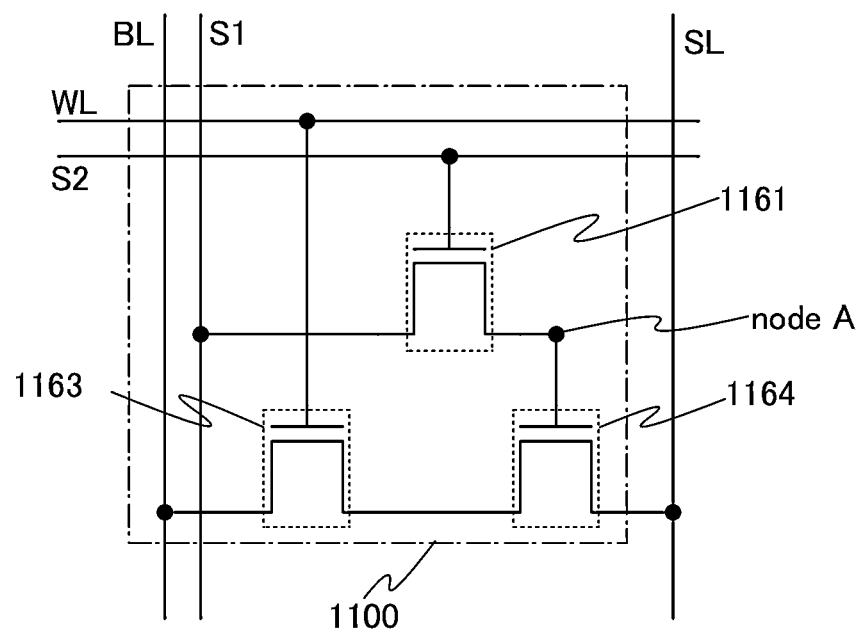

FIG. 9B is a circuit diagram illustrating an application example of the memory cell illustrated in FIG. 9A.

A memory cell 1100 illustrated in FIG. 9B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, a specific example of operation of the circuit is described. Note that a numerical value of potential, voltage, or the like in the following description may be changed as appropriate.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that, to finish writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of data "1" and set to approximately 0 V after the writing of data "0". Electric charge corresponding to a potential of the third wiring S1 is accumulated at the node A; since the off-state current of the transistor 1161 is extremely small, the potential of the gate electrode of the transistor 1164 is held for a long time.

When data is read from the memory cell, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1163 is in an on state and the transistor 1161 is in an off state.

The transistor 1164 is in an off state when data "0" has been written, that is, the node A is set to approximately 0 V, so that the resistance between the second wiring BL and the first wiring SL is high. On the other hand, the transistor 1164 is in an on state when data "1" has been written, that is, the node A is set to approximately 2 V, so that the resistance between the second wiring BL and the first wiring SL is low. The reading circuit can read data "0" or data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

In this embodiment mode, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 9A or FIG. 9B and can be changed as appropriate.

Figure 10:
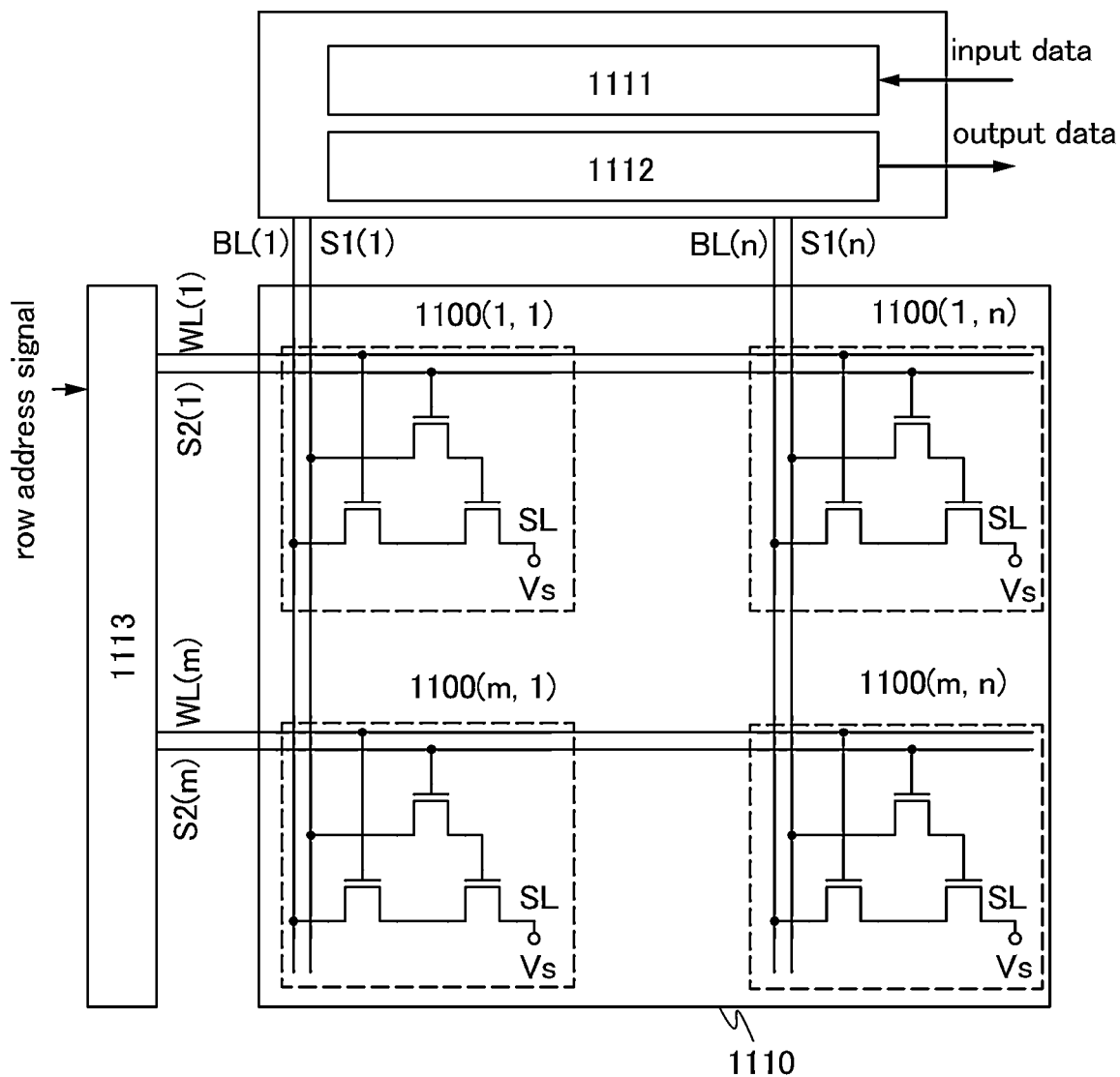
FIG. 10 is a circuit diagram illustrating an example of one embodiment of the present invention.

FIG. 10 is a block circuit diagram of a semiconductor device according to one embodiment of the present invention. The semiconductor device has m×n bits of memory capacity.

The semiconductor device illustrated in FIG. 10 includes m fourth wirings S2(1) to S2(*m*), m fifth wirings WL(1) to WL(m), n second wirings BL(1) to BL(n), n third wirings S1(1) to S1(*n*), a plurality of memory cells 1100(1,1) to 1100(*m,n*) arranged in a matrix of m rows by n columns (m and n are each a natural number), and peripheral circuits such as a driver circuit 1111 which is connected to the second wirings BL and the third wirings S1, a driver circuit 1113 which is connected to the fourth wirings S2 and the fifth wirings WL, and a reading circuit 1112. A refresh circuit or the like may be provided as another peripheral circuit.

A memory cell 1100(*i,j*) is considered as a typical example of the memory cell. Here, the memory cell 1100(*i,j*) (i is an integer greater than or equal to 1 and less than or equal to m and j is an integer greater than or equal to 1 and less than or equal to n) is connected to a second wiring BL(j), a third wiring S1(*j*), a fourth wiring S2(*i*), a fifth wiring WL(i), and a first wiring SL. A potential Vs of the first wiring SL is supplied to the first wiring SL. The second wirings BL(1) to BL(n) and the third wirings S1(1) to S1(*n*) are connected to the driver circuit 1111 and the reading circuit 1112. The fifth wirings WL(1) to WL(m) and the fourth wirings S2(1) to S2(*m*) are connected to the driver circuit 1113.

The operation of the semiconductor device illustrated in FIG. 10 is described. In this structure, data is written and read per row.

When data is written into memory cells 1100(*i*,1) to 1100(*i,n*) of an i-th row, the potential Vs of the first wiring SL is set to 0 V, the fifth wiring WL(i) is set to 0 V, the second wirings BL(1) to BL(n) are set to 0 V, and the fourth wiring S2(*i*) is set to 2 V. At this time, the transistors 1161 are turned on. Among the third wirings S1(1) to S1(*n*), the third wiring in a column in which data "1" is to be written is set to 2 V and the third wiring in a column in which data "0" is to be written is set to 0 V. Note that, to finish writing, the fourth wiring S2(*i*) is set to 0 V before the potentials of the third wirings S1(1) to S1(*n*) are changed, so that the transistors 1161 are turned off. Moreover, fifth wirings WL other than the fifth wiring WL(i) and fourth wirings S2 other than the fourth wiring S2(*i*) are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100(*i*,1) to 1100(*i,n*) of the i-th row, the potential Vs of the first wiring SL is set to 0 V, the fifth wiring WL(i) is set to 2 V, the fourth wiring S2(*i*) is set to 0 V, the third wirings S1(1) to S1(*n*) are set to 0 V, and the reading circuit connected to the second wirings BL(1) to BL(n) is set in an operation state. The reading circuit can read data "0" or data "1" in accordance with the difference in resistance state of the memory cell, for example. Note that the fifth wirings WL other than the fifth wiring WL(i) and the fourth wirings S2 other than the fourth wiring 52(*i*) are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

In accordance with this embodiment mode, a potential of a node connected to a transistor in which a channel region is formed using an oxide semiconductor can be held for a very long time, whereby a memory element capable of writing, holding, and reading of data with low power consumption can be manufactured.

Note that the structures, methods, and the like described in this embodiment mode can be combined with those of any of the other embodiment modes as appropriate.

(Embodiment Mode 5)

Figure 11A:
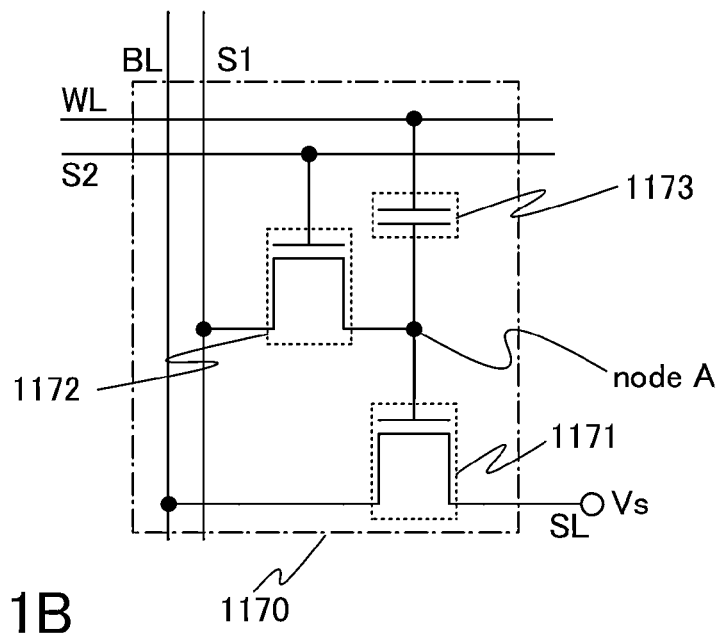
FIGS. 11A and 11B are circuit diagrams illustrating an example of one embodiment of the present invention.

In this embodiment mode, an example of a circuit diagram of a memory cell including a capacitor is shown. A memory cell 1170 illustrated in FIG. 11A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

The transistor 1172 in which the channel formation region is formed using an oxide semiconductor can be manufactured in accordance with Embodiment modes 1 and 2.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, a specific example of operation of the circuit is described. Note that a numerical value of potential, voltage, or the like in the following description may be changed as appropriate.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V is described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of the reading is set to 0 V; however, it may be in a floating state or may be charged to have a potential higher than 0 V. Data "1" and data "0" are defined for convenience and can be reversed.

The potential of the third wiring S1 at the time of writing may be selected from the potentials of data "0" and data "1" as long as the transistor 1172 is turned off after the writing and the transistor 1171 is in an off state in the case where the potential of the fifth wiring WL is set to 0 V. The potential of the fifth wiring WL at the time of reading is set so that the transistor 1171 is turned off in the case of data "0" and turned on in the case of data "1". Furthermore, the threshold voltage of the transistor 1171 is an example. The transistor 1171 can have any threshold voltage as long as the transistor 1171 can operate in the above-described manner.

An example of a NOR-type semiconductor memory device in which a memory cell including a capacitor and a selection transistor having a first gate electrode and a second gate electrode is used is described with reference to FIG. 11B. Note that the dual-gate transistor as described in Embodiment Mode 1 can be given as an example since an example of the selection transistor includes the first gate electrode and the second gate electrode.

Figure 11B:
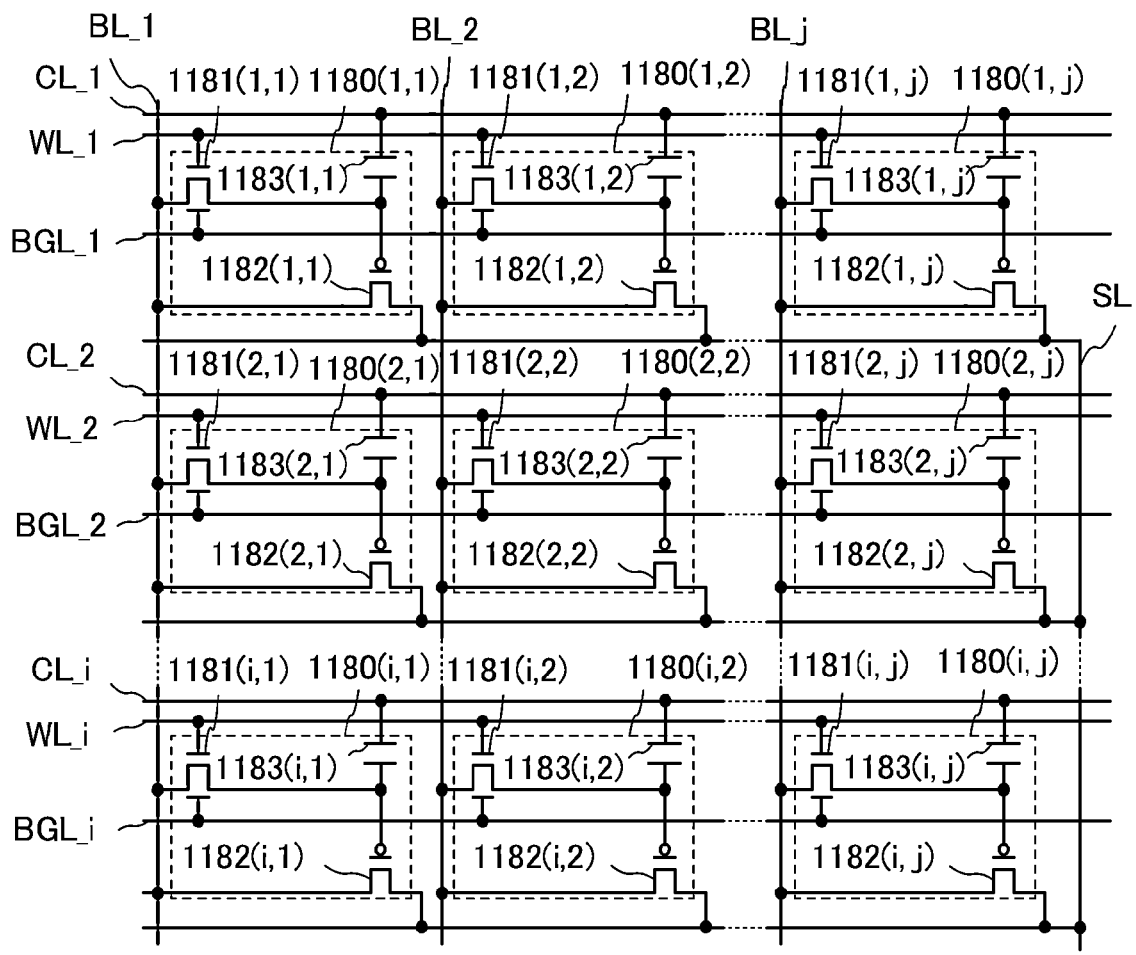

A memory cell array illustrated in FIG. 11B includes a plurality of memory cells 1180 arranged in a matrix of i rows (i is a natural number of 3 or more) by j columns (j is a natural number of 3 or more), i word lines WL (word lines WL_1 to WL_i), i capacitor lines CL (capacitor lines CL_1 to CL_i, i gate lines BGL (gate lines BGL_1 to BGL_i), j bit lines BL (bit lines BL_1 to BL_j), and a source line SL. Here, and j are each a natural number of 3 or more for convenience, the number of rows and the number of columns of the memory cell array in this embodiment are not limited to 3 or more. The memory cell array may include memory cells in one row by one column or may include memory cells in two rows by two columns.

Further, each of the plurality of memory cells 1180 (also referred to as a memory cell 1180(M,N) (note that N is a natural number greater than or equal to 1 and less than or equal to j and that M is a natural number greater than or equal to 1 and less than or equal to i)) includes a transistor 1181(M, N), a capacitor 1183(M,N), and a transistor 1182(M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor, which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to a bit line BL_N. The first gate electrode of the transistor 1181(M,N) is connected to a word line WL_M. The second gate electrode of the transistor 1181(M,N) is connected to a gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to a capacitor line CL_M. A second capacitor electrode of the capacitor 1183(M,N) is connected to the other of the source electrode and the drain electrode of the transistor 1181(M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The voltages of the gate lines BGL_1 to BGL_i are controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be made extremely small. Thus, a data retention period in the memory circuit can be made longer. In addition, voltage necessary for writing and reading data can be made lower than that of a conventional semiconductor device; thus, power consumption can be reduced.

In accordance with this embodiment, a potential of a node connected to a transistor in which a channel region is formed using an oxide semiconductor can be held for a very long time, whereby a memory element capable writing, holding, and reading of data with low power consumption can be manufactured.

Note that this embodiment mode can be implemented in combination with any of the structures described in the other embodiment modes, as appropriate.

(Embodiment Mode 6)

In this embodiment mode, an example of a semiconductor device using the transistor manufactured according to any of the manufacturing methods described in Embodiment Modes 1 and 2 is described with reference to FIGS. 12A and 12B.

Figure 12A:
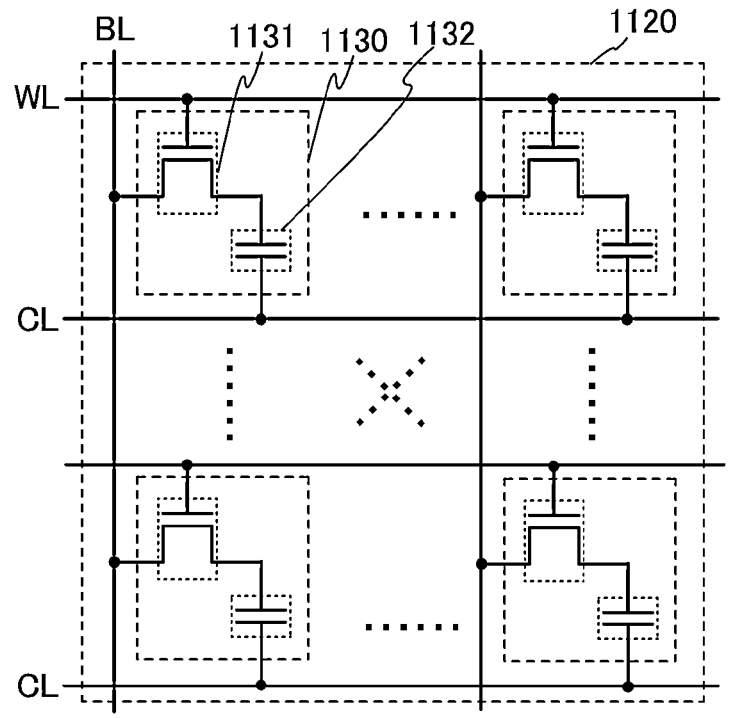
FIGS. 12A and 12B are circuit diagrams illustrating an example of one embodiment of the present invention.

FIG. 12A illustrates an example of a semiconductor device whose structure corresponds to that of a so-called dynamic random access memory (DRAM). A memory cell array 1120 illustrated in FIG. 12A has a structure in which a plurality of memory cells 1130 is arranged in a matrix. Further, the memory cell array 1120 includes m first wirings BL and n second wirings WL. Note that in this embodiment mode, the first wiring BL and the second wiring WL are referred to as a bit line BL and a word line WL, respectively.

The memory cell 1130 includes a transistor 1131 and a capacitor 1132. A gate electrode of the transistor 1131 is connected to the second wiring WL. Further, one of a source electrode and a drain electrode of the transistor 1131 is connected to the first wiring BL. The other of the source electrode and the drain electrode of the transistor 1131 is connected to one electrode of the capacitor 1132. The other electrode of the capacitor 1132 is connected to a capacitor line CL and is supplied with a predetermined potential. The transistor manufactured according to any of the manufacturing methods described in Embodiment Modes 1 and 2 is applied to the transistor 1131.

The transistor manufactured according to any of the manufacturing methods described in Embodiment Modes 1 and 2 is characterized by having extremely small off-state current. Accordingly, when the transistor is applied to the semiconductor device illustrated in FIG. 12A, which is regarded as a so-called DRAM, a substantially nonvolatile memory can be obtained.

Figure 12B:
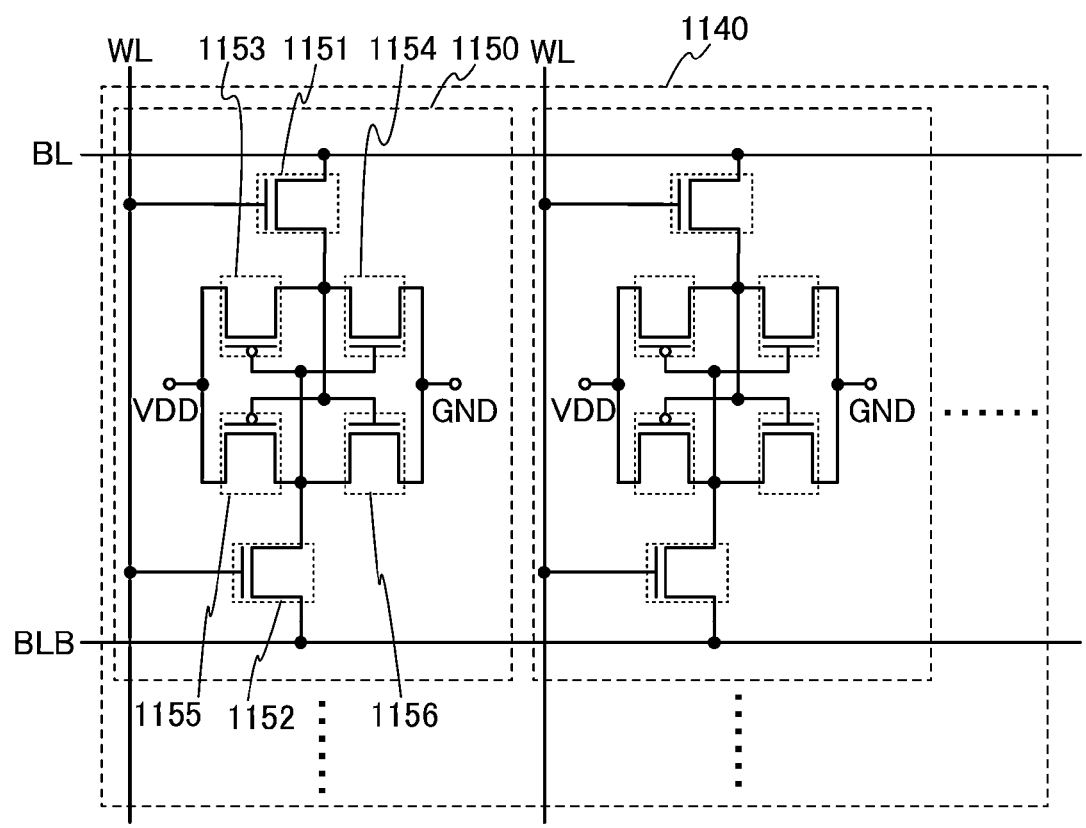

FIG. 12B illustrates an example of a semiconductor device whose structure corresponds to that of a so-called static random access memory (SRAM). A memory cell array 1140 illustrated in FIG. 12B can have a structure in which a plurality of memory cells 1150 is arranged in a matrix. Further, the memory cell array 1140 includes a plurality of first wirings BL, a plurality of second wirings BLB, and a plurality of third wirings WL. In addition, certain positions are connected to a power supply potential VDD and a ground potential GND, respectively.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in Embodiment Modes 1 and 2 may be applied to these transistors. Each of the third transistor 1153 and the fifth transistor 1155 is a p-channel transistor in which a channel formation region is formed using a material other than an oxide semiconductor. Note that there is no particular limitation, a transistor described in Embodiment Mode 1 or Embodiment Mode 2 may be applied to the p-channel transistors among the first to sixth transistors 1151 to 1156, and a transistor in which a channel formation region is formed using a material other than an oxide semiconductor may be applied to the n-channel transistors among the first to sixth transistors 1151 to 1156.

The structures, methods, and the like described in this embodiment can be combined with those of any of the other embodiments as appropriate.

(Embodiment Mode 7)

A central processing unit (CPU) can be formed using a transistor in which a channel formation region is formed using an oxide semiconductor for at least part of the CPU.

Figure 13A:
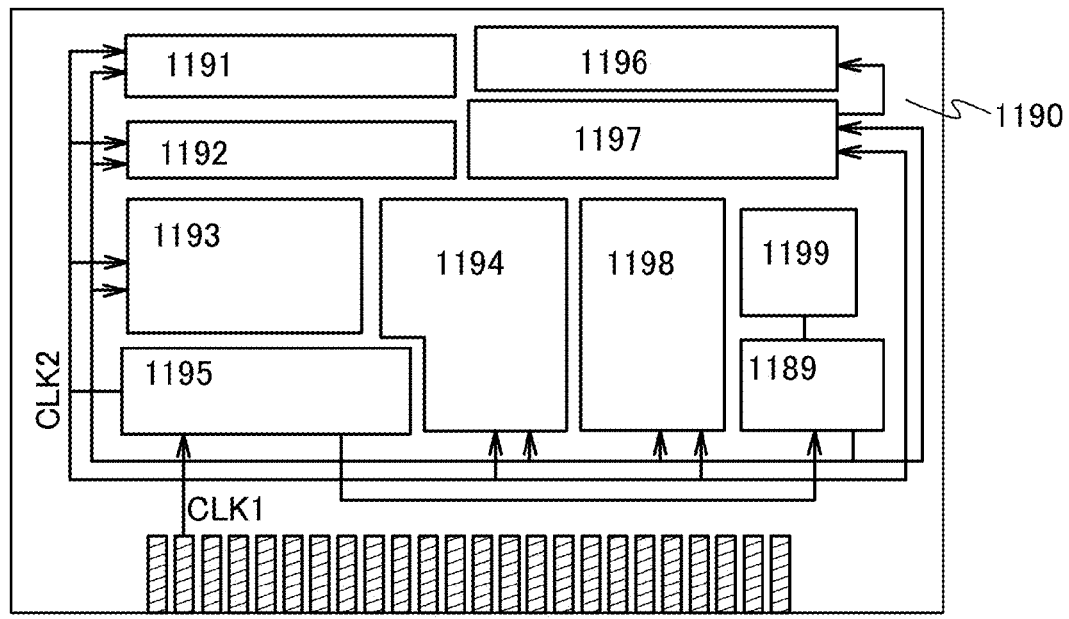
FIG. 13A is a block diagram illustrating a specific example of a CPU and FIGS. 13B and 13C are circuit diagrams illustrating part of the CPU.

FIG. 13A is a block diagram illustrating a specific structure of a CPU. The CPU illustrated in FIG. 13A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a ROM 1199 which is rewritable, and a ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 13A is only an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 13A, a memory element is provided in the register 1196. Any of the memory elements described in Embodiment Modes 4 to 6 can be used as the memory element provided in the register 1196.

In the CPU illustrated in FIG. 13A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 13B:
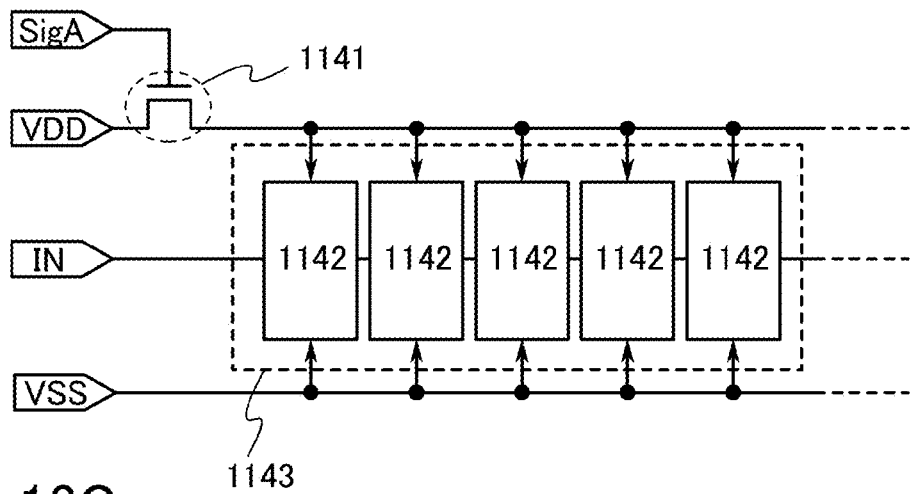
Figure 13C:
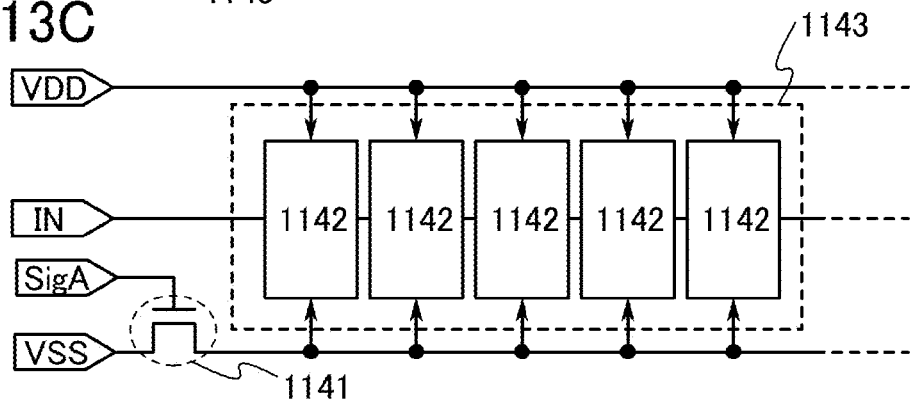

The power supply can be stopped by providing a switching element between a memory element group and a node to which a high-level power supply potential VDD or a low-level power supply potential VSS is supplied, as illustrated in FIG. 13B or FIG. 13C. Circuits illustrated in FIGS. 13B and 13C are described below.

FIGS. 13B and 13C each illustrate an example of a structure of a memory circuit including a transistor in which a channel formation region is formed using an oxide semiconductor as a switching element for controlling supply of a power supply potential to a memory element.

The memory device illustrated in FIG. 13B includes a switching element 1141 and a memory element group 1143 including a plurality of memory elements 1142. Specifically, as each of the memory elements 1142, any of the memory elements described in Embodiment Modes 4 to 6 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 13B, a transistor in which a channel formation region is formed using an oxide semiconductor is used as the switching element 1141, and the switching of the transistor is controlled by a signal Sig A supplied to a gate electrode thereof.

Note that FIG. 13B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 13B, the switching element 1141 may control the supply of the low-level power supply potential VSS.

In FIG. 13C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the high-level power supply potential VDD or the low-level power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Note that this embodiment mode can be implemented in combination with any of the structures described in the other embodiment modes, as appropriate.

(Embodiment Mode 8)

In this embodiment mode, a transistor manufactured according to any of the manufacturing processes described in Embodiment Modes 1 and 2 is used for a pixel portion and a driver circuit, whereby a semiconductor device having a display function (also referred to as a display device) can be manufactured. Further, part or whole of a driver circuit including the transistor is formed over a substrate where the pixel portion is formed, whereby a system-on-panel can be manufactured.

The display device includes a display element. As the display element, a liquid crystal element (also referred to as a liquid crystal display element) and a light-emitting element (also referred to as a light-emitting display element) are given. Further, a display medium element whose contrast is changed by an electric action, such as electronic ink, can be used. The light-emitting element includes, in its category, an element whose luminance is controlled by current or voltage, and specifically includes an organic electroluminescent (EL) element, an inorganic EL element, and the like.

In addition, the display device includes a panel in which the display element is sealed, and a module in which an IC and the like including a controller are mounted on the panel. As for an element substrate (an element substrate) corresponding to one mode before the display element is completed in a manufacturing process of the display device, the element substrate is provided with means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Here, a liquid crystal display device that corresponds to one mode of a semiconductor device is described.

Figure 14A:
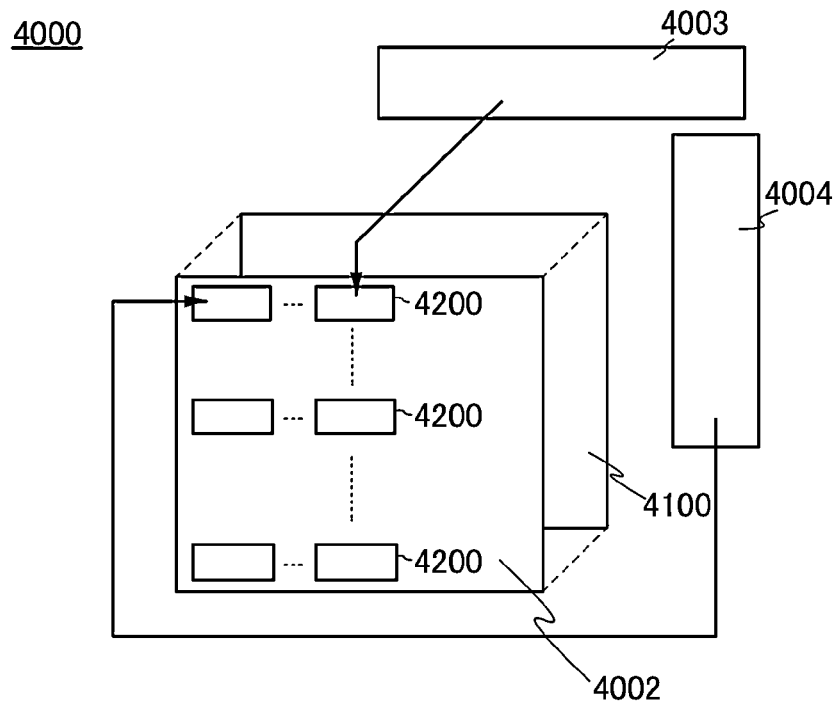
FIGS. 14A and 14B are a block diagram and a circuit diagram illustrating an example of a display device that is one embodiment of the present invention.

FIG. 14A is a block diagram illustrating a structure of an active-matrix liquid crystal display device 4000. In FIG. 14A, the liquid crystal display device 4000 includes a liquid crystal display panel including a pixel portion 4002, a signal line driver circuit 4003, a scan line driver circuit 4004, and a backlight 4100. Although not shown in FIG. 14A, the liquid crystal display device 4000 may further include a circuit needed to operate the liquid crystal display device, such as a backlight control circuit, an image processing circuit (an image engine), a power supply circuit, or a protection circuit. The signal line driver circuit 4003, the scan line driver circuit 4004, the backlight control circuit, the image processing circuit, and the power supply circuit are broadly classified into a logic circuit portion, and a switch portion or a buffer portion. Further, part or all of the above circuits may be mounted using a semiconductor device such as an IC.

The pixel portion 4002 included in the liquid crystal display panel includes a plurality of pixels 4200 arranged in matrix. The scan line driver circuit 4004 is a circuit which drives the pixels 4200 and has a function of outputting a plurality of display selection signals that are pulse signals. The signal line driver circuit 4003 has a function of generating an electric signal (potential) on the basis of an image signal input and inputting the electric signal to a signal line to be described later.

Figure 14B:
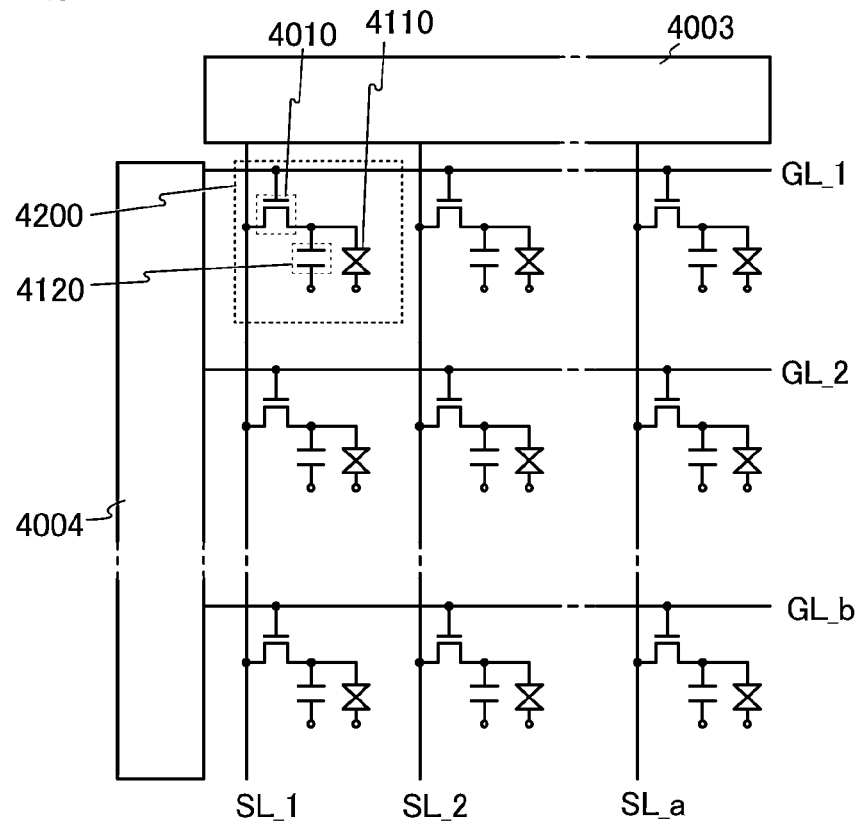

FIG. 14B is a circuit diagram of the pixel portion 4002 in the liquid crystal display device 4000. The liquid crystal display device 4000 is an active matrix liquid crystal display device. The pixel portion 4002 includes signal lines SL_1 to SL_a (a is a natural number), scan lines GL_1 to GL_b (b is a natural number), and the plurality of pixels 4200. Each of the pixels 4200 includes a transistor 4010, a capacitor 4120, and a liquid crystal element 4110. The pixel portion 4002 may have a structure in which the capacitor 4120 is not provided. In the case where a signal line or a scan line is simply mentioned, it is denoted as a signal line SL or a scan line GL.

The transistor 4010 is a transistor manufactured according to any of the manufacturing methods described in Embodiment Modes 1 and 2. With use of the transistor, a liquid crystal display device with small power consumption, favorable electric characteristics, and high reliability can be obtained.

The scan line GL is connected to a gate electrode of the transistor 4010, the signal line SL is connected to a source electrode of the transistor 4010, and a drain electrode of the transistor 4010 is connected to one of capacitor electrodes of the capacitor 4120 and one of pixel electrodes of the liquid crystal element 4110. The other of the capacitor electrodes of the capacitor 4120 and the other of the pixel electrodes of the liquid crystal element 4110 (also referred to as a counter electrode) are connected to a common electrode. Note that the common electrode can be formed in a step for forming the scan line GL by employing the same material as that of the scan line GL for the common electrode.

The signal line SL is connected to the signal line driver circuit 4003. The scan line GL is connected to the scan line driver circuit 4004. The signal line driver circuit 4003 and the scan line driver circuit 4004 may include a transistor manufactured according to any of the manufacturing methods described in Embodiment Modes 1 and 2.

Note that the signal line driver circuit 4003 and the scan line driver circuit 4004 can be formed over a substrate over which the pixel portion 4002 is formed. Alternatively, either the signal line driver circuit 4003 or the scan line driver circuit 4004 or both may be formed over another substrate, and the substrate may be connected with the substrate over which the pixel portion 4002 is formed by a chip on glass (COG) method, a wire bonding method, a tape automated bonding (TAB) method, or the like.

The pixel portion 4002 is preferably provided with a protection circuit in order to prevent the transistor 4010 from being damaged by static electricity or the like. A non-linear element may be used for the protection circuit.

When potential higher than or equal to the threshold voltage of the transistor 4010 is applied to the scan line GL, an electric signal input from the signal line SL becomes drain current of the transistor 4010, whereby electric charges are stored in the capacitor 4120. After charging for one column is performed, the transistors 4010 in the column are turned off, and the electric signal is not input from the source line SL. However, the voltage necessary for displaying the image signal input can be held by the electric charges stored in the capacitor 4120. Then, the capacitors 4120 in the next column are charged. In such a manner, charging for the first column to a-th column is performed.

Since the off-state current of the transistor 4010 is extremely small, the electric charge stored in the capacitor 4120 is barely likely to be discharged, and capacitance of the capacitor 4120 can be reduced, so that power consumption needed for charging can be reduced. For example, it is enough to provide the storage capacitor 4120 having a capacitance less than or equal to ⅓, preferably less than or equal to ⅕ of a liquid crystal capacitance of each pixel 4200.

Since the electric charges stored in the capacitor 4120 are barely likely to be discharged, a period of time during which voltage necessary for displaying the image signal input is held can be longer. Thus, the display rewriting frequency can be reduced in the case of displaying an image with little motion (including a still image), which enables further reduction in power consumption.

Next, an appearance and a cross section of the liquid crystal display panel including the pixel portion 4002 are described with reference to FIGS. 15A1, 15A2, and 15B. Here, the liquid crystal display panel including the scan line driver circuit 4004 in addition to the pixel portion 4002 is described. FIGS. 15A1 and 15A2 are top plan views of the liquid crystal display panels. FIG. 15B is a cross-sectional view taken along dashed-dotted line M-N in FIGS. 15A1 and 15A2.

In FIGS. 15A1 and 15A2, the liquid crystal display panel is provided with a sealant 4005 by which the pixel portion 4002 and the scan line driver circuit 4004 which are provided over the first substrate 4001 are surrounded. The second substrate 4006 is provided over the pixel portion 4002 and the scan line driver circuit 4004. Moreover, the signal line driver circuit 4003, which is formed using a single-crystal semiconductor layer or a polycrystalline semiconductor layer over a substrate prepared separately, is provided in a region different from the region surrounded by the sealant 4005 over the first substrate 4001.

Note that there is no particular limitation on the connection method of the signal line driver circuit 4003 which is separately formed. FIG. 15A1 illustrates the case where the signal line driver circuit 4003 is mounted by the COG method. FIG. 15A2 illustrates the case where the signal line driver circuit 4003 is mounted by the TAB method.

Further, the pixel portion 4002 and the scan line driver circuit 4004 provided over the first substrate 4001 each include a plurality of transistors. FIG. 15B illustrates an example where the transistor 4010 included in the pixel portion 4002 and the transistor 4011 included in the scan line driver circuit 4004 are included in the liquid crystal display panel.

In the liquid crystal display panel in FIG. 15B, the transistors 4010 and 4011, the capacitor 4120, and the liquid crystal element 4110 which are formed over the first substrate 4001 are sealed between the first substrate 4001 and the second substrate 4006 with the sealant 4005. An insulating film 4021 is provided over the transistors 4010 and 4011.

The transistors manufactured according to the manufacturing method described in Embodiment Mode 1 or 2 can be used as the transistors 4010 and 4011.

The pixel electrode 4030 included in the liquid crystal element 4110 is electrically connected to the capacitor electrode 4121 included in the capacitor 4120. The counter electrode 4031 included in the liquid crystal element 4110 is formed over the second substrate 4006. A portion where the pixel electrode 4030, the counter electrode 4031, and the liquid crystal layer 4008 overlap with one another corresponds to the liquid crystal element 4110. Note that the pixel electrode 4030 and the counter electrode 4031 are provided with an insulating film 4032 and an insulating film 4033, respectively, each of which functions as an alignment film, and the liquid crystal layer 4008 is sandwiched between the pixel electrode 4030 and the counter electrode 4031 with the insulating films 4032 and 4033 provided therebetween.

As the liquid crystal layer 4008, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used.

The pixel electrode 4030 and the counter electrode 4031 may be formed using a light-transmitting conductive material. Examples of the light-transmitting conductive material include indium oxide including tungsten oxide, indium zinc oxide including tungsten oxide, indium oxide including titanium oxide, indium tin oxide including titanium oxide, indium tin oxide, indium zinc oxide, and indium tin oxide to which silicon oxide is added. Alternatively, a conductive composition containing a conductive high molecule (also referred to as a conductive polymer) can be used for the pixel electrode 4030 and the counter electrode 4031. In the liquid crystal display panel, at least the counter electrode 4031 that is an electrode on the viewing side needs to be formed using a light-transmitting conductive material. A film of metal such as titanium, molybdenum, aluminum, copper, tungsten, or tantalum, an alloy film including any of the metals, or a layered film including any of the films of metal can be used for the counter electrode 4031 other than a light-transmitting conductive material and a conductive composition containing a conductive high molecule (also referred to as a conductive polymer). For the formation of the pixel electrode 4030 and the counter electrode 4031, a sputtering method, a molecular beam epitaxy method, an atomic layer deposition method, a pulsed laser deposition method, or a vacuum evaporation method can be employed.

Note that as each of the first substrate 4001 and the second substrate 4006, a substrate may be selected as appropriate among substrates that can be used as the substrate 101 described in Embodiment Modes 1 and 2.

A gap holding member 4035 is a columnar spacer obtained by selective etching of an insulating film and is provided in order to control the distance (a cell gap) between the pixel electrode 4030 and the counter electrode 4031. Alternatively, a spherical spacer may be used. The counter electrode 4031 is electrically connected to a common electrode provided over the substrate where the transistor 4010 is formed. The counter electrode 4031 and the common electrode are provided with common connection portions, and the counter electrode 4031 and the common electrode are electrically connected to each other through conductive particles arranged between the first substrate 4001 and the second substrate 4006. Note that the conductive particles are included in the sealant 4005.

Note that in addition to a transmissive liquid crystal display device, a reflective liquid crystal display device or a semi-transmissive liquid crystal display device can be applied to the liquid crystal display panel described in this embodiment mode.

In the liquid crystal display panel described in this embodiment mode, in order to reduce the surface roughness of a transistor and increase reliability of the transistor, the transistor 4010 included in the pixel portion 4002 and the transistor 4011 included in the scan line driver circuit 4004 are covered with the insulating film 4021 serving as a planarizing insulating film.

The insulating film 4021 serving as a planarization insulating film can be formed using an organic material having heat resistance such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the insulating film 4021 may be formed by stacking a plurality of insulating films formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The method for forming the insulating film 4021 is not particularly limited, and the following method can be used depending on the material: a sputtering method, an SOG method, a spin coating method, a dipping method, a spray coating method, a droplet discharge method (such as an inkjet method), a printing method (such as screen printing or offset printing), or the like. Further, the insulating film 4021 can be formed with a doctor knife, a roll coater, a curtain coater, a knife coater, or the like.

Further, a variety of signals and an electric signal (potential) are supplied to the signal line driver circuit 4003 which is formed separately, and the scan line driver circuit 4004 or the pixel portion 4002 from an FPC 4018.

A connection terminal electrode 4015 is formed using the same conductive film as the pixel electrode 4030 included in the liquid crystal element 4110, and a terminal electrode 4016 is formed using the same conductive film as source and drain electrodes of the transistor 4010 and the transistor 4011.

The connection terminal electrode 4015 is electrically connected to a terminal included in the FPC 4018 through an anisotropic conductive film 4019.

Next, a typical driving method of the liquid crystal display device 4000 including the liquid crystal display panel described in this embodiment is described by giving some operation modes as examples. Driving methods of a liquid crystal for the liquid crystal display device 4000 include a vertical electric field method in which a voltage is applied perpendicularly to a substrate and a horizontal electric field method in which a voltage is applied parallel to a substrate.

First, FIGS. 16A1 and 16A2 are cross-sectional schematic views illustrating a pixel structure of a TN-mode liquid crystal display device.

The liquid crystal element 4110 is held between the first substrate 4001 and the second substrate 4006 which are provided so as to face each other. A first polarizing plate 4103 is formed on the first substrate 4001 side, and a second polarizing plate 4104 is formed on the second substrate 4006 side. An absorption axis of the first polarizing plate 4103 and an absorption axis of the second polarizing plate 4104 are located in a cross-Nicol state.

Although not shown, a backlight and the like are provided outside the first polarizing plate 4103. The pixel electrode 4030 is provided on the first substrate 4001 and the counter electrode 4031 is provided on the second substrate 4006. The counter electrode 4031 on the opposite side to the backlight, that is, on the viewing side, is formed using a light-transmitting conductive material.

In the case where the liquid crystal display device 4000 with such a structure is in a normally white mode, when a voltage is applied between the pixel electrode 4030 and the counter electrode 4031 (referred to as the vertical electric field method), liquid crystal molecules 4105 are aligned vertically as shown in FIG. 16A1. Thus, light from the backlight cannot reach the outside of the second polarizing plate 4104, which leads to black display.

When no voltage is applied between the pixel electrode 4030 and the counter electrode 4031, the liquid crystal molecules 4105 are aligned horizontally and twisted on a plane surface as shown in FIG. 16A2. As a result, light from the backlight can reach the outside of the second polarizing plate 4104, which leads to white display. The gradation can be expressed by adjusting the voltage applied between the pixel electrode 4030 and the counter electrode 4031. Thus, predetermined image is displayed.

A known liquid crystal material may be used for a TN-mode liquid crystal display device.

FIGS. 16B1 and 16B2 are cross-sectional schematic views illustrating a pixel structure of a VA-mode liquid crystal display device. In the VA mode, the liquid crystal molecules 4105 are aligned to be vertical to the substrate when there is no electric field.

As in FIGS. 16A1 and 16A2, the pixel electrode 4030 is provided on the first substrate 4001 and the counter electrode 4031 is provided on the second substrate 4006. The counter electrode 4031 on the opposite side to the backlight, that is, on the viewing side, is formed using a light-transmitting conductive material. The first polarizing plate 4103 is formed on the first substrate 4001 side, and the second polarizing plate 4104 is formed on the second substrate 4006 side. The absorption axis of the first polarizing plate 4103 and the absorption axis of the second polarizing plate 4104 are located in a cross-Nicol state.

In the liquid crystal display device 4000 with such a structure, when a voltage is applied between the pixel electrode 4030 and the counter electrode 4031 (the vertical electric field method), the liquid crystal molecules 4105 are aligned horizontally as shown in FIG. 16B1. Thus, light from the backlight can reach the outside of the second polarizing plate 4104, which leads to white display.

When no voltage is applied between the pixel electrode 4030 and the counter electrode 4031, the liquid crystal molecules 4105 are aligned vertically as shown in FIG. 16B2. As a result, light from the backlight which is polarized by the first polarizing plate 4103 passes through a cell without being influenced by birefringence of the liquid crystal molecules 4105. Thus, the polarized light from the backlight cannot reach the outside of the second polarizing plate 4104, which leads to black display. The gradation can be expressed by adjusting the voltage applied between the pixel electrode 4030 and the counter electrode 4031. Thus, predetermined image is displayed.

FIGS. 16C1 and 16C2 are cross-sectional schematic views illustrating a pixel structure of an MVA-mode liquid crystal display device. The MVA mode is a method in which one pixel is divided into a plurality of portions, and the portions have different alignment directions of the liquid crystal molecules 4105 and compensate the viewing angle dependencies of each other. As shown in FIG. 16C1, in the MVA mode, a protrusion 4158 whose cross section is a triangle is provided on the pixel electrode 4030 and a protrusion 4159 whose cross section is a triangle is provided on the counter electrode 4031 for controlling alignment. Note that the structures other than the protrusions are in common with the structures in the VA mode.

When a voltage is applied between the pixel electrode 4030 and the counter electrode 4031 (the vertical electric field method), the liquid crystal molecules 4105 are aligned so that a long axis of the liquid crystal molecule 4105 is substantially vertical to surfaces of the protrusions 4158 and 4159 whose cross sections are each a triangle as shown in FIG. 16C1. Thus, light from the backlight can reach the outside of the second polarizing plate 4104, which leads to white display.

When no voltage is applied between the pixel electrode 4030 and the counter electrode 4031, the liquid crystal molecules 4105 are aligned vertically as shown in FIG. 16C2. As a result, light from the backlight cannot reach the outside of the second polarizing plate 4104, which leads to black display. The gradation can be expressed by adjusting the voltage applied between the pixel electrode 4030 and the counter electrode 4031. Thus, predetermined image is displayed.

Figure 19A:
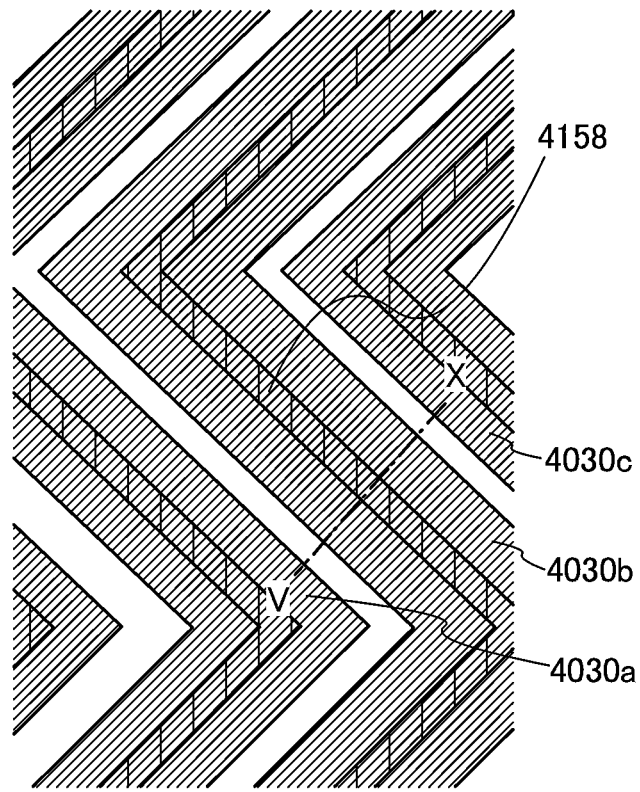
FIGS. 19A and 19B are a top view and a cross-sectional view illustrating an example of arrangement of electrodes in a liquid crystal display device that is one embodiment of the present invention.
Figure 19B:
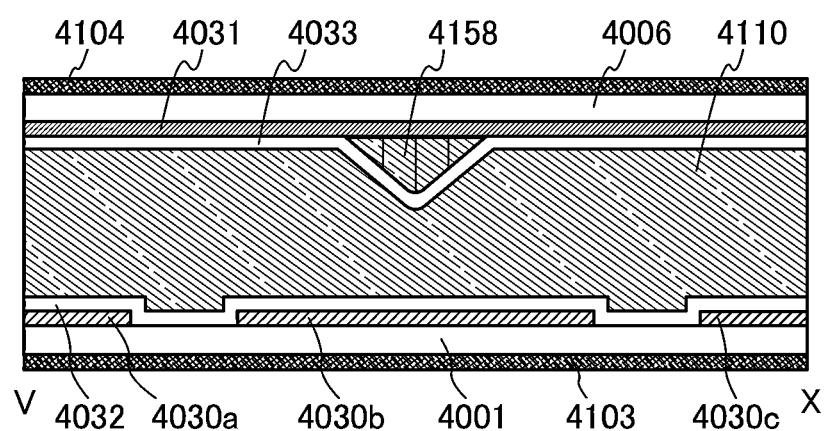

FIGS. 19A and 19B are a top view and a cross-sectional view, respectively, of another example of the MVA mode. In FIG. 19A, a pixel electrode 4030a, a pixel electrode 4030b, and a pixel electrode 4030c are formed in a continuous bent pattern (a zigzag shape). As in FIG. 19B, the insulating film 4032 that is an alignment film is formed over the pixel electrodes 4030a, 4030b, and 4030c. The protrusion 4158 whose cross section is a triangle is formed on the counter electrode 4031 and over the pixel electrode 4030b. The insulating film 4033 that is an alignment film is formed on the counter electrode 4031 and the protrusion 4158 whose cross section is a triangle.

FIGS. 17A1 and 17A2 are cross-sectional schematic views illustrating a pixel structure of an OCB-mode liquid crystal display device. In the OCB mode, alignment of the liquid crystal molecules 4105 forms an optical compensated state in a liquid crystal layer. This alignment is referred to as a bend alignment.

As in FIGS. 16A1 to 16C2, the pixel electrode 4030 is provided on the first substrate 4001 and the counter electrode 4031 is provided on the second substrate 4006. The counter electrode 4031 on the opposite side to the backlight, that is, on the viewing side, is formed to have a light-transmitting property. The first polarizing plate 4103 is formed on the first substrate 4001 side, and the second polarizing plate 4104 is formed on the second substrate 4006 side. The absorption axis of the first polarizing plate 4103 and the absorption axis of the second polarizing plate 4104 are located in a cross-Nicol state.

In a liquid crystal display device having such a structure, when a certain voltage is applied to the pixel electrode 4030 and the counter electrode 4031 (the vertical electric field method), black display is performed as shown in FIG. 17A1. At that time, liquid crystal molecules 4105 are aligned vertically. Thus, light from the backlight cannot reach the outside of the second polarizing plate 4104, which leads to black display.

When voltage is not applied between the pixel electrode 4030 and the counter electrode 4031, the liquid crystal molecules 4105 are in a bend alignment state as shown in FIG. 17A2. As a result, light from the backlight can pass through the second polarizing plate 4104, which leads to white display. The gradation can be expressed by adjusting the voltage applied between the pixel electrode 4030 and the counter electrode 4031. Thus, predetermined image is displayed.

In the OCB mode, since viewing angle dependency can be compensated by alignment of the liquid crystal molecules 4105 in a liquid crystal layer. In addition, a contrast ratio can be increased by a pair of stacked layers including polarizers.

FIGS. 17B1 and 17B2 are cross-sectional schematic views illustrating pixel structures of an FLC-mode liquid crystal display device and an AFLC-mode liquid crystal display device.

As in FIGS. 16A1 to 16C2, the pixel electrode 4030 is provided on the first substrate 4001 and the counter electrode 4031 is provided on the second substrate 4006. The counter electrode 4031 on the opposite side to the backlight, that is, on the viewing side, is formed using a light-transmitting conductive material. The first polarizing plate 4103 is formed on the first substrate 4001 side, and the second polarizing plate 4104 is formed on the second substrate 4006 side. The absorption axis of the first polarizing plate 4103 and the absorption axis of the second polarizing plate 4104 are located in a cross-Nicol state.

In the liquid crystal display device 4000 having such a structure, when voltage is applied to the pixel electrode 4030 and the counter electrode 4031 (referred to as the vertical electric field method), the liquid crystal molecules 4105 are aligned horizontally in a direction deviated from a rubbing direction. Thus, light from the backlight can reach the outside of the second polarizing plate 4104, which leads to white display.

When no voltage is applied between the pixel electrode 4030 and the counter electrode 4031, the liquid crystal molecules 4105 are aligned horizontally along the rubbing direction as shown in FIG. 17B2. As a result, light from the backlight cannot reach the outside of the second polarizing plate 4104, which leads to black display. The gradation can be expressed by adjusting the voltage applied between the pixel electrode 4030 and the counter electrode 4031. Thus, predetermined image is displayed.

A known liquid crystal material may be used for the FLC-mode liquid crystal display device and the AFLC-mode liquid crystal display device.

FIGS. 18A1 and 18A2 are cross-sectional schematic views illustrating a pixel structure of an IPS-mode liquid crystal display device. In the IPS mode, the liquid crystal molecules 4105 are rotated on a plane surface with respect to a substrate by a horizontal electric field between electrodes provided only on one substrate side.

The IPS mode is characterized in that liquid crystals are controlled by a pair of electrodes which is provided on one substrate. That is, a pair of electrodes 4150 and 4151 is provided over the first substrate 4001. The pair of electrodes 4150 and 4151 preferably has a light transmitting property. The first polarizing plate 4103 is formed on the first substrate 4001 side and the second polarizing plate 4104 is formed on the second substrate 4006 side. The absorption axis of the first polarizing plate 4103 and the absorption axis of the second polarizing plate 4104 are arranged in a cross-Nicol state.

The pair of electrodes 4150 and 4151 can be each formed using a light-transmitting conductive material as well as the pixel electrode 4030 and the counter electrode 4031. Alternatively, a film of metal such as titanium, molybdenum, aluminum, copper, tungsten, or tantalum; an alloy film including any of the metals; or a layered film including any of the metals can be used other than the light-transmitting conductive material.

When a voltage is applied between the pair of electrodes 4150 and 4151 in a liquid crystal display device having such a structure, the liquid crystal molecules 4105 are aligned along a line of electric force which is deviated from the rubbing direction, as illustrated in FIG. 18A1. As a result, light from a backlight can pass through the second polarizing plate 4104, which leads to white display.

When no voltage is applied between the pair of electrodes 4150 and 4151, the liquid crystal molecules 4105 are aligned horizontally along the rubbing direction, as illustrated in FIG. 18A2. As a result, light from the backlight cannot reach the outside of the second polarizing plate 4104, which leads to black display. In addition, the gradation can be expressed by adjusting the voltage applied between the pixel electrode 4150 and 4151. In this manner, a predetermined image is displayed.

Figure 20A:
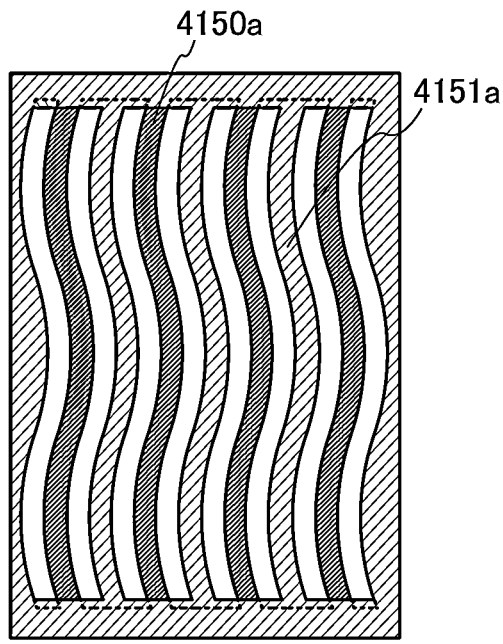
FIGS. 20A to 20C are top views illustrating examples of arrangement of electrodes in a liquid crystal display device that is one embodiment of the present invention.
Figure 20B:
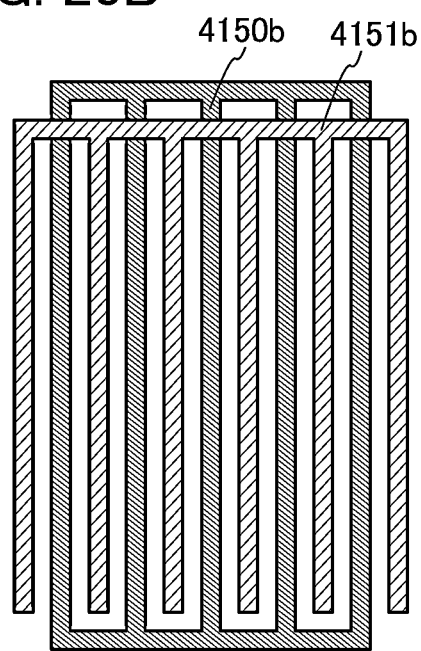
Figure 20C:
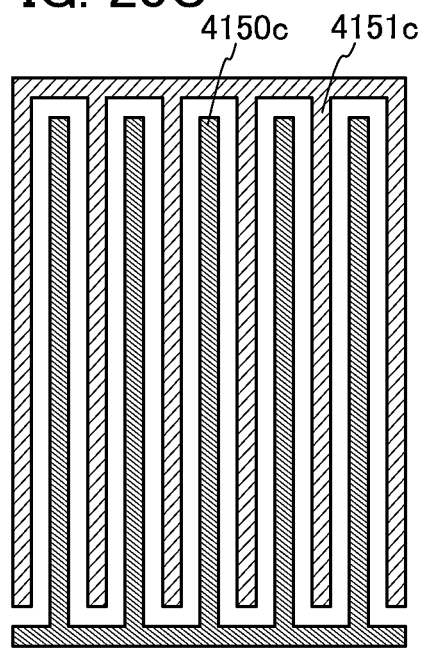

FIGS. 20A to 20C each illustrate an example of the pair of electrodes 4150 and 4151 that can be used in the IPS mode. As illustrated in top views of FIGS. 20A to 20C, the pair of electrodes 4150 and 4151 are alternatively formed. In FIG. 20A, electrodes 4150a and 4151a have an undulating wave shape. In FIG. 20B, electrodes 4150b and 4151b each have a comb-like shape and partly overlap with each other. In FIG. 20C, electrodes 4150c and 4151c have a comb-like shape in which the electrodes are meshed with each other.

FIGS. 18B1 and 18B2 are cross-sectional schematic views each illustrating a pixel structure of an FFS-mode liquid crystal display device. The FFS mode is also vertical electronic field type as the IPS mode and has a structure in which the electrode 4151 is formed over the electrode 4150 with an insulating film provided therebetween as illustrated in FIGS. 18B1 and 18B2. In other words, the electrode 4150 and the electrode 4151 are paired with each other with the insulating film 4152 provided therebetween. The insulating film 4152 corresponds to the insulating film 4032 that functions as an alignment film in FIG. 15B.

The pair of electrodes 4150 and 4151 preferably has a light transmitting property. The first polarizing plate 4103 is formed on the first substrate 4001 side and the second polarizing plate 4104 is formed on the second substrate 4006 side. The absorption axis of the first polarizing plate 4103 and the absorption axis of the second polarizing plate 4104 are arranged in a cross-Nicol state.

When a voltage is applied between the electrodes 4150 and 4151 in a liquid crystal display device having such a structure, the liquid crystal molecules 4105 are aligned along a line of electric force which is deviated from the rubbing direction, as illustrated in FIG. 18B1. As a result, light from a backlight can pass through the second polarizing plate 4104, which leads to white display.

When no voltage is applied between the electrodes 4150 and 4151, the liquid crystal molecules 4105 are aligned horizontally along the rubbing direction, as illustrated in FIG. 18B2. As a result, light from the backlight cannot reach the outside of the second polarizing plate 4104, which leads to black display. The gradation can be expressed by adjusting the voltage applied between the pixel electrode 4150 and 4151. In this manner, a predetermined image is displayed. In this manner, a predetermined image is displayed.

Figure 21A:
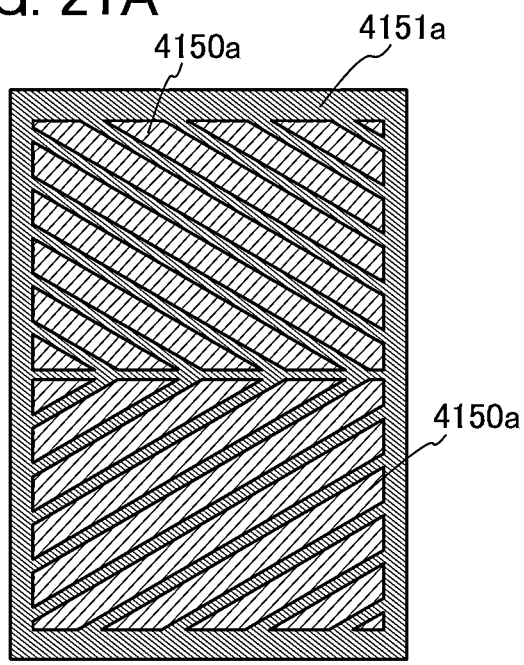
FIGS. 21A to 21C are top views each illustrating examples of arrangement of electrodes in a liquid crystal display device that is one embodiment of the present invention.
Figure 21B:
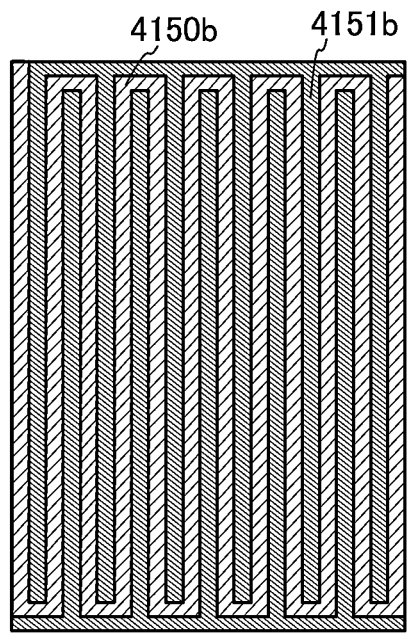
Figure 21C:
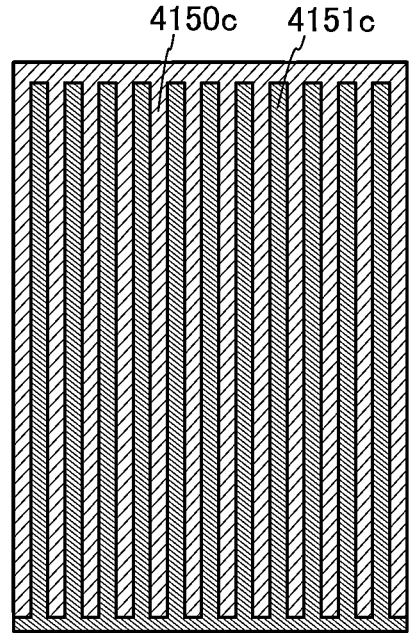

FIGS. 21A to 21C each show an example of the electrodes 4150 and 4151 that can be used in the FFS mode. As illustrated in top views of FIGS. 21A to 21C, the electrodes 4151 are formed into various patterns over the electrodes 4150. In FIG. 21A, the electrode 4151a over the electrode 4150a has a bent dogleg-like shape. In FIG. 21B, the electrode 4151b over the electrode 4150b has a comb-like shape in which the electrodes 4151b and 4150b are meshed with each other. In FIG. 21C, the electrode 4151c over the electrode 4150c has a comb-like shape.

A known material may be used for the IPS-mode liquid crystal display device and the FFS-mode liquid crystal display device. Alternatively, a liquid crystal material exhibiting a blue phase may be used as a liquid crystal material of the IPS mode and the FFS mode. The use of the liquid crystal material exhibiting a blue phase enables manufacturing of a liquid crystal display panel without an alignment film. A blue phase is one of liquid crystal phases, which is generated just before a cholesteric phase changes into an isotropic phase while temperature of cholesteric liquid crystal is increased. Since the blue phase is only generated within a narrow temperature range, a liquid crystal composition containing a chiral agent at 5 wt % or more is used for the liquid crystal layer 4008 in order to improve the temperature range. The liquid crystal composition which includes a liquid crystal exhibiting a blue phase and a chiral agent has a short response time of 1 msec or less, and in addition, has optical isotropy, which makes the alignment process unneeded and a viewing angle dependence small.

In addition to the above operation modes, other operation modes such as PVA mode, ASM mode, and TBA mode can be given as a driving method applied to the liquid crystal display panel described in this embodiment mode.

In the above operation modes, full color display can be performed by providing a color filter. A color filter can be provided on either the first substrate 4001 side or the second substrate 4006 side.

Alternatively, it is possible to employ a time-division display method (also called a field-sequential driving method) with the use of a plurality of light-emitting diodes (LEDs) as a backlight. By employing a field-sequential driving method, color display can be performed without using a color filter.

Note that display device that is one embodiment of the present invention may have a structure in which a pixel includes a light-emitting element instead of the liquid crystal element 4110. The light-emitting element includes in its category any element whose luminance is controlled by current or voltage; specifically an organic electro-luminescent (EL) element and an inorganic EL element are given. Instead of the liquid crystal element 4110, either an organic EL element or an inorganic EL element can be used for a pixel.

For example, an organic EL element has a structure in which a light-emitting organic compound layer is sandwiched between at least a pair of electrodes, and the organic compound layer has, in general, a stacked-layer structure. For example, the organic compound layer has a stacked-layer structure in which a hole-injection layer, hole-transport layer, a light-emitting layer, and an electron-transport layer are stacked in this order between a pair of electrodes (a pixel electrode and a counter electrode), or a hole-injection layer, hole-transport layer, a light-emitting layer, and an electron injection layer a stacked in this order therebetween. In addition, the light-emitting layer may be doped with a phosphorescence pigment and the like. Each layer included in the EL element can be formed of a low molecular weight material or a high molecular weight material.

In an active matrix display device including the liquid crystal element 4110, the liquid crystal element 4110 may be controlled by one transistor in each pixel, whereas in the case where a light-emitting element configures a pixel, current flowing in the light-emitting element is properly controlled by two or more transistors, which is preferably. Note that the transistors manufactured according any of the manufacturing methods described in Embodiment Modes 1 and 2 can be used as the transistor.

In such a manner, a liquid crystal display device with high display quality, high reliability, and low power consumption can be obtained with the use of the liquid crystal display panel including the transistor manufactured by a manufacturing method which is one embodiment of the present invention.

Note that this embodiment mode can be implemented in combination with any of the structures described in the other embodiment modes, as appropriate.

(Embodiment Mode 9)

In this embodiment mode, a protection circuit including a transistor that is manufactured according to any of the manufacturing methods of one embodiment of the present invention is described with reference to FIGS. 23A and 23B.

Figure 23A:
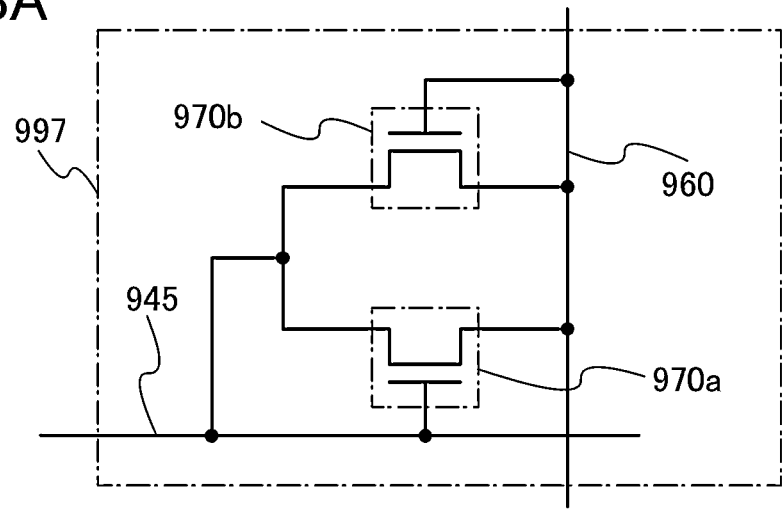
FIGS. 23A and 23B are a circuit diagram and a top view illustrating an example of a protection circuit that is one embodiment of the present invention.
Figure 23B:
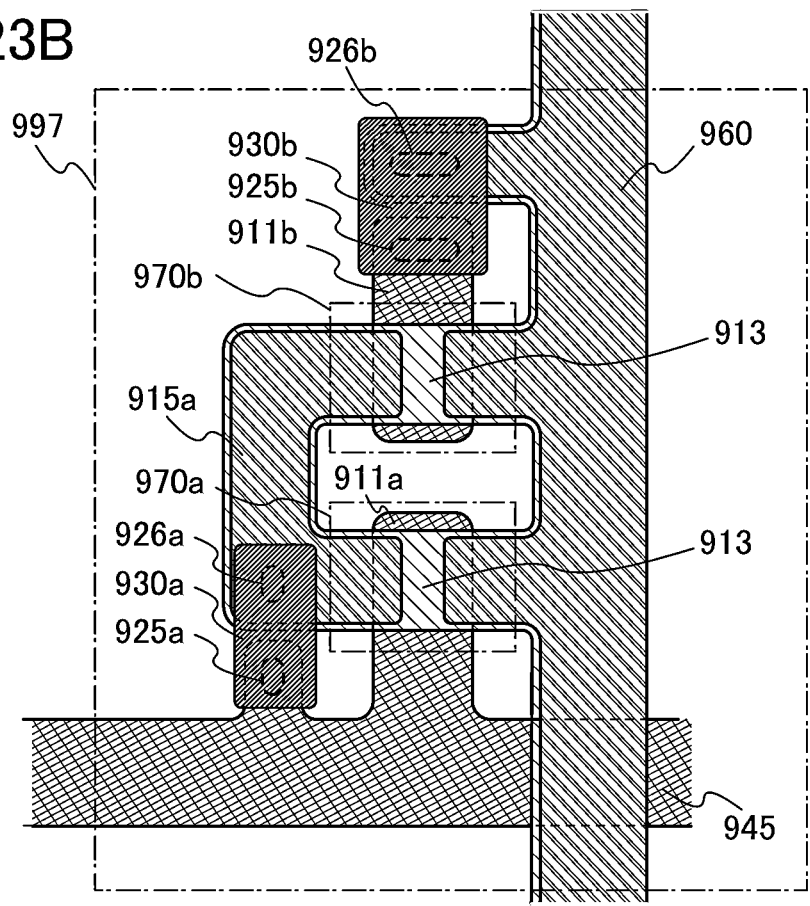

An example of a circuit that can be applied to the protection circuit is illustrated in FIG. 23A. A protection circuit 997 includes transistors 970a and 970b which are n-channel transistors. In each of the transistors 970a and 970b, a gate electrode and a drain electrode are short-circuited (diode-connected) to each other to have characteristics similar to those of a diode. Transistors that are manufactured according to any of the manufacturing methods of one embodiment of the present invention can be used as the transistors 970a and 970b.

A first terminal (a gate electrode) and a third terminal (a drain electrode) of the transistor 970a are electrically connected to a first wiring 945 and a second terminal (a source electrode) of the transistor 970a is electrically connected to a second wiring 960. A first terminal (a gate electrode) and a third terminal (a drain electrode) of the transistor 970b are electrically connected to the second wiring 960 and a second terminal (a source electrode) of the transistor 970b is electrically connected to the first wiring 945. That is, the protection circuit illustrated in FIG. 23A includes two transistors whose rectifying directions are opposite to each other and each of which connects the first wiring 945 and the second wiring 960. In other words, the protection circuit includes the transistor whose rectifying direction is from the first wiring 945 to the second wiring 960 and the transistor whose rectifying direction is from the second wiring 960 to the first wiring 945, between the first wiring 945 and the second wiring 960.

In the above protection circuit, when the second wiring 960 is positively or negatively charged due to static electricity or the like, current flows in a direction in which the charge is cancelled. For example, when the second wiring 960 is positively charged, current flows in a direction in which the positive charge is released to the first wiring 945. Owing to this operation, electrostatic breakdown or malfunctions of a circuit or an element connected to the charged second wiring 960 can be prevented. In the structure in which the charged second wiring 960 and another wiring intersect with an insulating layer interposed therebetween, this operation can further prevent dielectric breakdown of the insulating layer.

Note that the protection circuit is not limited to the above structure. For example, the protection circuit may include a plurality of transistors whose rectifying direction is from the first wiring 945 to the second wiring 960 and a plurality of transistors whose rectifying direction is from the second wiring 960 to the first wiring 945. In addition, a protection circuit can be configured using an odd number of transistors.

The protection circuit shown in FIG. 23A as an example can be applied to various uses. For example, the first wiring 945 is used as a common wiring of a display device, the second wiring 960 is used as one of a plurality of signal lines, and the protection circuit can be provided therebetween. A transistor which functions as a switching element of a pixel and which is connected to the signal line provided with the protection circuit is protected from malfunctions, such as electrostatic breakdown due to charged wirings, a shift in threshold voltage, and the like. Note that the protection circuit can be applied to semiconductor devices other than a display device.

Next, an example in which the protection circuit 997 is formed over a substrate is described. An example of a top view of the protection circuit 997 is shown in FIG. 23B.

The transistor 970a includes a gate electrode 911a and a semiconductor film 913 that overlaps with the gate electrode 911a. The gate electrode 911a is electrically connected to the first wiring 945. A source electrode of the transistor 970a is electrically connected to the second wiring 960 and a drain electrode thereof is electrically connected to an electrode 930a through a contact hole 926a. The electrode 930a is electrically connected to the first wiring 945 through a contact hole 925a. That is, the gate electrode 911a of the transistor 970a is electrically connected to the drain electrode thereof through the electrode 930a.

The transistor 970b includes a gate electrode 911b and a semiconductor film 913 which overlaps with the gate electrode 911b. The gate electrode 911b is electrically connected to an electrode 930b through a contact hole 925b. A source electrode of the transistor 970b is electrically connected to the first wiring 945 through the first electrode 915a and the electrode 930a. A drain electrode of the transistor 970b is electrically connected to the second wiring 960. The second wiring 960 is electrically connected to the electrode 930b through a contact hole 926b. That is, the gate electrode 911b of the transistor 970b is electrically connected to the drain electrode thereof through the electrode 930b.

Since the transistor 970a and the transistor 970b are transistors that are manufactured according to any of the manufacturing methods of one embodiment of the present invention, an end of the semiconductor film 913 is positioned outside an end of the second wiring 960 and an end of the first electrode 915a. In other words, the second wiring 960 and the first electrode 915a are formed in contact with the semiconductor film 913 only on a top surface of the semiconductor film 913.

In order to reduce contact resistance between the electrodes and the wirings which are connected to each other through the contact holes, the contact holes 925a, 925b, 926a, and 926b preferably have a larger area or the number of contact holes is preferably increased.

When the protection circuit disclosed in this embodiment is applied to a display device, the electrode 930a and the electrode 930b can be formed when a pixel electrode of the display device is formed.

Note that this embodiment mode can be implemented in combination with any of the structures described in the other embodiment modes, as appropriate.

(Embodiment Mode 10)

A display device described in Embodiment Mode 8 can be applied to a variety of electronic devices. Examples of electronic devices include a television device (also referred to as a TV or a television receiver). In addition, a display device of one embodiment of the present invention can be applied to indoor digital signage, public information display (PID), advertisements in vehicles such as a train, or the like. In particular, since power consumption of the display device which is one embodiment of the present invention is reduced, the use of the display device as the above electronic device is effective in displaying an image for a long time. Examples of electronic devices in which the display device of one embodiment of the present invention is used are illustrated in FIGS. 24A and 24B.

Figure 24A:
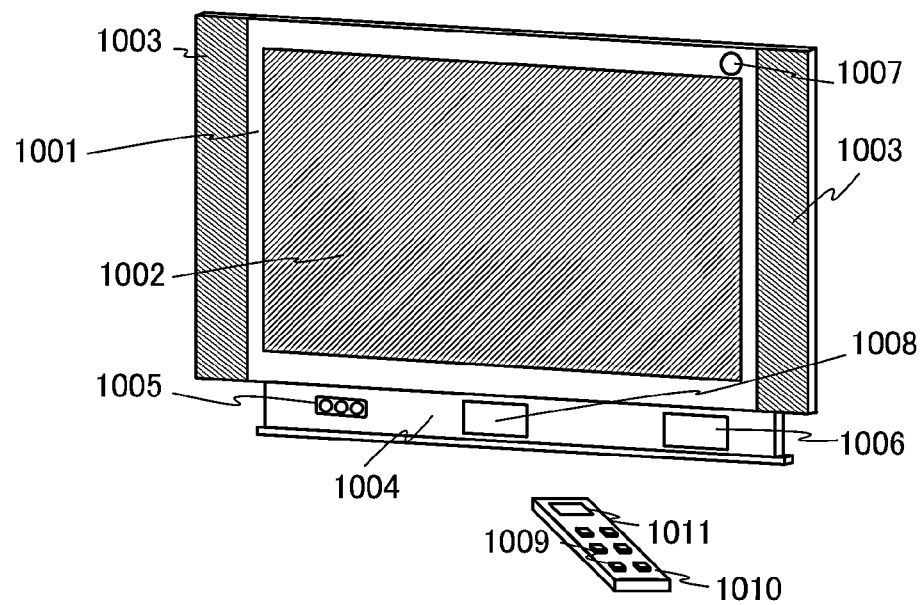
FIGS. 24A and 24B are perspective views illustrating examples of electronic devices each including a semiconductor device that is one embodiment of the present invention.
Figure 24B:
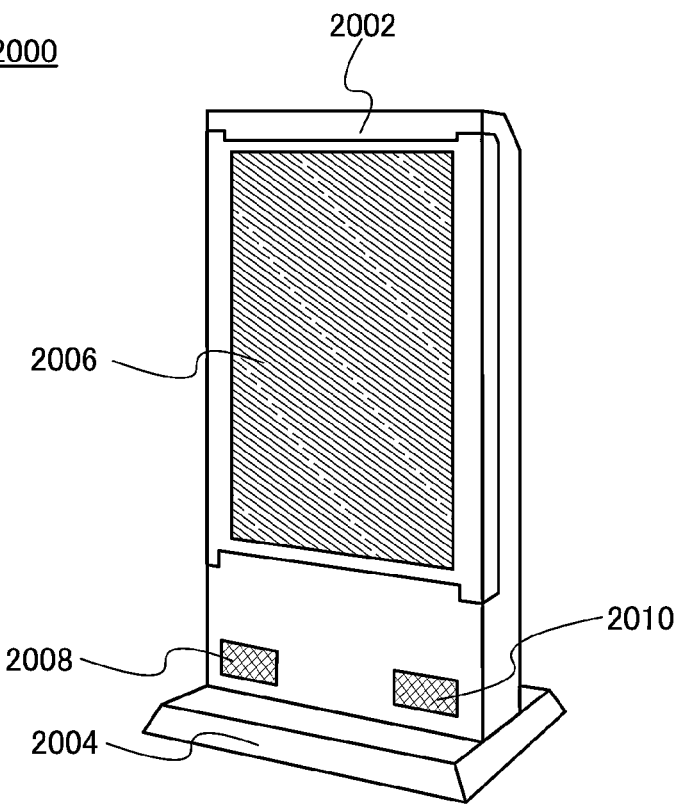

FIG. 24A illustrates an example of a television device. In a television device 1000, a display portion 1002 is incorporated in a housing 1001. Images can be displayed on the display portion 1002. Here, the housing 1001 is supported by a housing 1004. In addition, the television device 1000 is provided with a speaker 1003, operation keys 1005 (including a power switch or an operation switch), a connection terminal 1006, a sensor 1007 (having a function of measuring force, position, distance, light, magnetium, temperature, time, electric field, current, humidity, gradient, oscillation, or infrared ray), a microphone 1008, and the like.

The television device 1000 can be operated with the operation switch or a separate remote controller 1010. With operation keys 1009 provided in the remote controller 1010, channels or volume can be controlled, whereby an image displayed on the display portion 1002 can be controlled. The remote controller 1010 may include a display portion 1011 for displaying data output from the remote controller 1010.

Note that the television device 1000 is provided with a receiver, a modem, and the like. A general television broadcast can be received with the receiver. Moreover, when the display device is connected to a communication network with or without wires via the modem, one-way (from a sender to a receiver) or two-way (between a sender and a receiver or between receivers) information communication can be performed.

FIG. 24B illustrates an example of digital signage. For example, digital signage 2000 includes two housings, a housing 2002 and a housing 2004. The housing 2002 includes a display portion 2006 and two speakers, a speaker 2008 and a speaker 2010. In addition, the digital signage 2000 may be provided with a sensor so as to operate in a following manner: an image is not displayed when a person is not close to the digital signage or the like.

The display device described in Embodiment Mode 8 can be used for the display portion 1002 in the television device 1000 and the display portion 2006 in the digital signage 2000 and has an advantage of small power consumption. Thus, power consumption of the television device 1000 and the digital signage 2000 can be reduced.

Note that this embodiment can be implemented in combination with any of the structures described in the other embodiments, as appropriate.

This application is based on Japanese Patent Application serial No. 2011-004420 filed with Japan Patent Office on Jan. 12, 2011, the entire contents of which are hereby incorporated by reference.

What is claimed is:

1. A semiconductor device comprising:
a gate electrode;
a first insulating film over the gate electrode;
an oxide semiconductor layer over the gate electrode with the first insulating film interposed therebetween; and
a first electrode and a second electrode over the oxide semiconductor layer,
wherein the first electrode and the second electrode are provided inside an upper end of the oxide semiconductor layer when seen from the above.

2. The semiconductor device according to claim 1, wherein the second electrode is provided between parts of the first electrode when seen from the above.

3. The semiconductor device according to claim 1, further comprising a second insulating film over the gate electrode with the gate electrode, the first insulating film, and the oxide semiconductor layer interposed therebetween, wherein the first electrode and the second electrode are provided over the second insulating film.

4. The semiconductor device according to claim 1, wherein the oxide semiconductor layer comprises indium, gallium, and zinc.

5. The semiconductor device according to claim 1, wherein the oxide semiconductor layer is amorphous.

6. The semiconductor device according to claim 1, wherein the oxide semiconductor layer comprise a crystalline region.

7. The semiconductor device according to claim 1, wherein the oxide semiconductor layer partly overlaps with an end of the gate electrode.

8. The semiconductor device according to claim 1, wherein the first electrode and the second electrode partly overlap with an end of the gate electrode.

9. A semiconductor device comprising:
a gate electrode;
a first insulating film over the gate electrode;
an oxide semiconductor layer over the gate electrode with the first insulating film interposed therebetween; and
a first electrode and a second electrode on and in contact with the oxide semiconductor layer,
wherein the first electrode and the second electrode are provided inside an upper end of the oxide semiconductor layer when seen from the above.

10. The semiconductor device according to claim 9, wherein the second electrode is provided between parts of the first electrode when seen from the above.

11. The semiconductor device according to claim 9, further comprising a second insulating film over the gate electrode with the gate electrode, the first insulating film, and the oxide semiconductor layer interposed therebetween, wherein the first electrode and the second electrode are provided over the second insulating film.

12. The semiconductor device according to claim 9, wherein the oxide semiconductor layer comprises indium, gallium, and zinc.

13. The semiconductor device according to claim 9, wherein the oxide semiconductor layer is amorphous.

14. The semiconductor device according to claim 9, wherein the oxide semiconductor layer comprise a crystalline region.

15. The semiconductor device according to claim 9, wherein the oxide semiconductor layer partly overlaps with an end of the gate electrode.

16. The semiconductor device according to claim 9, wherein the first electrode and the second electrode partly overlap with an end of the gate electrode.

17. A method for manufacturing a semiconductor device, the method comprising the steps of:
forming a gate electrode over a substrate;
forming a first insulating film over the gate electrode;
forming an oxide semiconductor film over the first insulating film;
forming a first conductive film over the oxide semiconductor film;
forming an oxide semiconductor layer and a second conductive film by etching the oxide semiconductor film and the first conductive film; and
forming a first electrode and a second electrode by etching the second conductive film so as to be inside an upper end of the oxide semiconductor layer when seen from the above.

18. The method for manufacturing a semiconductor device according to claim 17, further comprising the steps of
forming a first resist mask over the first conductive film, wherein the first resist mask has a depression which overlaps with the gate electrode; and
forming a second resist mask and a third resist mask by removing the first resist mask,
wherein the oxide semiconductor layer and the second conductive film are formed by etching the oxide semiconductor film and the first conductive film using the first resist mask, and
wherein the first electrode and the second electrode are formed by etching the second conductive film using the second resist mask and the third resist mask.

19. The method for manufacturing a semiconductor device according to claim 17, further comprising the step of heating the oxide semiconductor film at a temperature of higher than or equal to 150° C. and lower than a strain point of the substrate.

20. The method for manufacturing a semiconductor device according to claim 17, further comprising the step of heating the oxide semiconductor layer at a temperature of higher than or equal to 150° C. and lower than or equal to 450° C.

21. The method for manufacturing a semiconductor device according to claim 17, wherein the first electrode and the second electrode are formed so as to be in contact with the oxide semiconductor layer only on an upper surface of the oxide semiconductor layer.

22. The method for manufacturing a semiconductor device according to claim 17, wherein the oxide semiconductor layer comprises indium, gallium, and zinc.

23. The method for manufacturing a semiconductor device according to claim 17, wherein the oxide semiconductor layer is amorphous.

24. The method for manufacturing a semiconductor device according to claim 17, wherein the oxide semiconductor layer comprises a crystalline region.

* * * * *

UNITED STATES PATENT AND TRADEMARK OFFICE
CERTIFICATE OF CORRECTION

| | | |
|---|---|---|
| PATENT NO. | : 8,536,571 B2 | Page 1 of 1 |
| APPLICATION NO. | : 13/346072 | |
| DATED | : September 17, 2013 | |
| INVENTOR(S) | : Shunpei Yamazaki | |

It is certified that error appears in the above-identified patent and that said Letters Patent is hereby corrected as shown below:

In the Specification

At column 30, line 67, "52" should be --S2--;

At column 32, line 41, "CL_i," should be --CL_i),--;

At column 32, line 43, "and j" should be --i and j--.

Signed and Sealed this
Seventeenth Day of December, 2013

Margaret A. Focarino
*Commissioner for Patents of the United States Patent and Trademark Office*